(12) United States Patent
Ahn et al.

(10) Patent No.: US 9,748,299 B2
(45) Date of Patent: Aug. 29, 2017

(54) PIXEL, IMAGE SENSOR INCLUDING THE SAME, AND PORTABLE ELECTRONIC DEVICE INCLUDING THE IMAGE SENSOR

(71) Applicants: Jung Chak Ahn, Yongin-si (KR); Kyung Ho Lee, Suwon-si (KR); Young Woo Jung, Yongin-si (KR); Seung Joo Nah, Gwangju (KR); Hae Yong Park, Gyeonggi-do (KR)

(72) Inventors: Jung Chak Ahn, Yongin-si (KR); Kyung Ho Lee, Suwon-si (KR); Young Woo Jung, Yongin-si (KR); Seung Joo Nah, Gwangju (KR); Hae Yong Park, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/817,284

(22) Filed: Aug. 4, 2015

(65) Prior Publication Data
US 2016/0043120 A1 Feb. 11, 2016

(30) Foreign Application Priority Data

Aug. 6, 2014 (KR) .................. 10-2014-0101254
Aug. 3, 2015 (KR) .................. 10-2015-0109744

(51) Int. Cl.
*H01L 27/146* (2006.01)

(52) U.S. Cl.
CPC ...... *H01L 27/1463* (2013.01); *H01L 27/1464* (2013.01); *H01L 27/14612* (2013.01); *H01L 27/14614* (2013.01); *H01L 27/14689* (2013.01); *H01L 27/14621* (2013.01); *H01L 27/14627* (2013.01)

(58) Field of Classification Search
CPC .............. H01L 27/146; H01L 27/1464; H01L 27/1463
See application file for complete search history.

(56) References Cited

U.S. PATENT DOCUMENTS

| 7,492,027 | B2 | 2/2009 | Mouli |
| 7,518,172 | B2 | 4/2009 | Moon et al. |
| 8,187,909 | B2 | 5/2012 | Venezia et al. |
| 8,390,089 | B2 | 3/2013 | Chen et al. |
| 8,587,081 | B2 | 11/2013 | Chao |
| 2009/0085143 | A1 | 4/2009 | Park |
| 2010/0308385 | A1* | 12/2010 | Manda ............ H01L 21/823885 257/292 |

(Continued)

*Primary Examiner* — Jae Lee
(74) *Attorney, Agent, or Firm* — Volentine & Whitt, PLLC

(57) ABSTRACT

A pixel for a backside illuminated (BSI) image sensor includes a semiconductor substrate having a first surface and a second surface, a photoelectric conversion region between the first surface and the second surface to generate charges in response to light received through the second surface, first trench-type isolation region surrounding the photoelectric conversion region and extending vertically from the second surface, a floating diffusion region in the semiconductor substrate below the photoelectric conversion region, and a transfer gate extending vertically from the first surface towards the photoelectric conversion region to transfer the charges from the photoelectric conversion region to the floating diffusion region. The first trench-type isolation region is formed of a negative charge material.

20 Claims, 53 Drawing Sheets

(56) References Cited

U.S. PATENT DOCUMENTS

| | | | |
|---|---|---|---|
| 2012/0025199 A1* | 2/2012 | Chen | H01L 27/1464 257/75 |
| 2013/0099341 A1 | 4/2013 | Shim et al. | |
| 2013/0113061 A1 | 5/2013 | Lai et al. | |
| 2013/0134542 A1 | 5/2013 | Lu et al. | |
| 2013/0221410 A1 | 8/2013 | Ahn | |
| 2013/0307040 A1 | 11/2013 | Ahn et al. | |
| 2013/0320407 A1 | 12/2013 | Ahn | |
| 2014/0015083 A1 | 1/2014 | Kao | |
| 2014/0016012 A1 | 1/2014 | Oishi | |
| 2014/0035083 A1* | 2/2014 | Wan | H01L 27/14634 257/432 |
| 2015/0187826 A1* | 7/2015 | Suzuki | H01L 27/14625 348/281 |
| 2015/0228693 A1* | 8/2015 | Toda | H01L 27/14612 257/40 |

\* cited by examiner

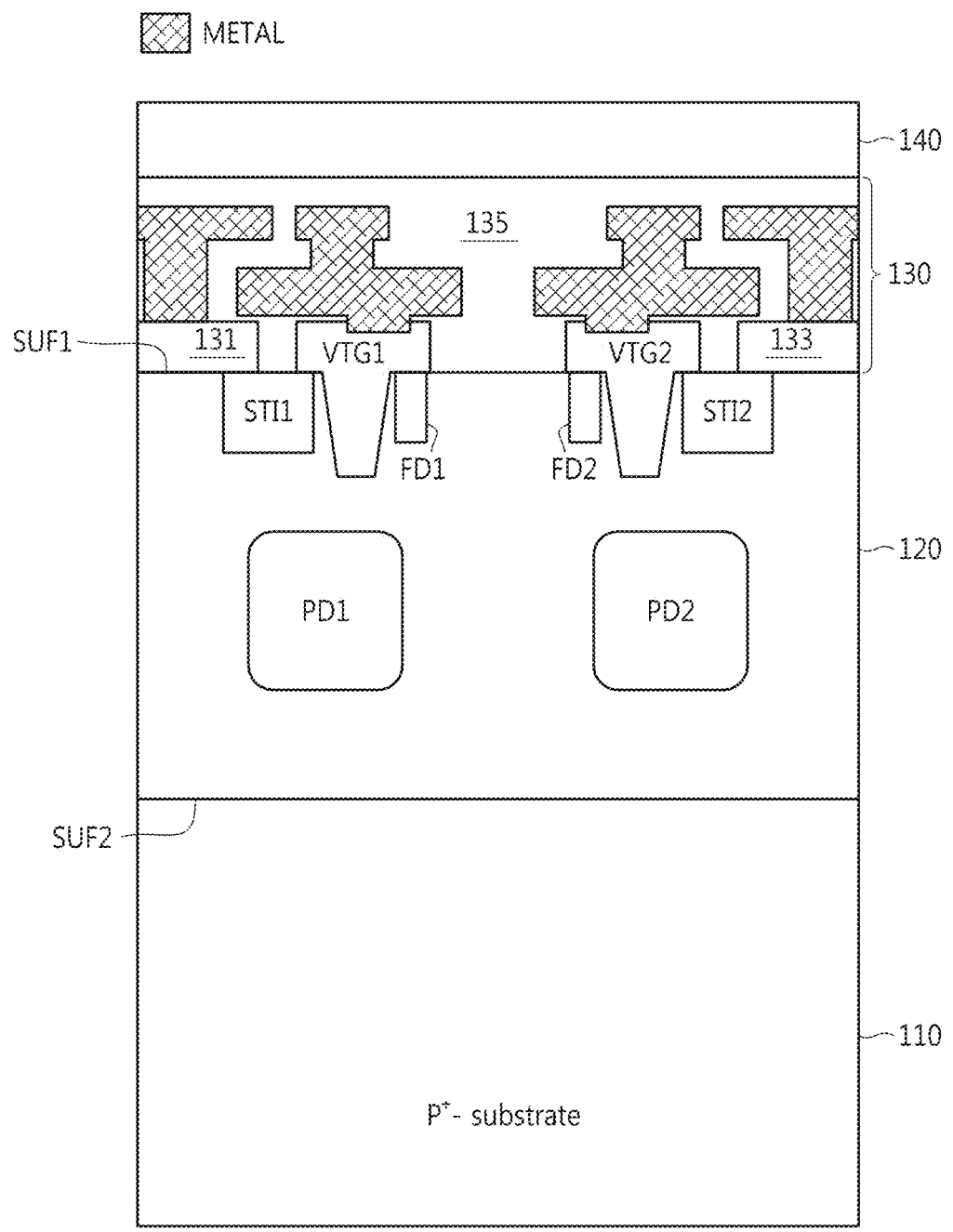

PIXEL, IMAGE SENSOR INCLUDING THE SAME, AND PORTABLE ELECTRONIC DEVICE INCLUDING THE IMAGE SENSOR

PRIORITY STATEMENT

This application claims priority under 35 U.S.C. §119(a) from Korean Patent Application Nos. 10-2014-0101254 filed on Aug. 6, 2014 and 10-2015-0109744 filed on Aug. 3, 2015, the disclosure of which is hereby incorporated by reference in its entirety.

BACKGROUND

Embodiments of the inventive concept relate to an image sensor, and more particularly, to a pixel including a back deep trench isolation (DTI) and a vertical transfer gate, an image sensor including the pixel, and a portable electronic device including the image sensor.

Image sensors (or image sensor chips) are semiconductor devices that convert an optical image into an electrical signal. Image sensors can be divided into charge-coupled device (CCD) image sensors and complementary metal-oxide-semiconductor (CMOS) image sensors. CCD image sensors include a high-voltage analog circuit. CMOS image sensors can be manufactured at lower cost than CCD image sensors, and are smaller than CCD image sensors and thus consume less power than CCD image sensors.

Higher performance in CMOS image sensors has led to them being widely used in electronic appliances as well as in smart phones and digital cameras. A CMOS image sensor includes a photoelectric conversion element that generates charges from incident light and a processing circuit that processes electronic signals corresponding to the charges. To increase the resolution of an image that can be produced using a CMOS image sensor, it is necessary to increase the number of pixels in a pixel array of the CMOS image sensor. The greater the number of pixels becomes, the smaller the pixels must be for a given area of the pixel array. Accordingly, increasing the resolution that can be provided by an imaging device employing a CMOS image sensor presents a problem of increasing the likelihood that interference, such as crosstalk, may occur between pixels of the sensor.

SUMMARY

According to an aspect of the inventive concept, there is provided a pixel for a backside illuminated (BSI) image sensor, which includes a photoelectric conversion region interposed between a first surface and a second surface of a semiconductor substrate to generate charges in response to light received through the second surface, first trench isolation surrounding the photoelectric conversion region and extending vertically from the second surface, a floating diffusion region in the semiconductor substrate and occupying a level in the device below that occupied by the photoelectric conversion region, and a transfer gate extending vertically from the first surface in a direction towards the photoelectric conversion region to transfer the charges from the photoelectric conversion region to the floating diffusion region, and in which the first trench isolation comprises a negative charge material.

According to another aspect of the inventive concept, there is provided a pixel array which includes a substrate of semiconductor material having opposite major first and second surfaces, photodetectors each located within the substrate between the first and second surfaces of the substrate, a first isolation region of negative charge material extending vertically in the substrate, from the second surface thereof, between adjacent ones of each respective pair of the photodetectors, floating diffusion regions in the substrate and whose disposed below the level of the photodetectors in the substrate, and transfer gates extending vertically from the first surface in a direction towards the photoelectric conversion regions, respectively, to transfer the charges from the photoelectric conversion regions to the floating diffusion regions.

According to another aspect of the inventive concept, there is provided a BSI image sensor which includes an array of pixels operative to generate pixel signals in response to incident light, and a signal processing circuit configured to output image data based on the pixel signals, and in which the pixel array comprises a semiconductor substrate having a first surface and a second surface, photoelectric conversion regions each interposed between the first surface and the second surface to generate charges in response to light received through the second surface, first trench isolation surrounding each of the photoelectric conversion regions and extending vertically from the second surface, floating diffusion regions in the semiconductor substrate and occupying a level in the device below that occupied by the photoelectric conversion regions, and transfer gates extending vertically from the first surface in a direction towards the photoelectric conversion regions, respectively, to transfer the charges from the photoelectric conversion regions to the floating diffusion regions, and in which the first trench isolation comprises a negative charge material.

According to further embodiments of the inventive concept, there is provided a portable electronic device which includes a backside illuminated (BSI) image sensor, and a processor configured to control an operation of the BSI image sensor, and in which the BSI image sensor comprises an array of pixels operative to generate pixel signals in response to incident light, and a signal processing circuit configured to output image data based on the pixel signals, in which the pixel array comprises a semiconductor substrate having a first surface and a second surface, photoelectric conversion regions each interposed between the first surface and the second surface to generate charges in response to light received through the second surface, first trench isolation surrounding each of the photoelectric conversion regions and extending vertically from the second surface, floating diffusion regions in the semiconductor substrate and occupying a level in the device below that occupied by the photoelectric conversion regions, and transfer gates extending vertically from the first surface in a direction towards the photoelectric conversion regions, respectively, to transfer the charges from the photoelectric conversion regions to the floating diffusion regions, and in which the first trench isolation comprises a negative charge material.

BRIEF DESCRIPTION OF THE DRAWINGS

The above and other features and advantages of the inventive concept will become more apparent by describing in detail exemplary embodiments thereof with reference to the attached drawings in which:

FIGS. 1A, 1B, 1C, 1D, 1E, 1F, 1G, 1H, 1I, 1J, 1K, 1L, 1M and 1N are cross-sectional views of pixels of an image sensor in each of stages during the course of its manufacture, and together illustrate a method of manufacturing pixels according to the inventive concept;

FIG. 1O is a cross-sectional view of pixels according to the inventive concept;

DETAILED DESCRIPTION OF THE PREFERRED EMBODIMENTS

Figure 1A:
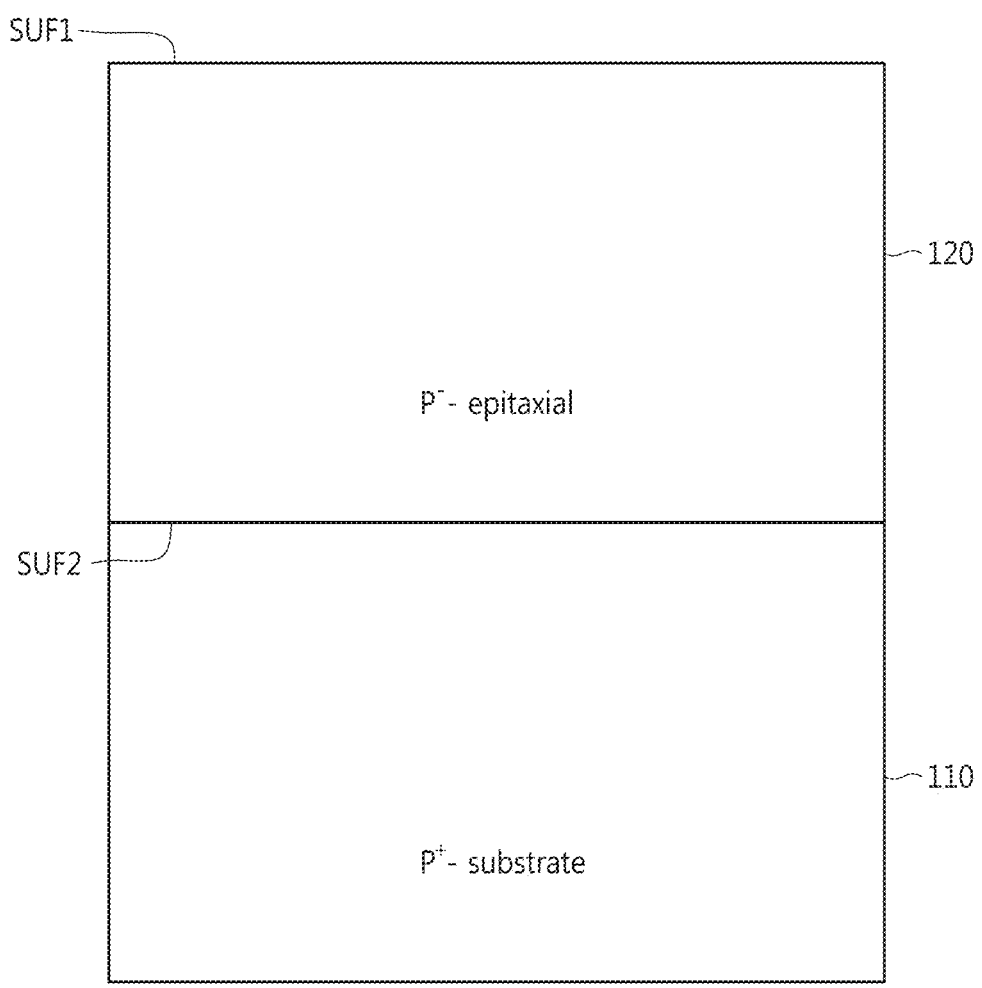

The inventive concept now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

A front deep trench isolation (FDTI) region referred to hereinafter means a DTI region that vertically extends or is vertically formed from a first surface (or an upper portion) of a semiconductor substrate (e.g., an epitaxial layer). A back DTI (BDTI) region referred to hereinafter means a DTI region that vertically extends or is vertically formed from a second surface (or a lower portion) of the semiconductor substrate. The second surface is a surface opposite to the first surface. The "FDTI region" may be simply referred to as "FDTI" and the "BDTI region" may be simply referred to as "BDTI".

For example, FDTI may be DTI formed in processes of manufacturing a frontside illuminated (FSI) image sensor and BDTI may be DTI formed in processes of manufacturing a backside illuminated (BSI) image sensor.

FIGS. 1A through 8 illustrate different embodiments of pixel units 10A, 10A-1, 10B, 10B-1, 10C, 10C-1, 10D, 10D-1, 10E, 10E-1, 10F, 10E-1, 10G, 10G-1, 10H, and 10H-1 according to the inventive concept by way of example. The method (or processes) of manufacturing each of the pixel units 10A, 10A-1, 10B, 10B-1, 10C, 10C-1, 10D, 10D-1, 10E, 10E-1, 10F, 10E-1, 10G, 10G-1, 10H, and 10H-1 may vary with manufacturers thereof. Also, two pixels are shown for each of the pixel units, but it is clear that embodiments of pixel arrays having more than two pixels according to the inventive concept may be provided simply by duplicating the elements/features of the pixels shown and described in the figures. Furthermore, each of the pixel units 10A, 10A-1, 10B, 10B-1, 10C, 10C-1, 10D, 10D-1, 10E, 10E-1, 10F, 10E-1, 10G, 10G-1, 10H, and 10H-1 may be described hereinafter simply as a pixel when describing the elements/features of the unit that makes up one pixel. Finally, in this respect, the cross-sectional views taken in only one horizontal direction are provided, those of ordinary skill in the art will readily understand the two-dimensional layout of the arrays from these views and the accompanying descriptions, e.g., will readily appreciate the lattice structure of trench isolation surrounding the photoelectric conversion region of a pixel as will be described in more detail below.

It will also be understood that although it is described that a second stage (or a second process) is performed after a first stage (or a first process) and a third stage (or a third process) is performed after the second stage, the order of first through third stages could be changed and at least two of the three stages could be performed at the same time. It will also be understood that when a layer or an element is referred to as being "on" another layer or element, it can be directly on the other layer or element, or intervening layers or elements may also be present.

A method of manufacturing a pixel 10A or 10A-1 according to the inventive concept will now be described in detail with reference to FIGS. 1A through 1N.

Referring first to FIG. 1A, an epitaxial layer (e.g., a p– epitaxial layer) 120 may be formed on a silicon substrate (e.g., a p+ silicon substrate) 110.

For example, the p– epitaxial layer 120 may be grown to have the same crystal structure as the p+ silicon substrate 110 using a silicon source gas. An epitaxial layer, like epitaxial layer 120, may thus be considered and hence, referred to itself as a semiconductor substrate. The silicon source gas may include silane, dichlorosilane (DCS), trichlorosilane (TCS), hexachlorodisilane (HCS), or a combination thereof. The p– epitaxial layer 120 has a first surface (or an upper portion) SUF1 and a second surface (or a lower portion) SUF2.

Figure 1B:
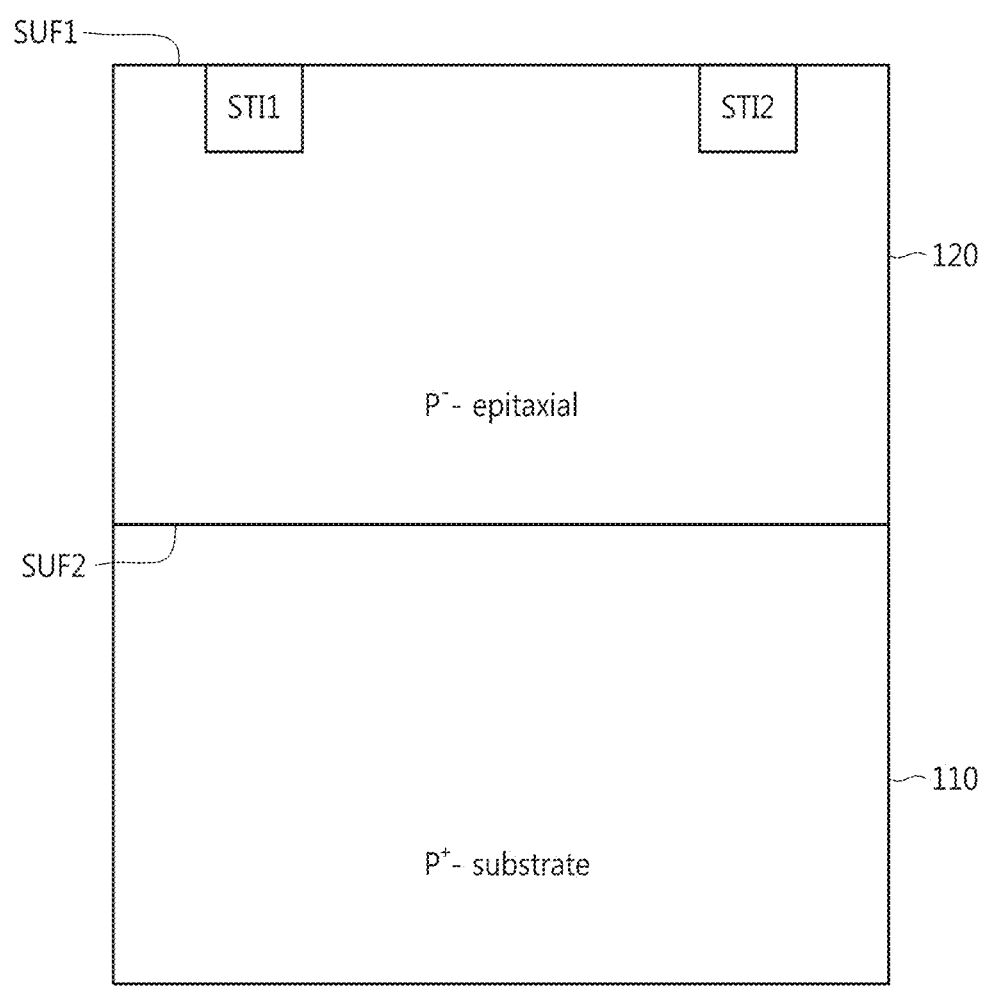

Referring to FIG. 1B, a plurality of first isolation regions STI1 and STI2 may be formed in the p– epitaxial layer 120. For example, the first isolation regions STI1 and STI2 may be trench-type isolation regions, e.g., shallow trench isolation (STI) regions. The first isolation regions STI1 and STI2 may be formed in the p– epitaxial layer 120 by etching process and deposition process.

Figure 1C:
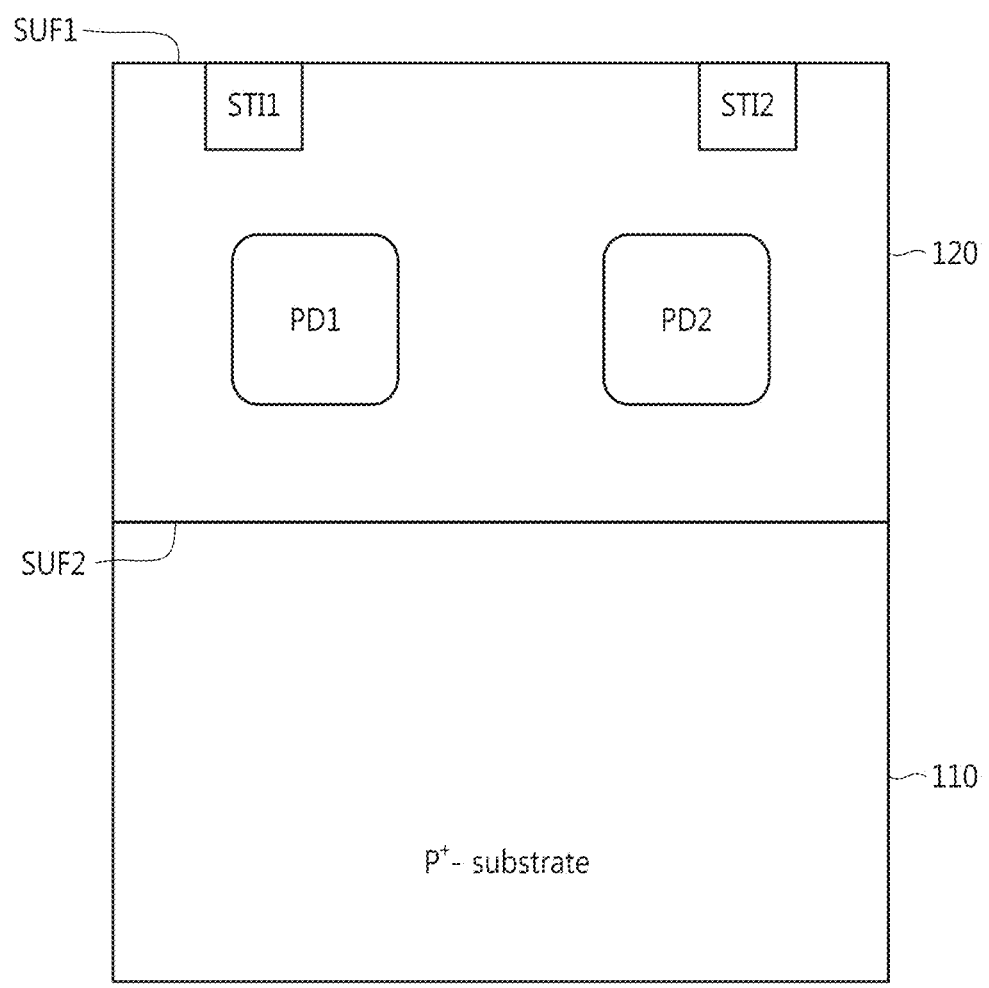

Referring to FIG. 1C, photoelectric conversion regions (or elements) PD1 and PD2 may be formed between the first surface SUF1 and the second surface SUF2 by ion implantation. The photoelectric conversion regions PD1 and PD2 may generate charges in response to incident light. A photodiode, a phototransistor, a photogate, or a pinned photodiode may be constituted by each of the photoelectric conversion regions PD1 and PD2.

Figure 1D:
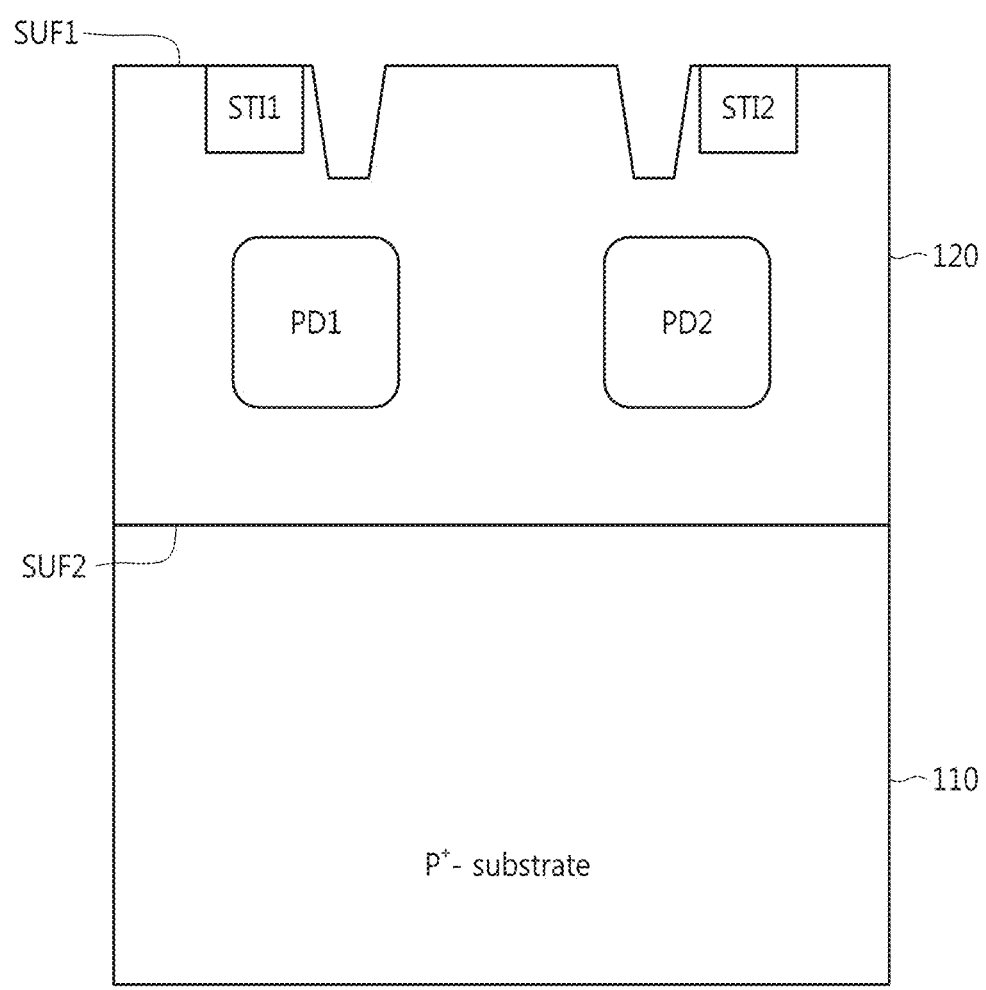

Referring to FIG. 1D, a plurality of openings may be formed to a predetermined depth from the first surface SUF1 of the p– epitaxial layer 120. The openings may be formed using wet etch processes or dry etch processes. The depth and/or shape of the openings may be designed in dependence on the desired depth and/or shape of transfer gates VTG1 and VTG2 shown in FIG. 1E. After the openings are formed, an insulation layer may be formed to a predetermined thickness on the first surface SUF1.

Figure 1E:
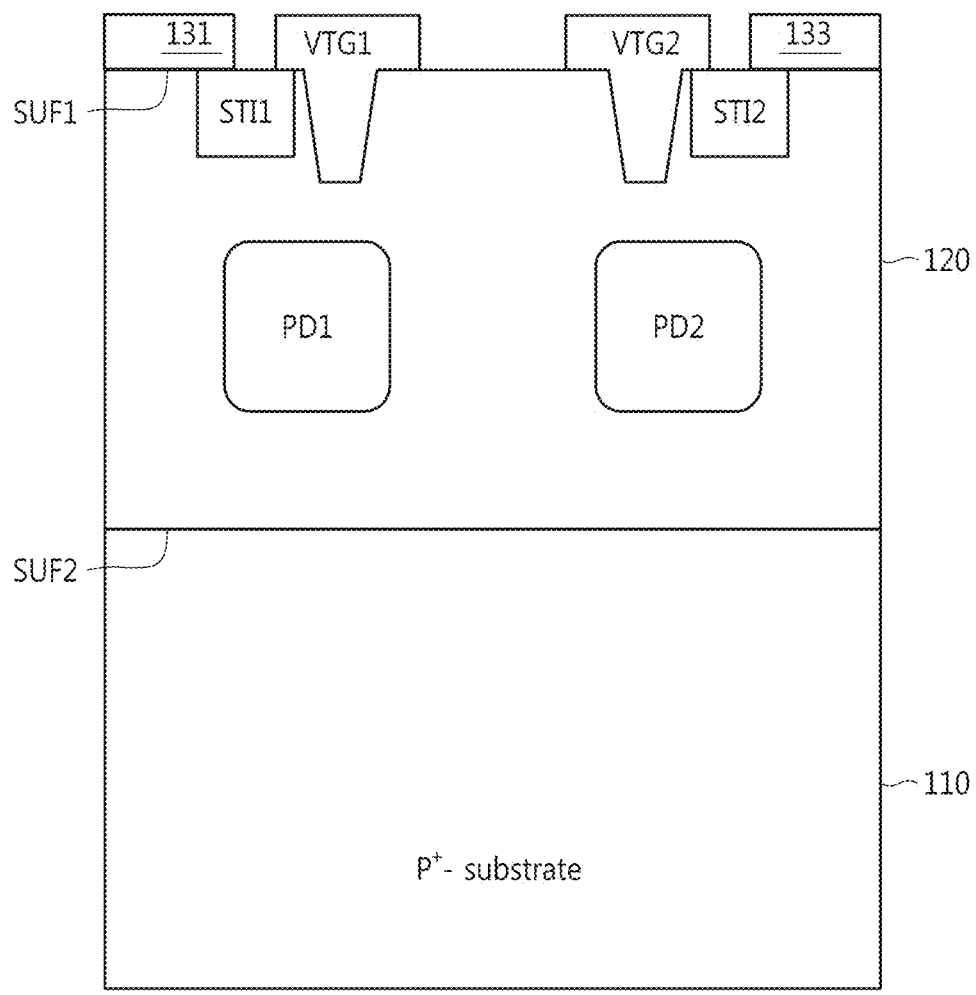

Referring to FIGS. 1D and 1E, the transfer gates VTG1 and VTG2 may be formed in the openings, respectively. In this respect, the transfer gates VTG1 and VTG2 may extend toward the photoelectric conversion regions PD1 and PD2, respectively, from the first surface SUF1 and may extend along parts of the first surface SUF1.

The transfer gates VTG1 and VTG2 may be formed simultaneously with other gates 131 and 133. For example, the other gates 131 and 133 may include a gate of a reset transistor and a gate of a source follower. For example, the gates VTG1, VTG2, 131, and 133 may be formed of polysilicon, metal, or a metal compound. As a result, the insulation layer mentioned above may lie between the gates VTG1, VTG2, 131, and 133 and the first surface SUF1.

Figure 1F:
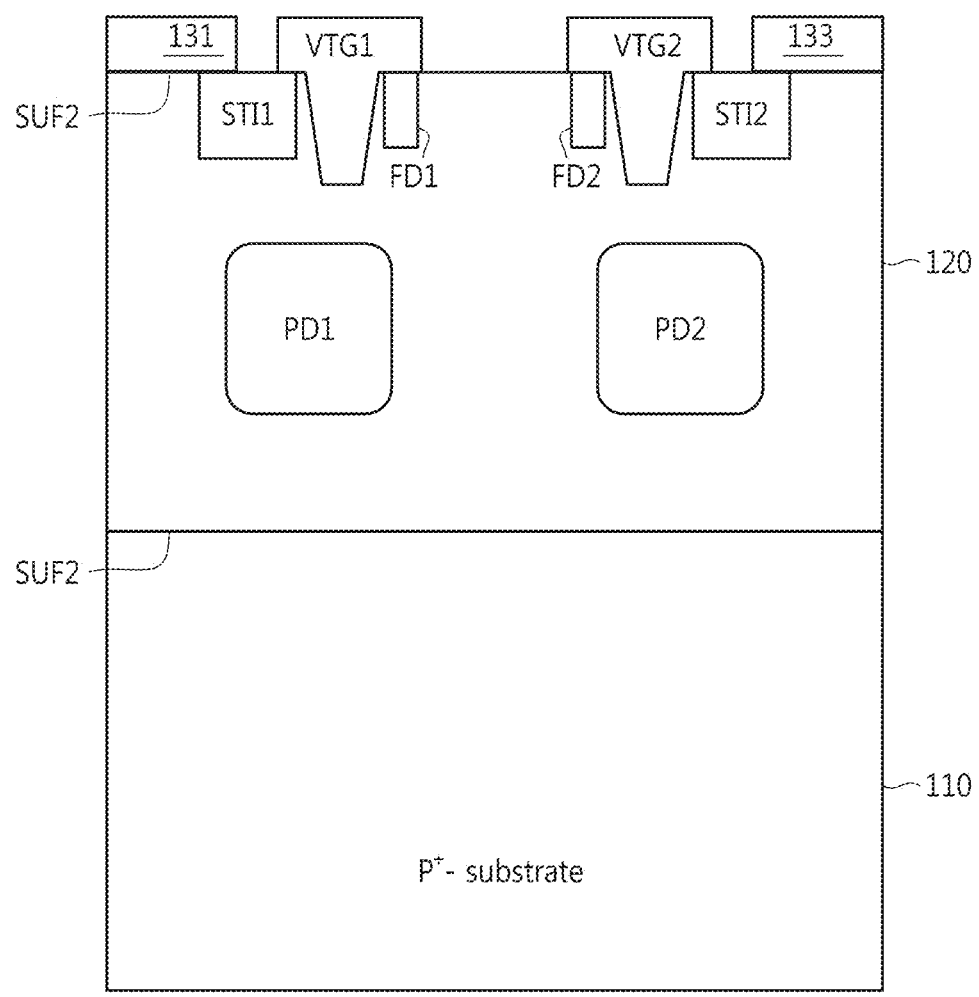

Referring to FIG. 1F, floating diffusion regions FD1 and FD2 may be formed to a predetermined depth from the first surface SUF1 of the p– epitaxial layer 120. For example, the floating diffusion regions FD1 and FD2 may be regions of the layer 120 doped with n+ impurities.

Figure 1G:
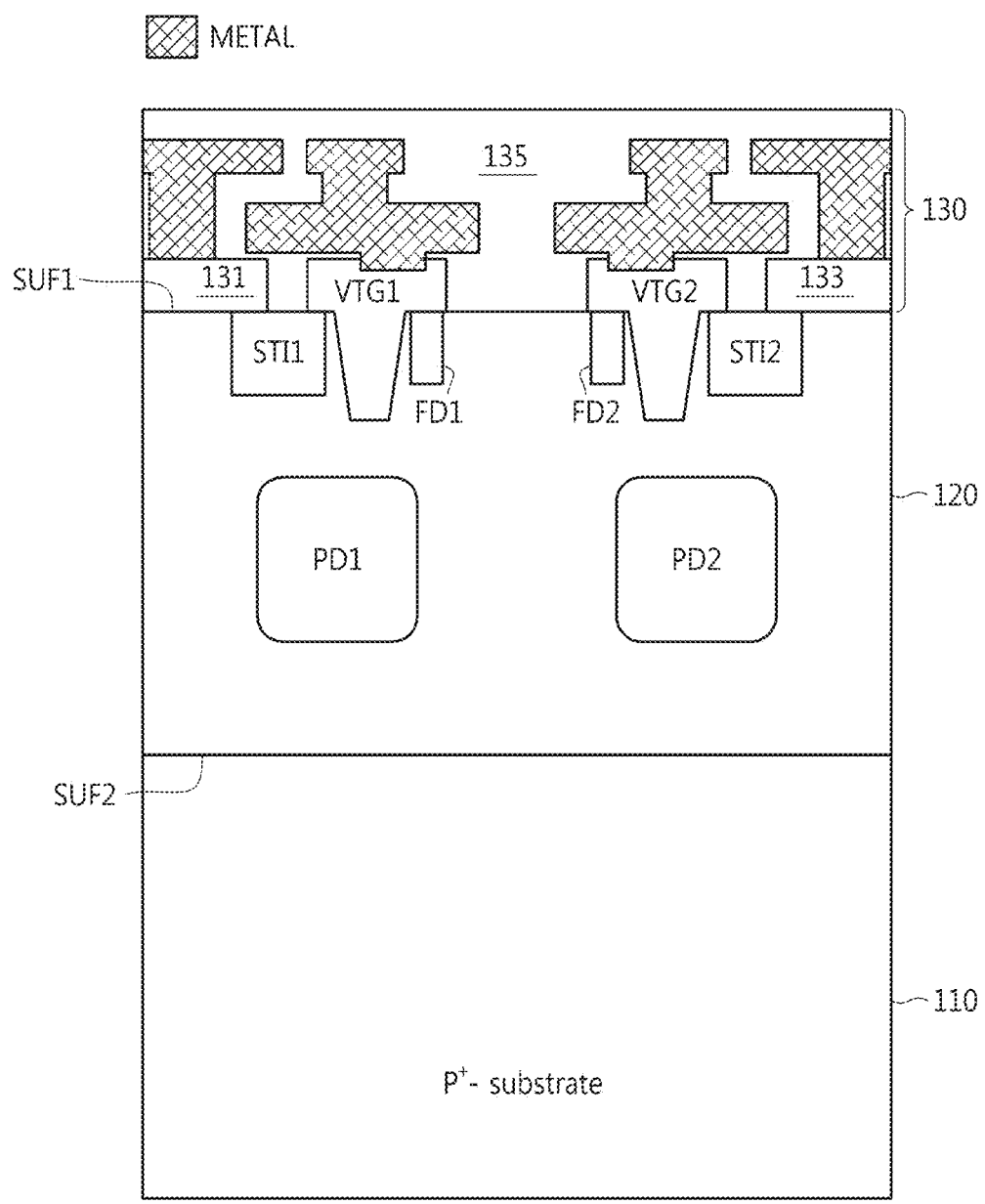

Referring to FIG. 1G, a metal wiring region 130 may be formed on the p– epitaxial layer 120. The metal wiring region 130 may include metal wiring, i.e., a plurality of metal wires, and contacts formed in a dielectric 135. The metal wires may be connected to the gates VTG1, VTG2, 131, and 133 through the contacts. For example, the dielectric 135 may be an inter-layer (or level) dielectric (ILD) or an inter-metal dielectric (IMD).

Figure 1I:
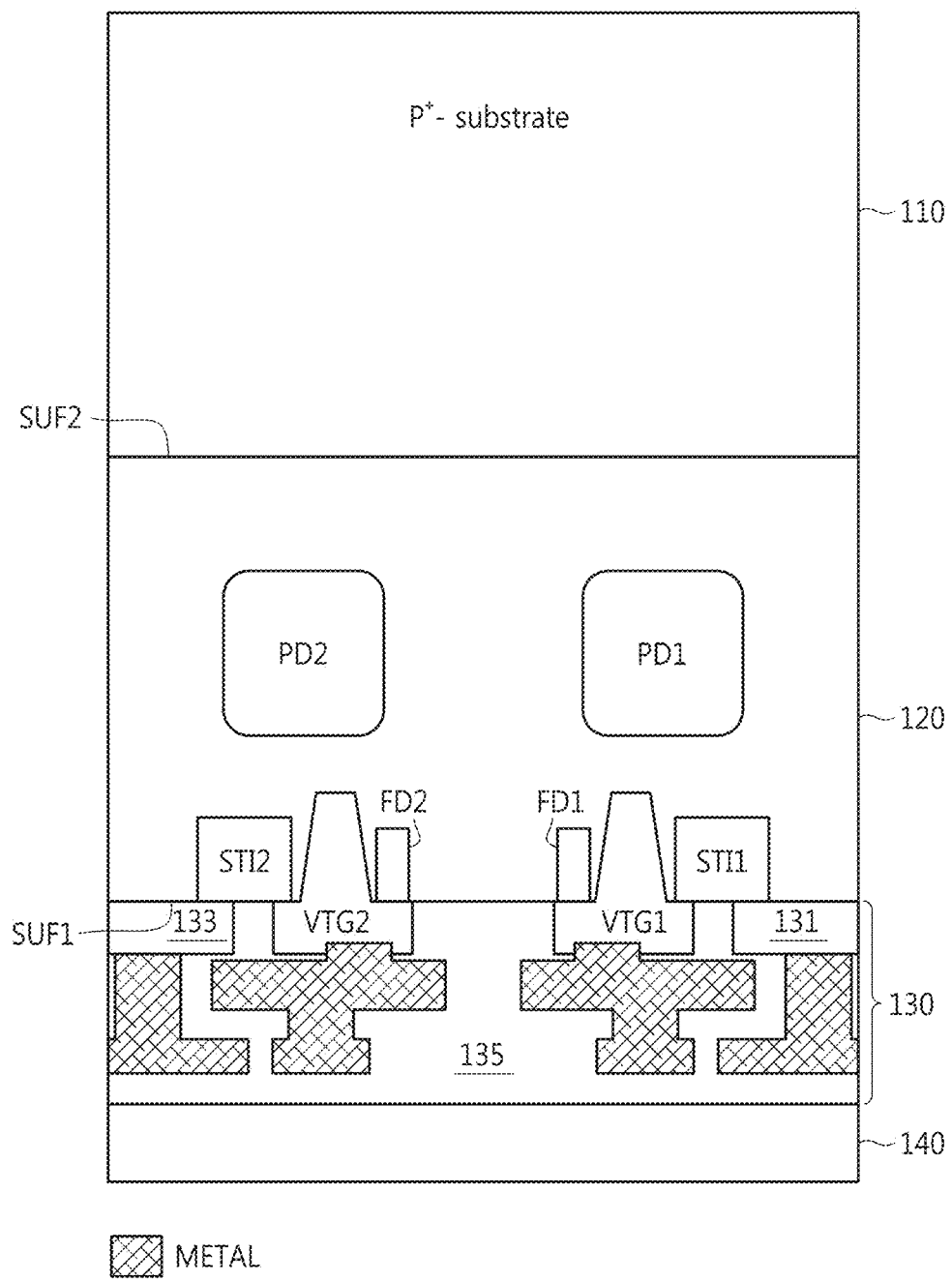

Referring to FIG. 1H, a sustaining wafer 140 is bonded on to the metal wiring region 130. The sustaining wafer 140 may be used to sustain (or support) the p– epitaxial layer 120. FIG. 1I shows the structure illustrated in FIG. 1H inverted as inverting the structure may be part of the manufacturing process considering the processing equipment used to carry out the stages of the manufacturing process.

Figure 1J:
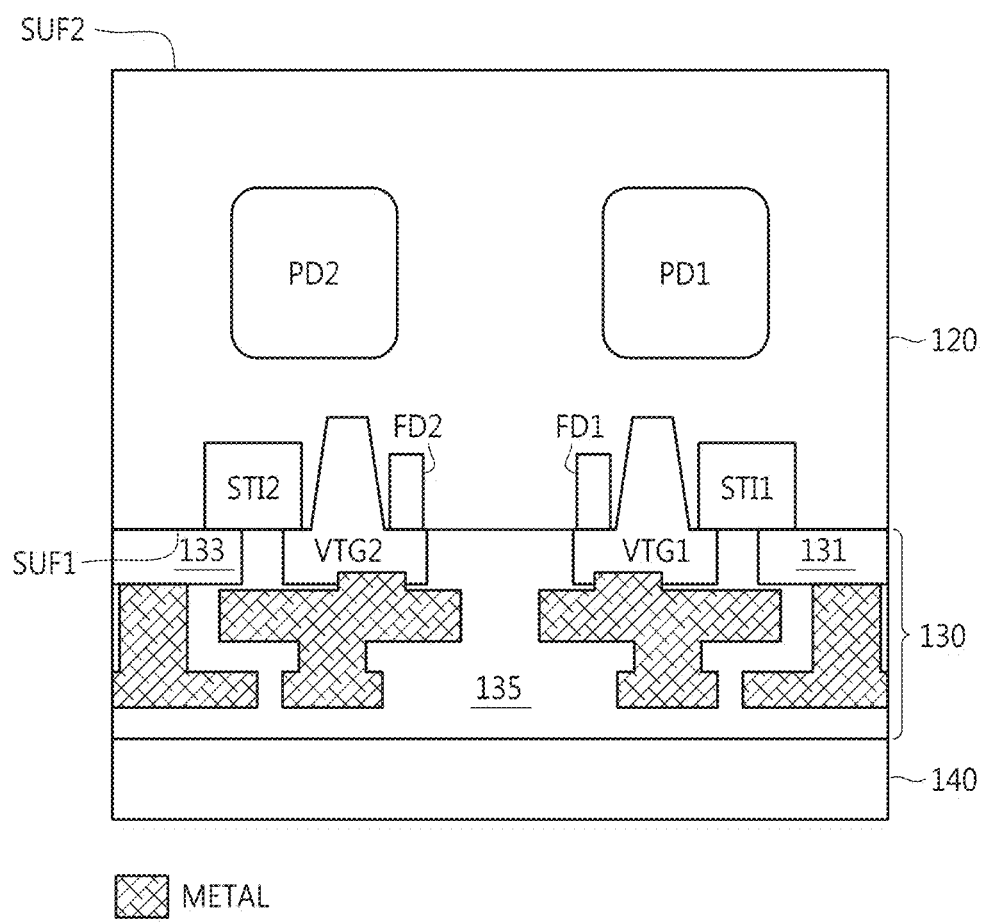

Referring to FIG. 1J, the p+ silicon substrate 110 is removed. For example, the p+ silicon substrate 110 may be ground away (polished) mechanically and/or chemically.

Figure 1K:
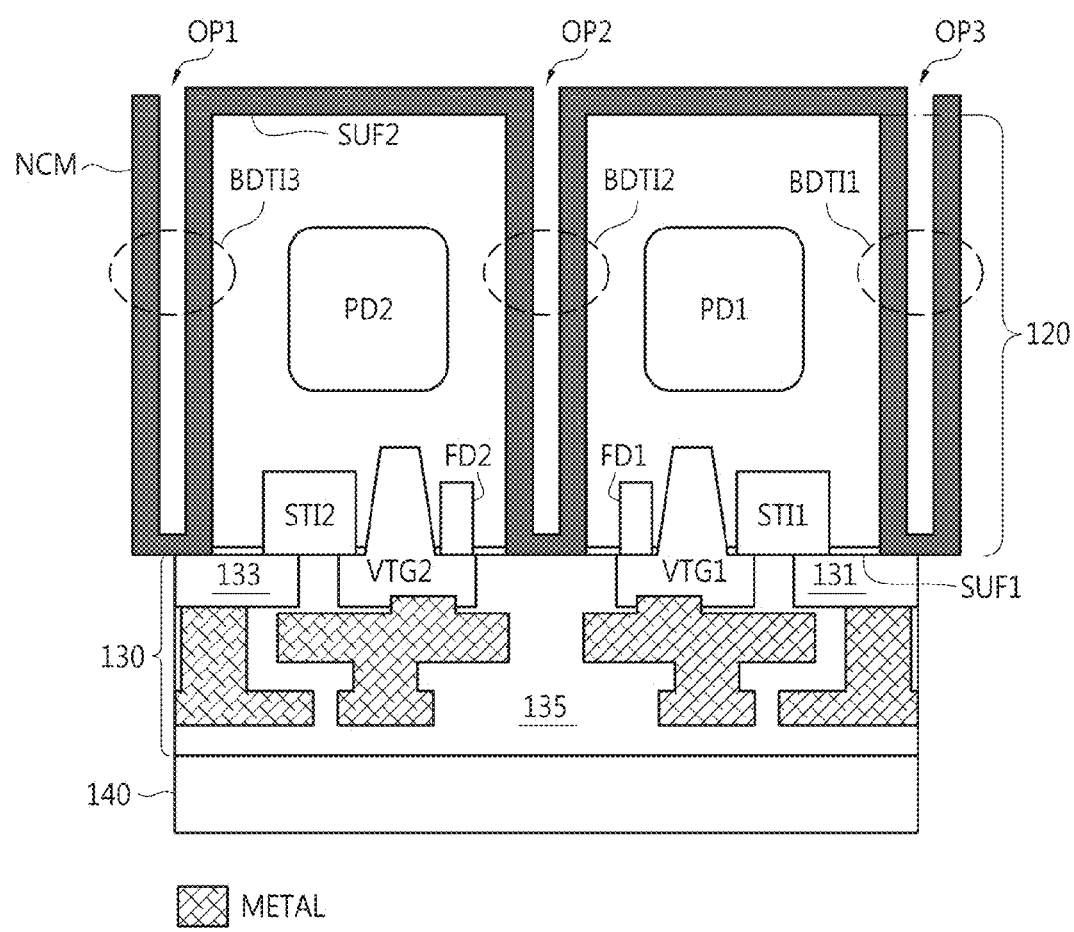
Figure 1L:
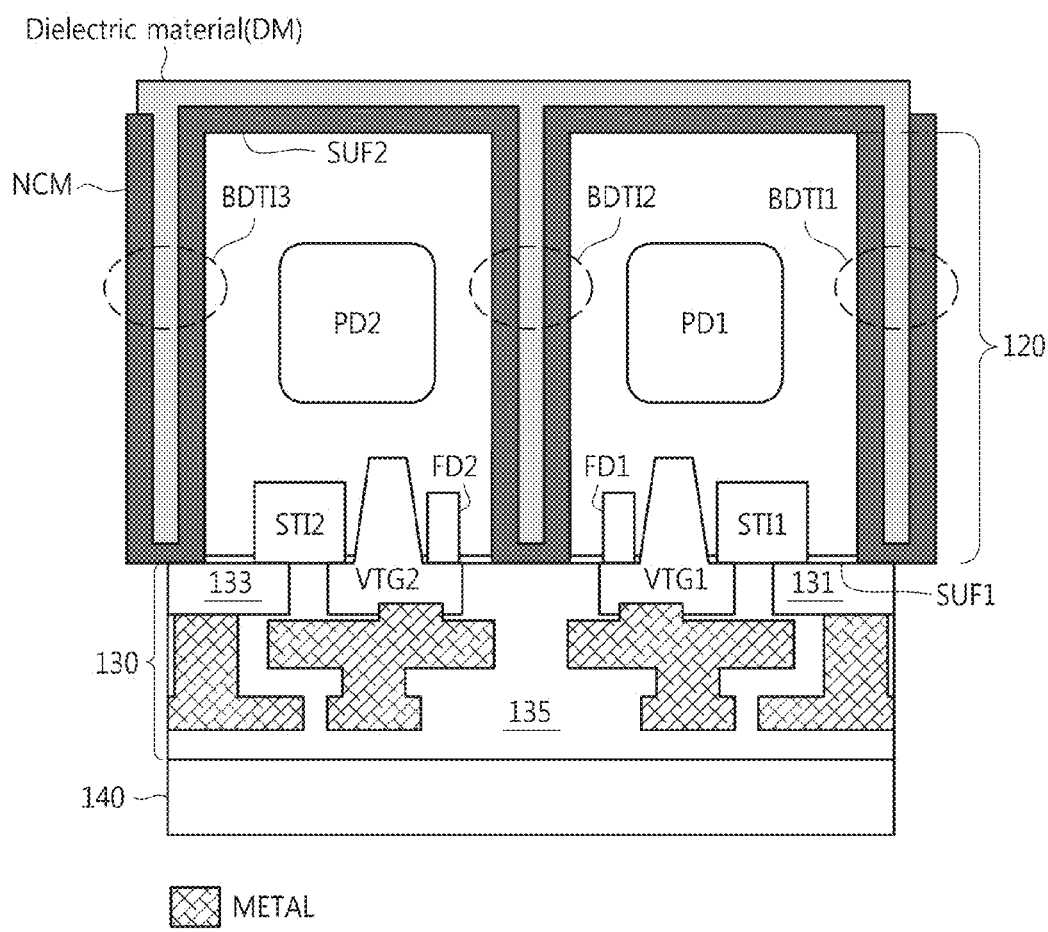

Referring to FIGS. 1K and 1L, trench-type isolation regions BDTI1, BDTI2, and BDTI3 are formed.

For example, portions of epitaxial layer 120 are vertically etched from the second surface SUF2 of the p– epitaxial layer 120 to form trenches (or openings) OP1, OP2, and OP3 respectively corresponding to the trench-type isolation regions BDTI1, BDTI2, and BDTI3.

Referring to FIGS. 1K and 1L, the second surface SUF2 and trenches OP1, OP2, and OP3 are coated with a negative charge material NCM. For example, the negative charge material NCM may be deposited on the second surface SUF2 and on the trenches OP1, OP2, and OP3 to coat the second surface SUF2 and the trenches OP1, OP2, and OP3. For example, the negative charge material NCM may be formed to a predetermined thickness on the second surface SUF2 and the trenches OP1, OP2, and OP3. Accordingly, dark current and crosstalk is reduced. In addition to, the dielectric material DM may be formed on the negative charge material NCM. The gaps or spaces of the trenches OP1, OP2, and OP3 coated with the negative charge material NCM are filled with the dielectric material DM. Referring to FIGS. 1K and 1O, trenches OP1, OP2, and OP3 of a pixel unit 10A-1 are filled with a negative charge material NCM and second surface SUF2 is coated with negative charge material NCM. Accordingly, dark current and crosstalk is reduced.

The negative charge material NCM may be an oxide of a metallic element. Examples of the metallic element include hafnium (Hf), zirconium (Zr), aluminum (Al), tantalum (Ta), yttrium (Y), and lanthanoids. For example, the negative charge material NCM may be hafnium oxide (HfO) or hafnium dioxide ($HfO_2$). Here, the negative charge material NCM may be a material containing negative fixed charges.

The trench-type isolation regions BDTI1, BDTI2, and BDTI3 including the negative charge material NCM and the dielectric material DM may be fully extended (or formed) from the second surface SUF2 to the first surface SUF1. The trench-type isolation regions BDTI1, BDTI2, and BDTI3 may be BDTI regions, respectively.

Figure 1M:
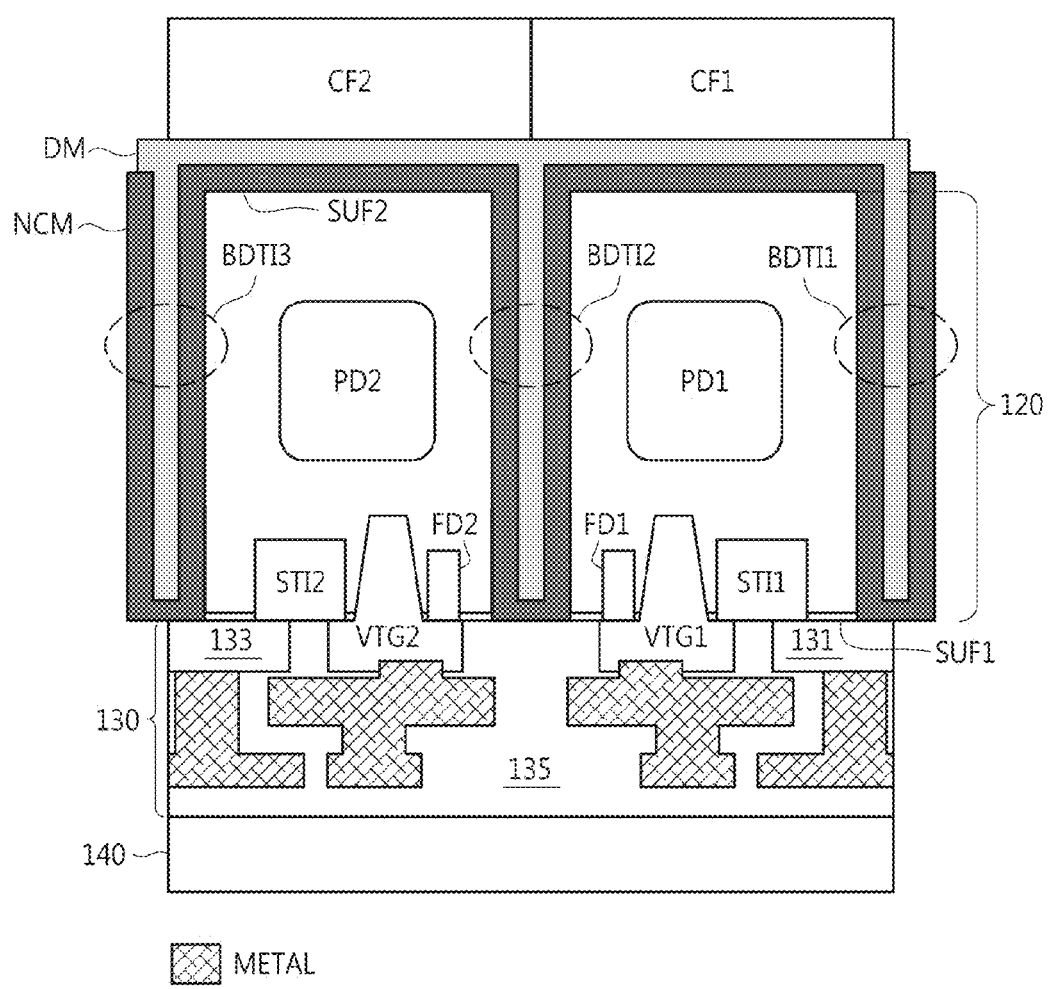

Referring to FIG. 1M, color filters CF1 and CF2 may be formed on the dielectric material DM. The first color filter CF1 may be one of a red filter, a green filter, and a blue filter and the second color filter CF2 may be another of the red, green and blue filters. Referring to FIG. 1O, color filters CF1 and CF2 may be formed on the negative charge material NCM.

Figure 1N:
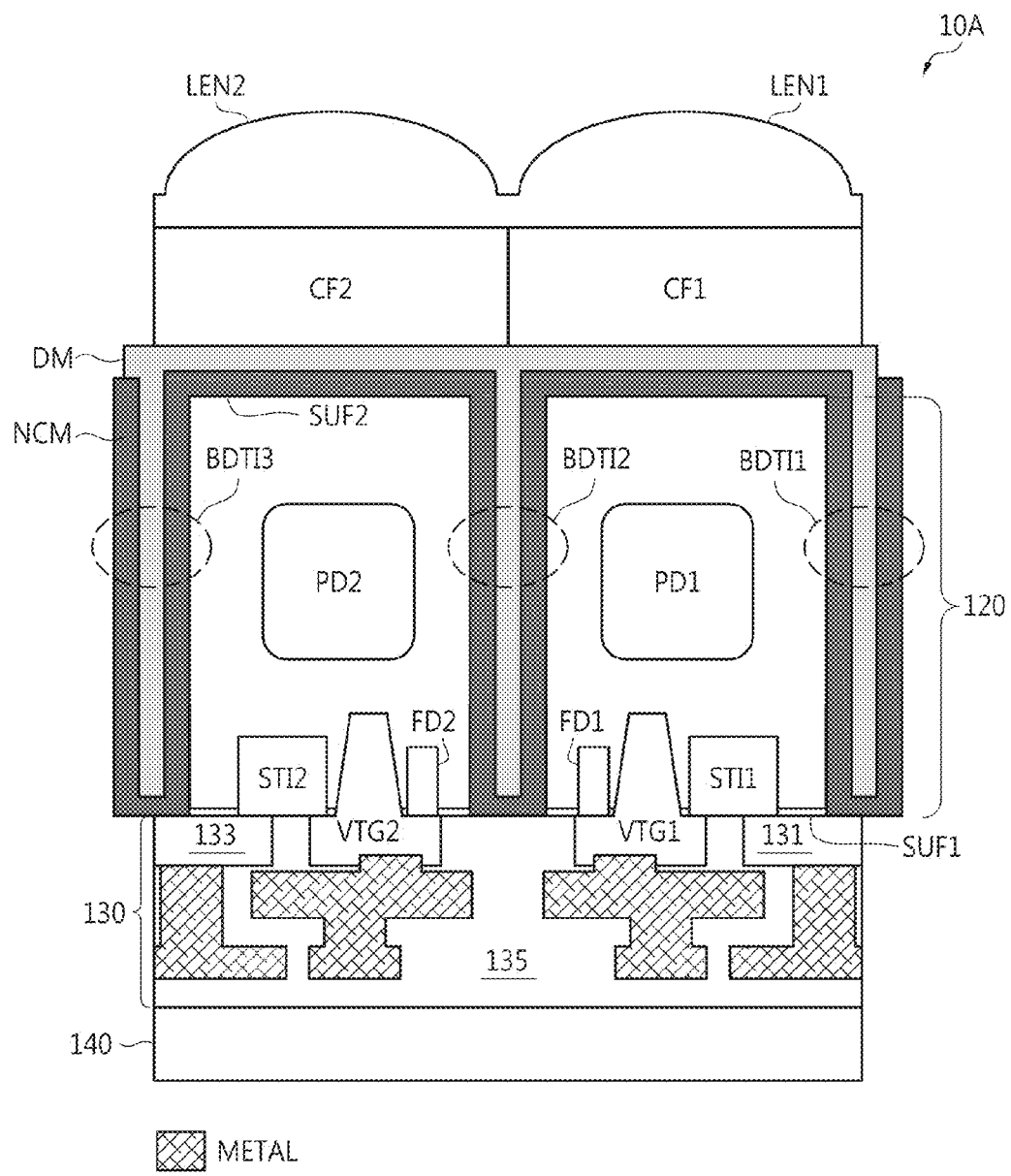

Referring to FIG. 1N or FIG. 1O, microlenses LEN1 and LEN2 may be formed on the color filters CF1 and CF2, respectively. A planarization layer such as an over-coating layer may be interposed between the microlenses LEN1 and LEN2 and the color filters CF1 and CF2 in some embodiments. The pixel 10A or 10A-1 illustrated in FIG. 1N or 1O may be manufactured using processes known, per se, in the art of manufacturing BSI image sensors.

The first photoelectric conversion region PD1 formed between the first surface SUF1 and the second surface SUF2 may generate charges in response to light received through the first microlens LEN1, the first color filter CF1, and the second surface SUF2. The second photoelectric conversion region PD2 formed between the first surface SUF1 and the second surface SUF2 may generate charges in response to light received through the second microlens LEN2, the second color filter CF2, and the second surface SUF2.

Two trench-type isolation regions BDTI1 and BDTI2 surround the first photoelectric conversion region PD1 and fully extend from the second surface SUF2 to the first surface SUF1. Two trench-type isolation regions BDTI2 and BDTI3 surround the second photoelectric conversion region PD2 and fully extend from the second surface SUF2 to the first surface SUF1. The floating diffusion regions FD1 and FD2 are positioned below the photoelectric conversion regions PD1 and PD2, respectively, when viewed from the second surface SUF2.

The first transfer gate VTG1 vertically extends toward the first photoelectric conversion region PD1 from the first surface SUF1. It may transfer charges from the first photoelectric conversion region PD1 to the first floating diffusion region FD1 in response to a corresponding voltage. The second transfer gate VTG2 vertically extends toward the second photoelectric conversion region PD2 from the first surface SUF1. It may transfer charges from the second photoelectric conversion region PD2 to the second floating diffusion region FD2 in response to a corresponding voltage.

The transfer gates VTG1 and VTG2 may be vertical transfer gates. Since the BDTIs BDTI1, BDTI2, and BDTI3 having the negative charge material NCM are interposed between pixels or between the photoelectric conversion regions PD1 and PD2, dark current and crosstalk are minimized or obviated.

A method of manufacturing a pixel 10B or 10B-1 according to the inventive concept will now be described in detail with reference to FIGS. 2A through 2L.

Figure 2A:
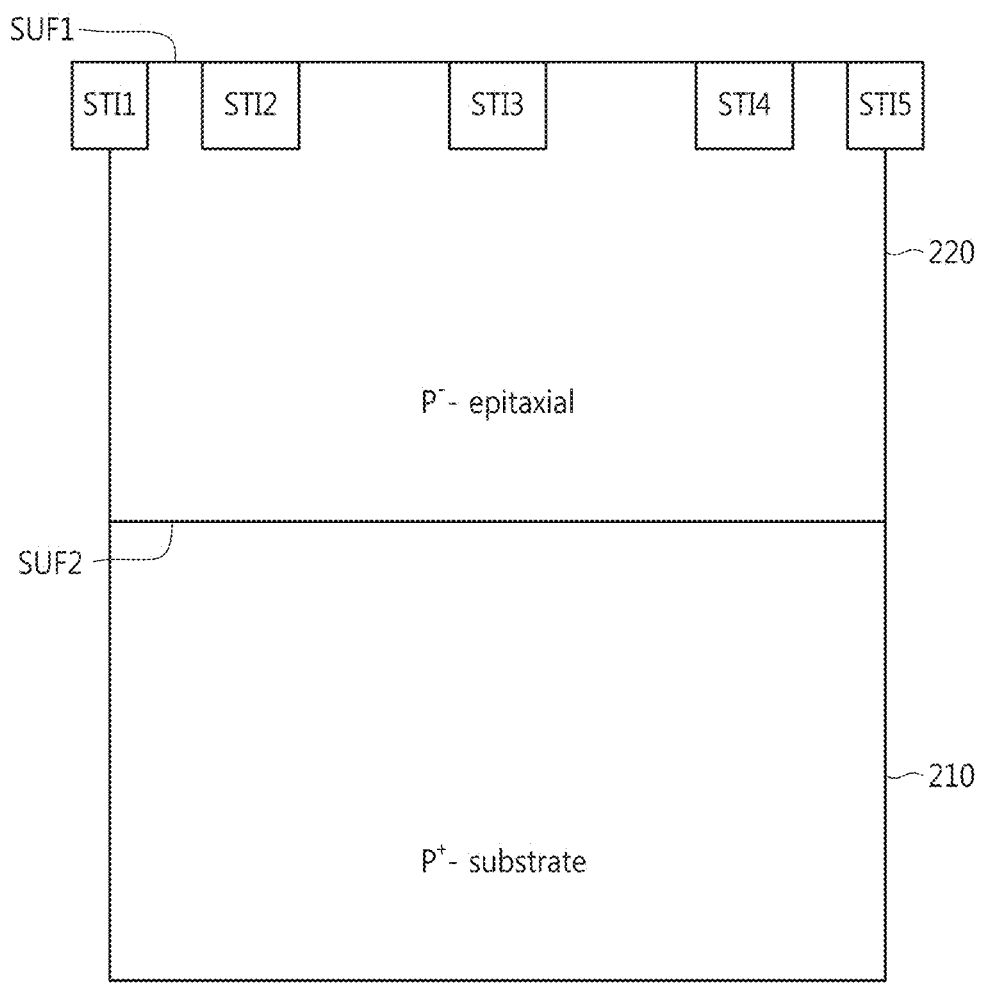
FIGS. 2A 2B, 2C, 2D, 2E, 2F, 2G, 2H, 2I, 2J, 2K and 2L are cross-sectional views of pixels of an image sensor in each of stages during the course of its manufacture, and together illustrate another method of manufacturing pixels according to the inventive concept.

Referring first to FIG. 2A, a p− epitaxial layer 220 may be formed on a p+ silicon substrate 210. The p− epitaxial layer 220 may have first and second surfaces SUF1 and SUF2 facing each other. A plurality of first isolation regions STI1 through STI5 may be formed in the p− epitaxial layer 220. The first isolation regions STI1 through STI5 may be trench-type isolation regions, e.g., STI regions. The first isolation regions STI1 through STI5 may be formed in the p− epitaxial layer 220 using etching process and deposition process.

Figure 2B:
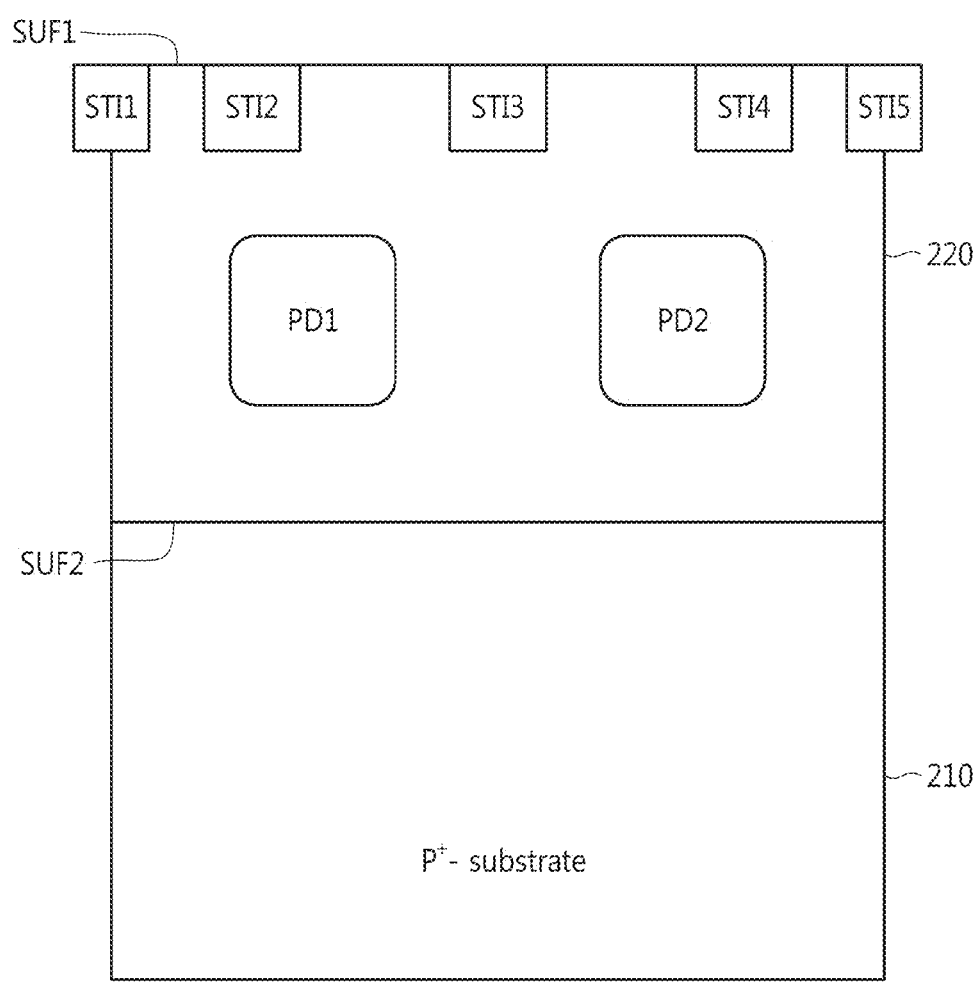
Figure 2C:
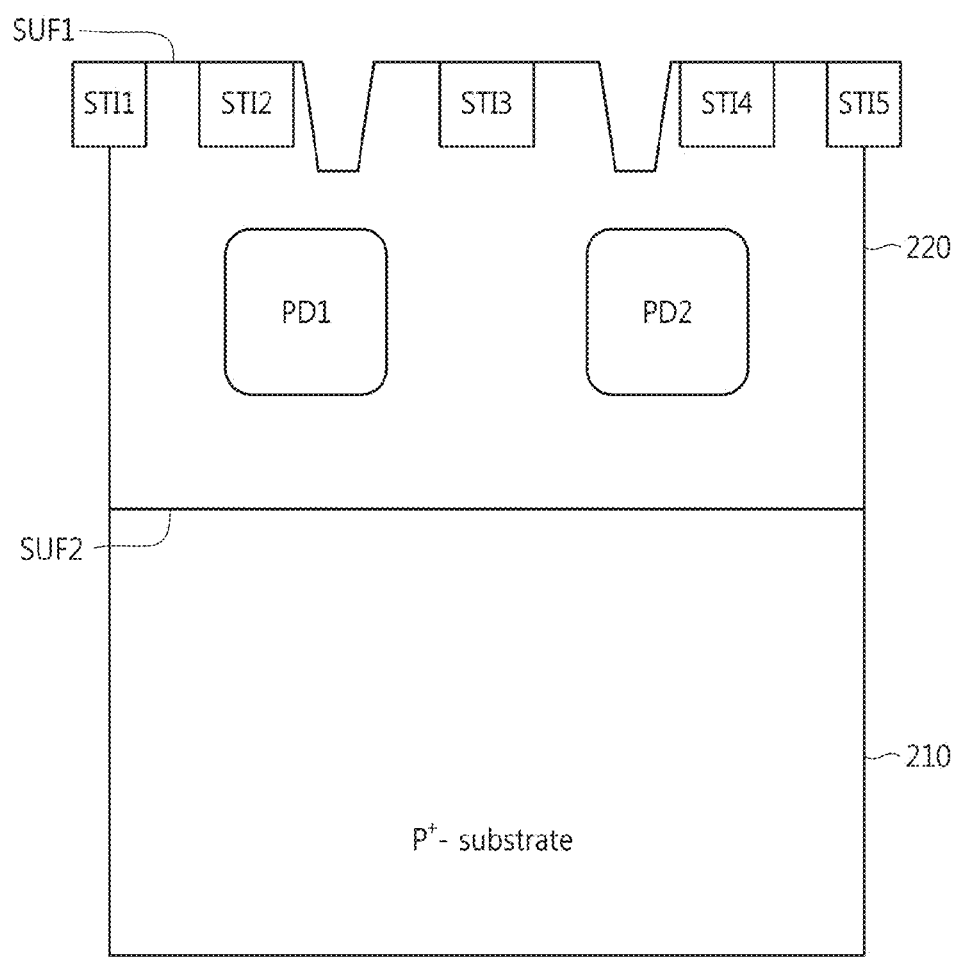

Referring to FIG. 2B, photoelectric conversion regions PD1 and PD2 may be formed between the first surface SUF1 and the second surface SUF2 using ion implantation process. Referring to FIG. 2C, a plurality of openings may be formed to a predetermined depth from the first surface SUF1 of the p− epitaxial layer 220. The depth and/or shape of the openings may be dependent, in terms of their design, on the desired depth and/or shape of the transfer gates VTG1 and VTG2 in FIG. 2D. After the openings are formed, an insulation layer may be formed on the first surface SUF1 to a predetermined thickness.

Figure 2D:
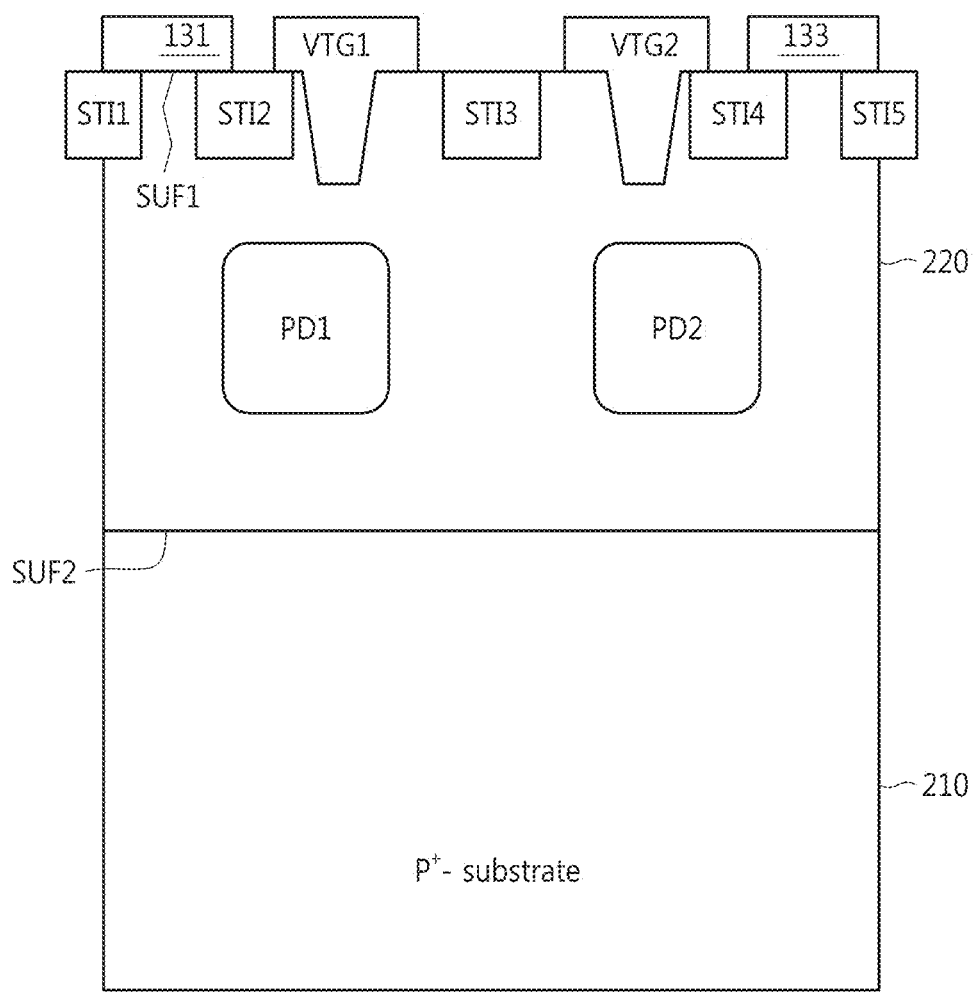

Referring to FIG. 2D, the transfer gates VTG1 and VTG2 may be formed in the openings, respectively. For example, the transfer gates VTG1 and VTG2 may vertically extend (or be formed to vertically extend) toward the photoelectric conversion regions PD1 and PD2, respectively, from the first surface SUF1. The transfer gates VTG1 and VTG2 may be formed simultaneously with other gates 131 and 133.

Figure 2E:
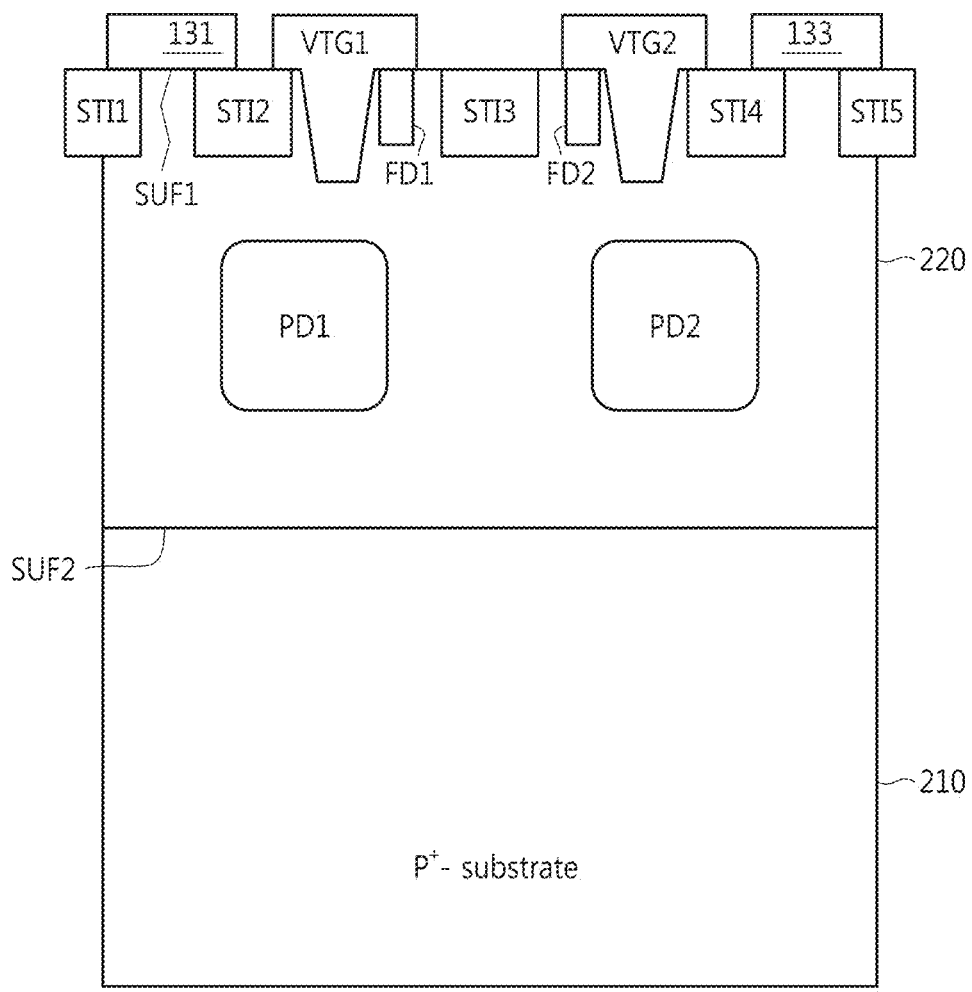
Figure 2F:
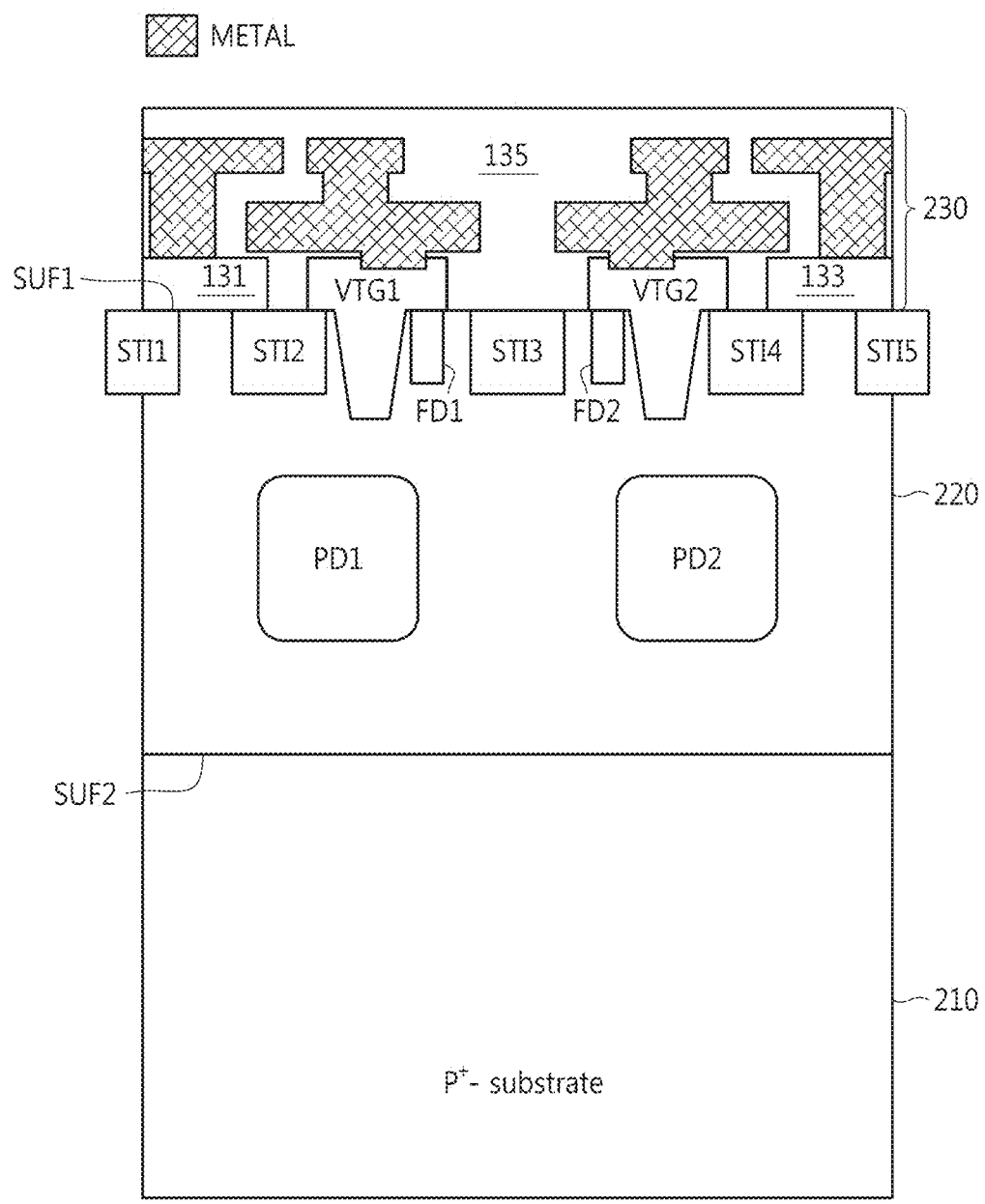

Referring to FIG. 2E, floating diffusion regions FD1 and FD2 may be formed to a predetermined depth from the first surface SUF1 of the p− epitaxial layer 220. Referring to FIG. 2F, a metal wiring region 230 is formed on the p− epitaxial layer 220.

Figure 2G:
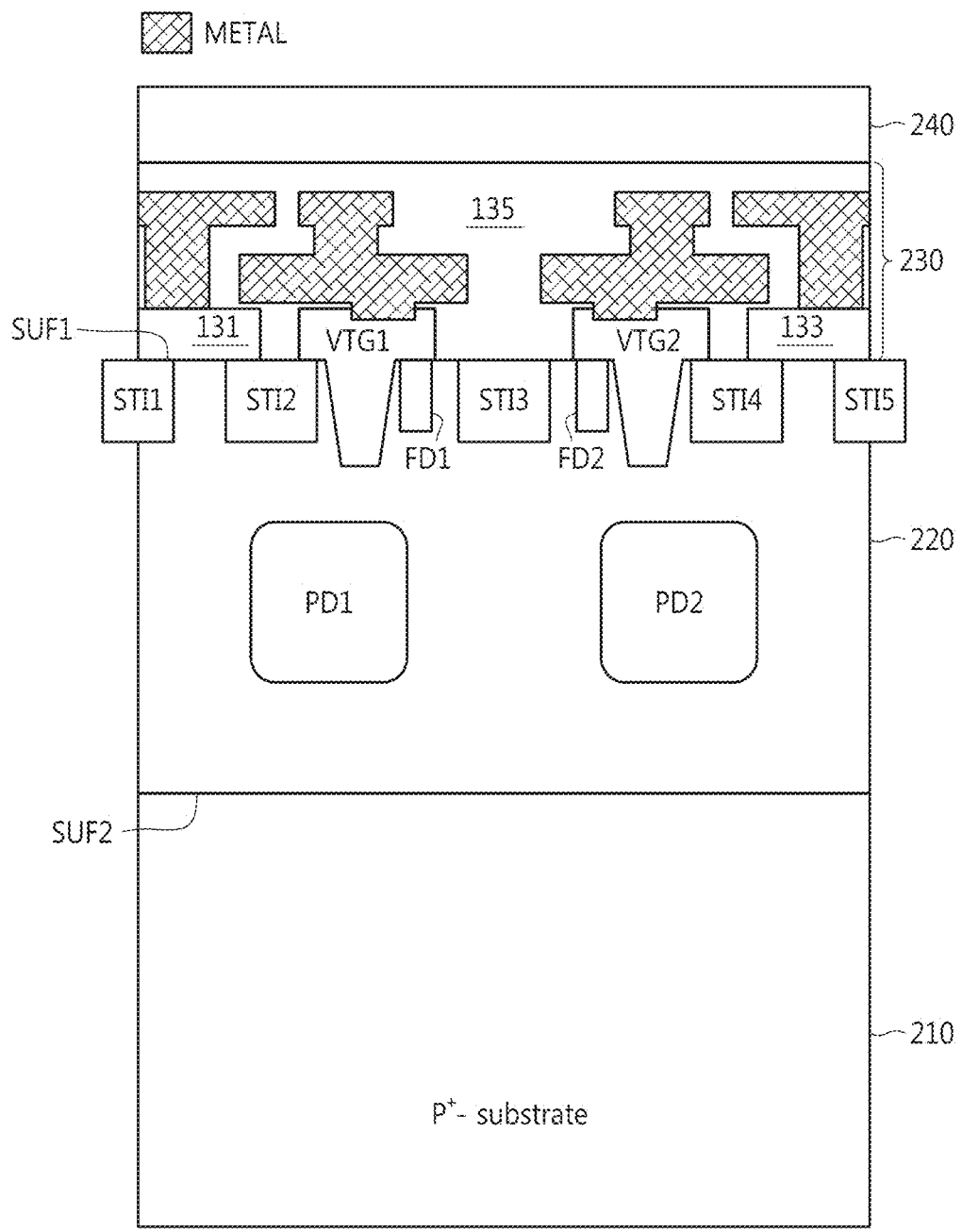
Figure 2H:
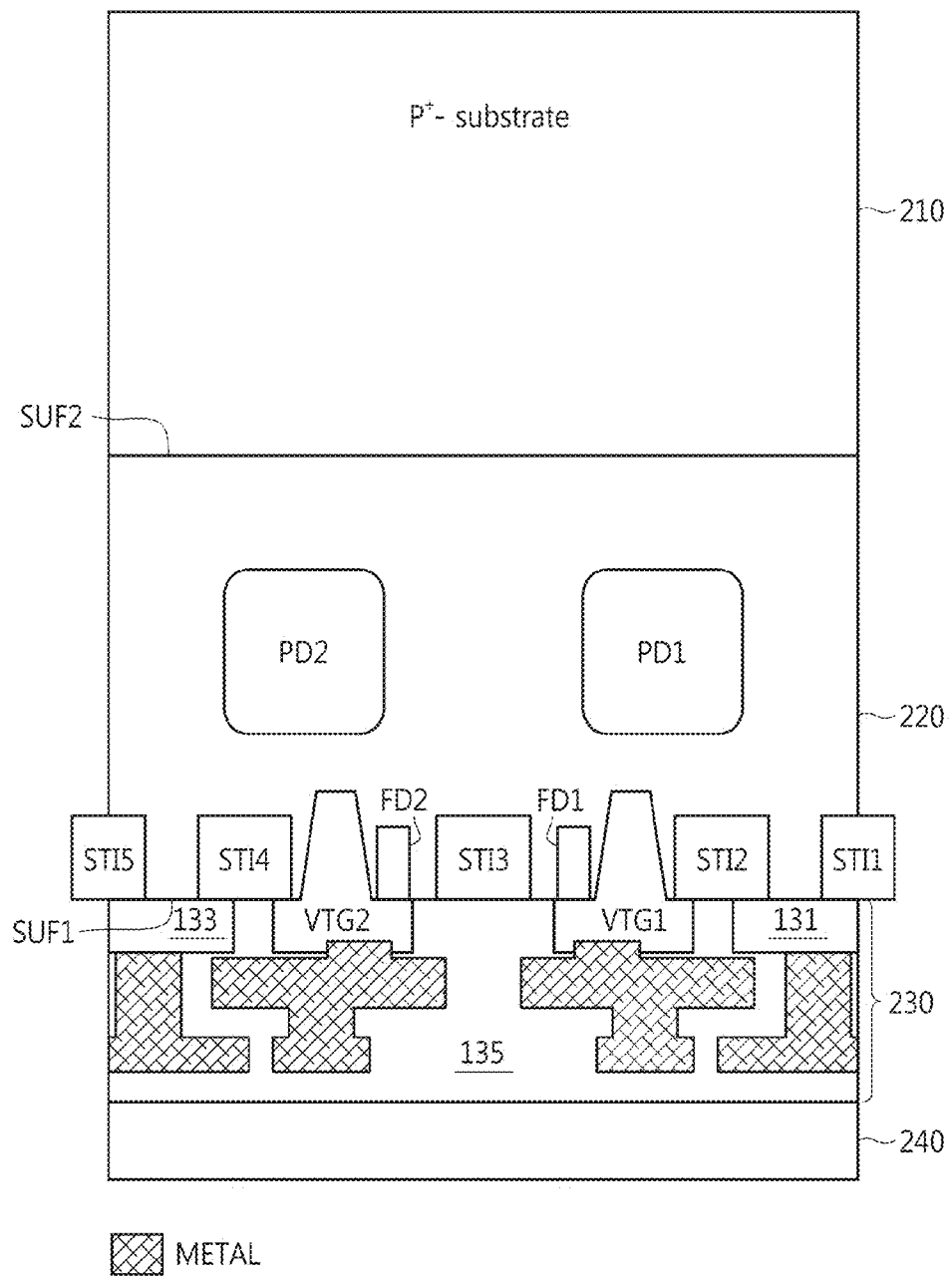

Referring to FIG. 2G, a sustaining wafer 240 is bonded on to the metal wiring region 230. The sustaining wafer 240 may be used to sustain (or support) the p− epitaxial layer 220. The structure illustrated in FIG. 2G may be turned over (inverted) so as to assume the orientation illustrated in FIG. 2H in preparation for further processing as was described with respect to the first embodiment.

Figure 2I:
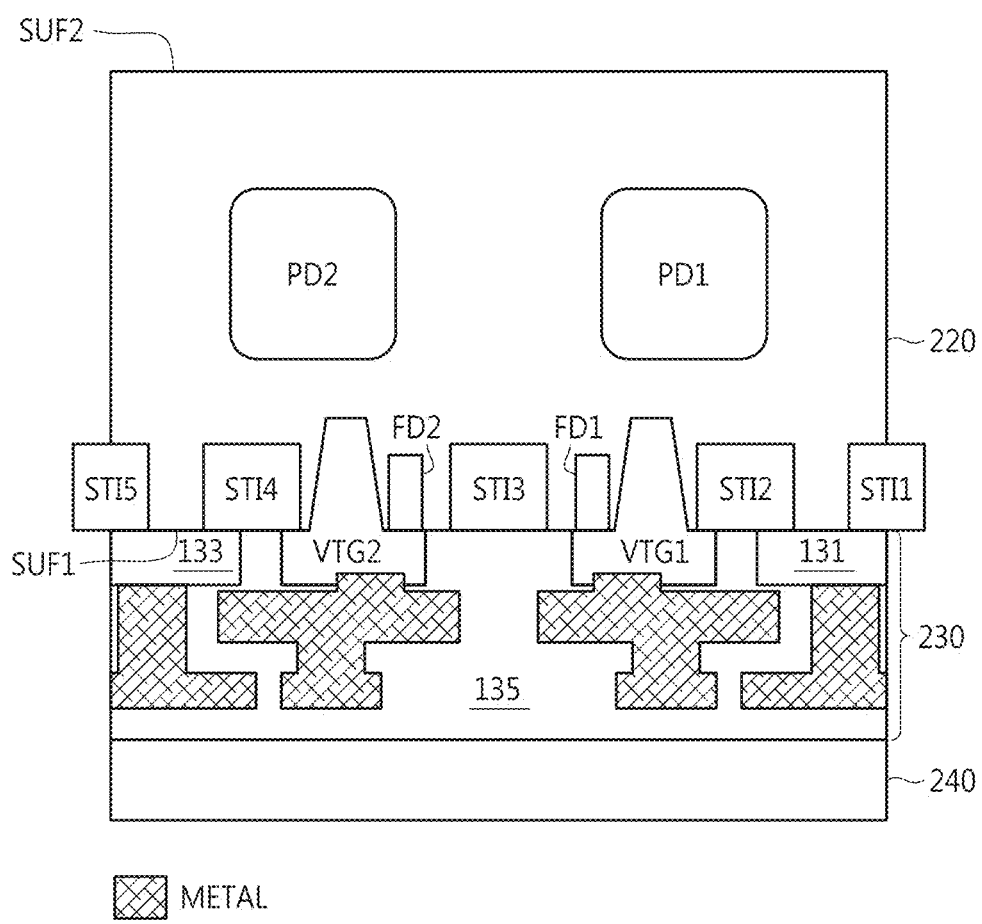

Referring to FIG. 2I, the p+ silicon substrate 210 is removed.

Figure 2J:
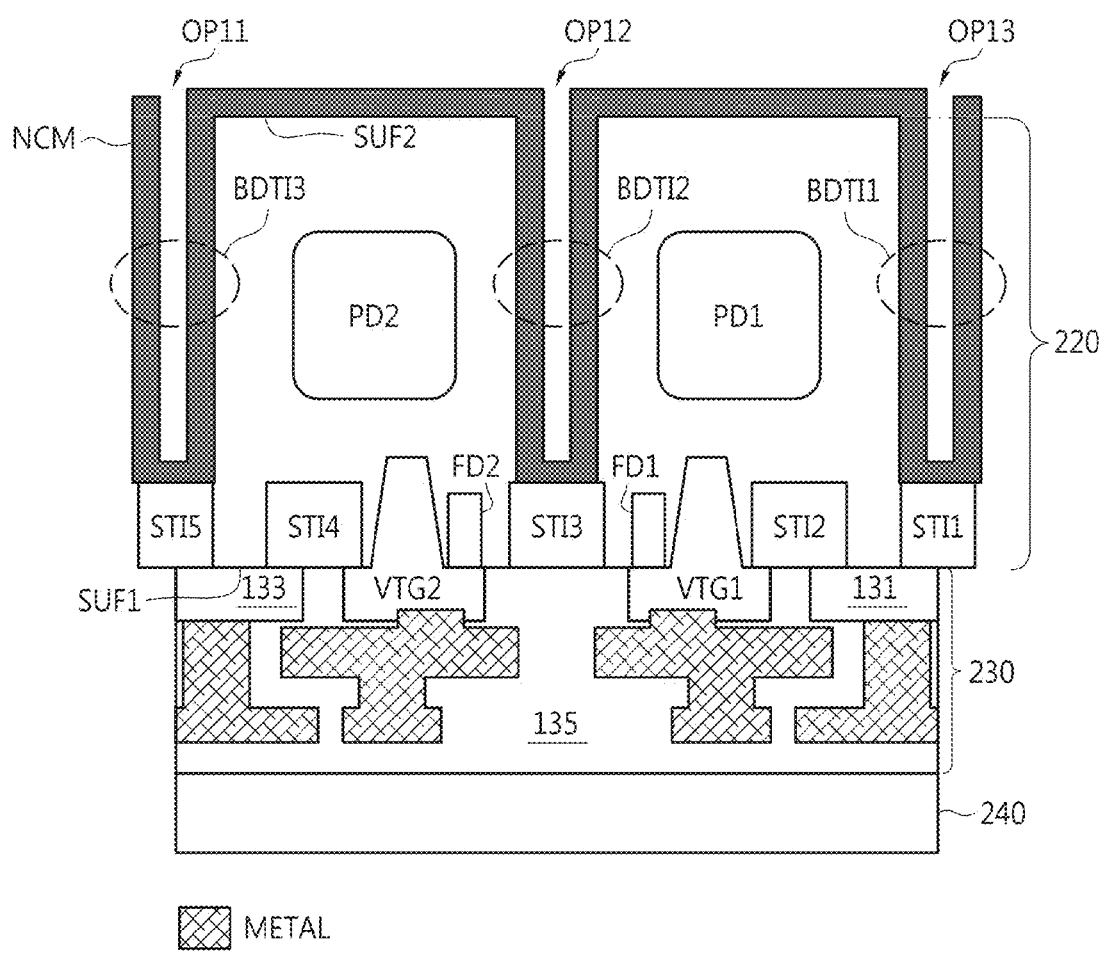
Figure 2K:
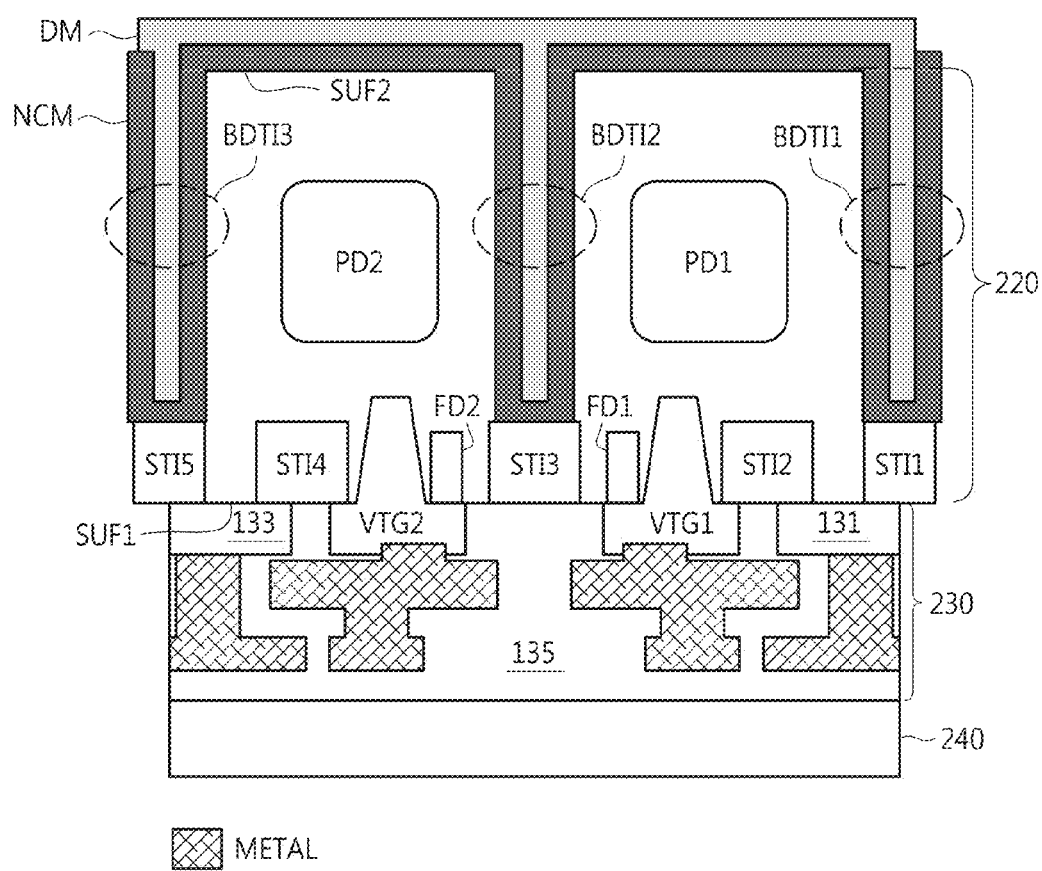

Referring to FIGS. 2J and 2K, trench-type isolation regions BDTI1, BDTI2, and BDTI3 are formed.

First, portions of the p− epitaxial layer 220 are vertically etched from the second surface SUF2 of the p− epitaxial layer 220 to form trenches OP11, OP12, and OP13 respectively corresponding to the trench-type isolation regions BDTI1, BDTI2, and BDTI3. At this time, the trenches OP11, OP12, and OP13 vertically extend to (or are formed until they open at) the STIs STI1, STI3, and STI5, respectively. That is, trenches OP11, OP12, and OP13 and STIs have the same pattern and are vertically aligned.

The second surface SUF2 and trenches OP11, OP12, and OP13 are coated with negative charge material NCM. For example, the negative charge material NCM may be deposited on the second surface SUF2 and on the trenches OP11, OP12, and OP13 to coat the second surface SUF2 and the trenches OP11, OP12, and OP13. For example, the negative charge material NCM may be formed to a predetermined thickness on the second surface SUF2 and the trenches OP11, OP12, and OP13. In addition to, the dielectric material DM may be formed on the negative charge material NCM. The gaps or spaces of the trenches OP1, OP2, and OP3 coated with the negative charge material NCM are filled with the dielectric material DM. Alternatively, referring to FIGS. 2J and 2M, trenches OP11, OP12, and OP13 of a pixel unit 10B-1 are filled with a negative charge material NCM and second surface SUF2 is coated with negative charge material NCM. The negative charge material NCM may be HfO or $HfO_2$. The trench-type isolation regions BDTI1, BDTI2, and BDTI3 may be parts of a contiguous layer of BDTI. Accordingly, the plurality of STIs STI1, STI3, and STI5 may extend vertically from the first surface SUF1 towards and have the same pattern as the plurality of trench-type isolation regions BDTI1, BDTI2, and BDTI3. Thus, the backside deep trench-type isolation and the shallow trench isolation are vertically aligned. And, in this embodiment, the negative charge material NCM of the BDTI contacts the front side trench isolation (STIs regions STI1, STI3, and STI5).

Figure 2L:
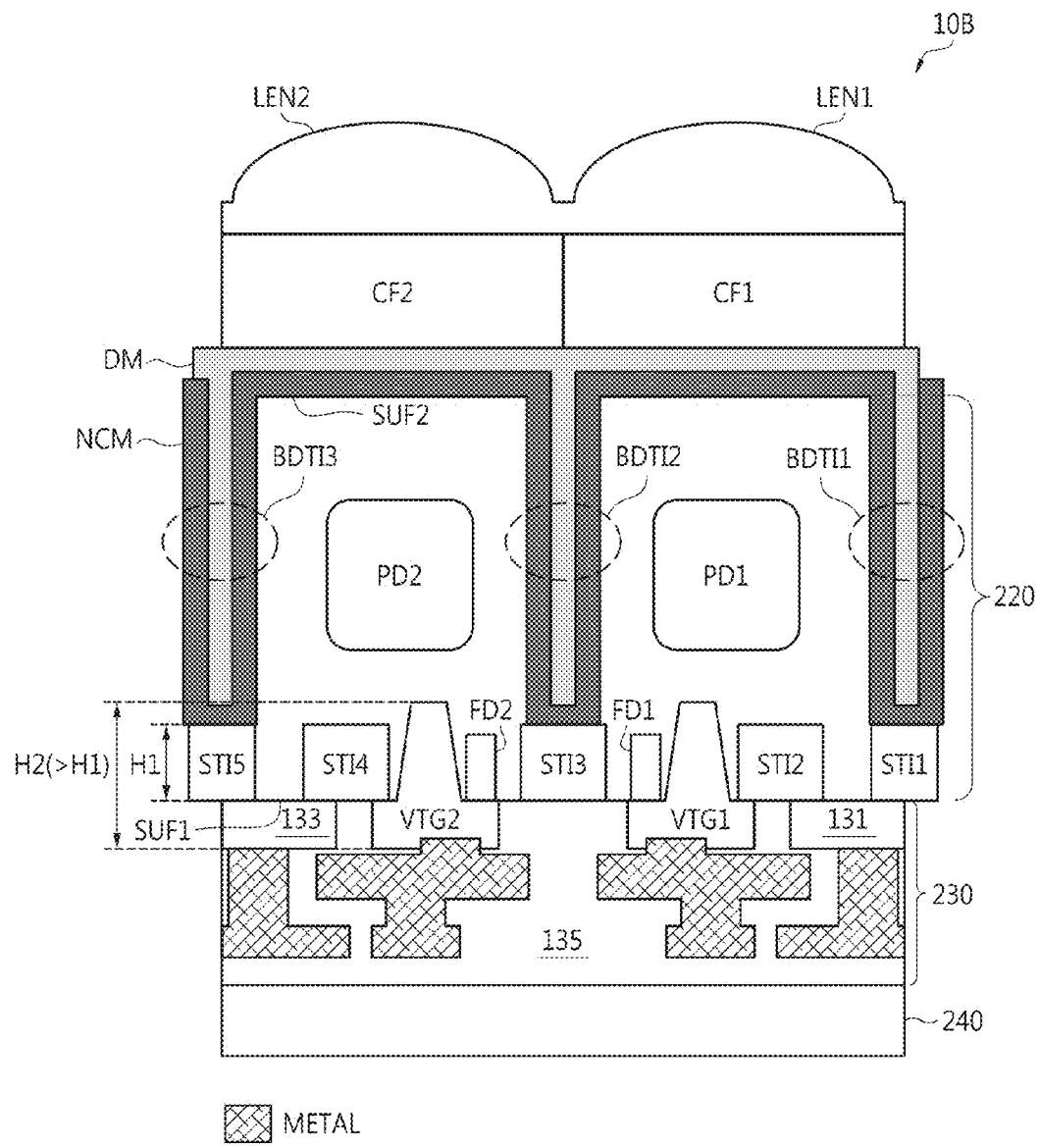
Figure 2M:
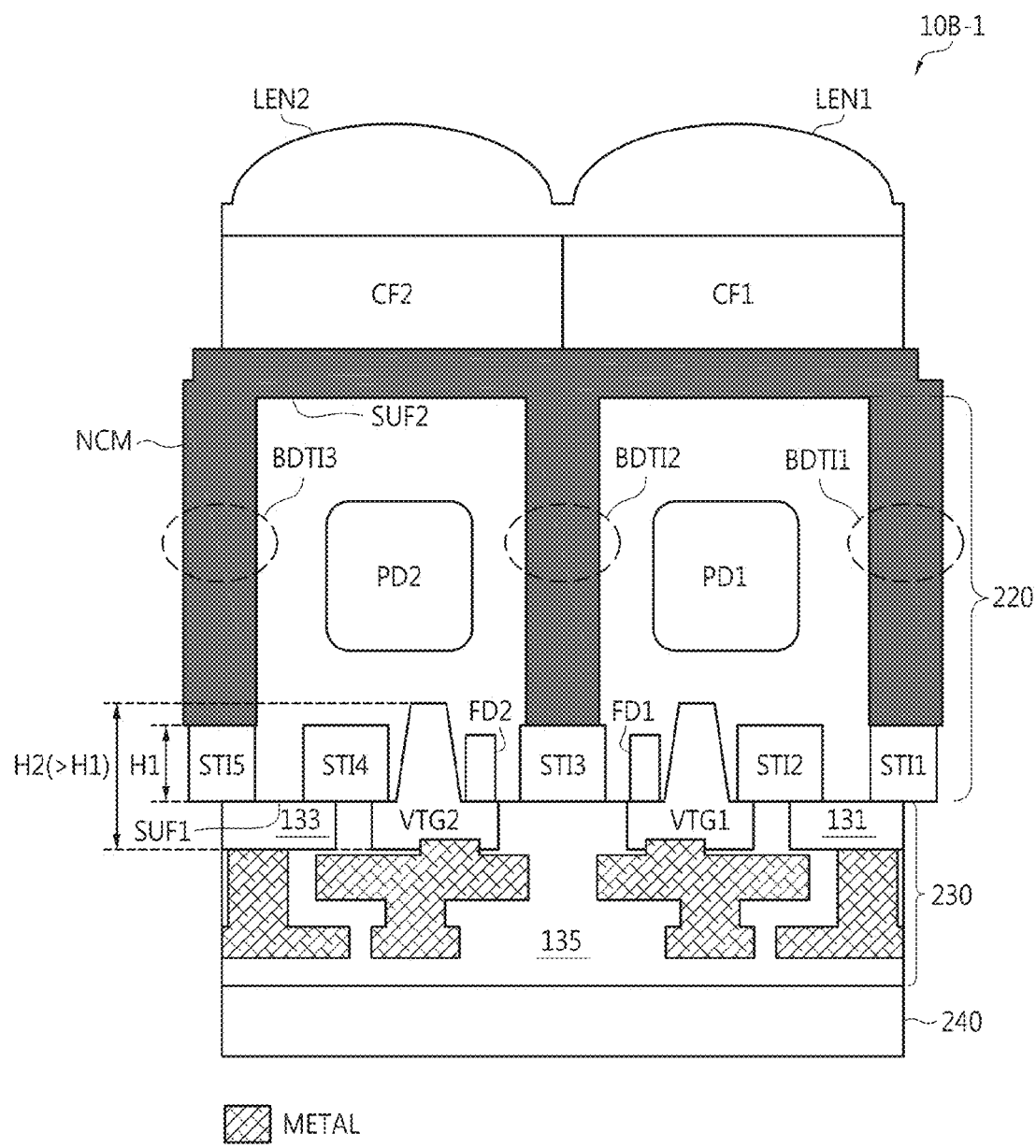
FIG. 2M is a cross-sectional view of pixels according to the inventive concept.

Referring to FIG. 2L, color filters CF1 and CF2 may be formed on the dielectric material DM. Referring to FIG. 2M, color filters CF1 and CF2 may be formed on the negative charge material NCM. Microlenses LEN1 and LEN2 may be formed on the color filters CF1 and CF2, respectively. In other embodiments a planarization layer, such as an overcoating layer, may be formed on the color filters CF1 and CF2 such that it is interposed between the microlenses LEN1 and LEN2 and the color filters CF1 and CF2 in the final device. For example, a height H1 of STI region STI1, STI3, or STI5 is less than a height H2 of a transfer gate VTG1 or VTG2.

The pixel 10B or 10B-1 illustrated in FIG. 2L or 2M may be manufactured using processes known per se in the art of manufacturing BSI image sensors. The first photoelectric conversion region PD1 formed between the first surface SUF1 and the second surface SUF2 may generate charges in response to light received through the first microlens LEN1, the first color filter CF1, and the second surface SUF2. The second photoelectric conversion region PD2 formed between the first surface SUF1 and the second surface SUF2 may generate charges in response to light received through the second microlens LEN2, the second color filter CF2, and the second surface SUF2.

The trench-type isolation regions surround the first photoelectric conversion region PD1 and vertically extend from the second surface SUF2 until they respectively contact the corresponding STIs STI1 and STI3. The trench-type isolation regions also surround the second photoelectric conversion region PD2 and vertically extend from the second surface SUF2 until they respectively contact the corresponding STIs STI3 and STI5. The floating diffusion regions FD1 and FD2 are positioned below the photoelectric conversion regions PD1 and PD2, respectively, when viewed from the second surface SUF2.

The first transfer gate VTG1 vertically extends toward the first photoelectric conversion region PD1 from the first surface SUF1. It transfers charges from the first photoelectric conversion region PD1 to the first floating diffusion region FD1 in response to a corresponding voltage. The second transfer gate VTG2 vertically extends toward the second photoelectric conversion region PD2 from the first surface SUF1. It transfers charges from the second photoelectric conversion region PD2 to the second floating diffusion region FD2 in response to a corresponding voltage.

A method of manufacturing a pixel 10C or 10C-1 according to the inventive concept will now be described in detail with reference to FIGS. 3A through 3L.

Figure 3A:
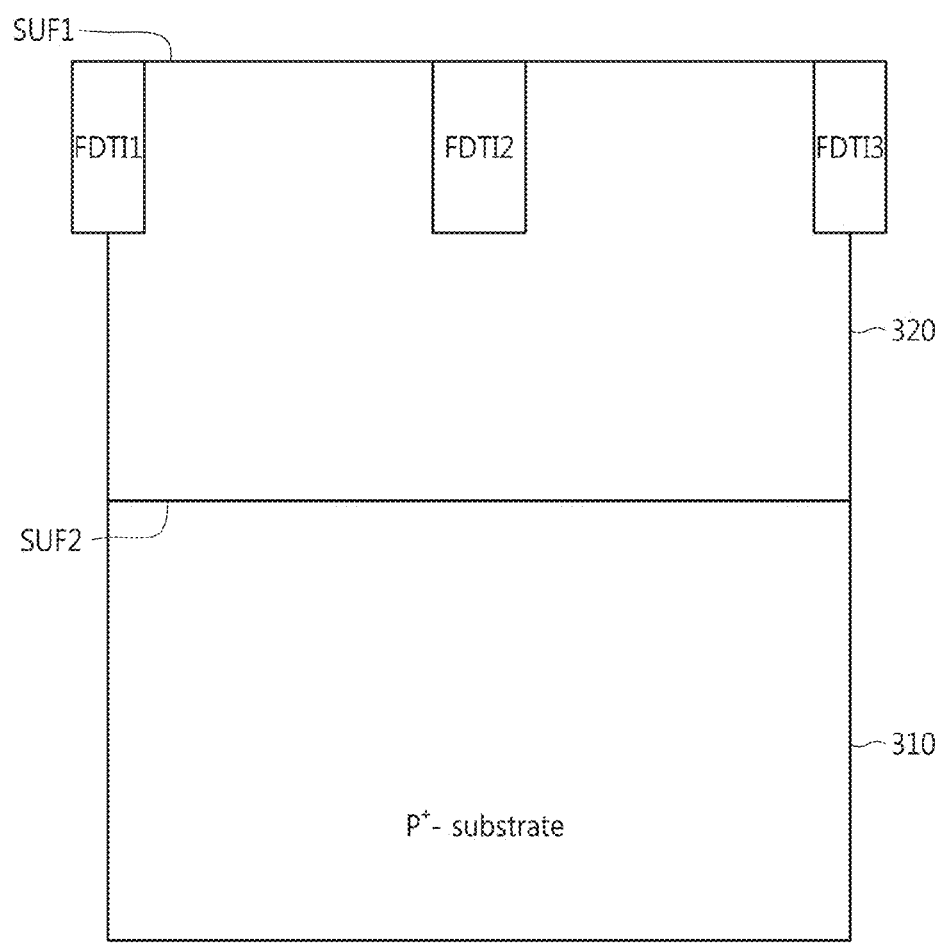
FIGS. 3A 3B, 3C, 3D, 3E, 3F, 3G, 3H, 3I, 3J, 3K and 3L are cross-sectional views of pixel of an image sensor in each of stages during the course of its manufacture, and together illustrate still another method of manufacturing pixels according to the inventive concept.

Referring first to FIG. 3A, a p– epitaxial layer 320 is formed on a p+ silicon substrate 310. A plurality of third isolation regions FDTI1, FDTI2, and FDTI3 may be formed by ion implantation process to vertically extend from the first surface SUF1. The third isolation regions FDTI1, FDTI2, and FDTI3 may be FDTI regions.

Figure 3B:
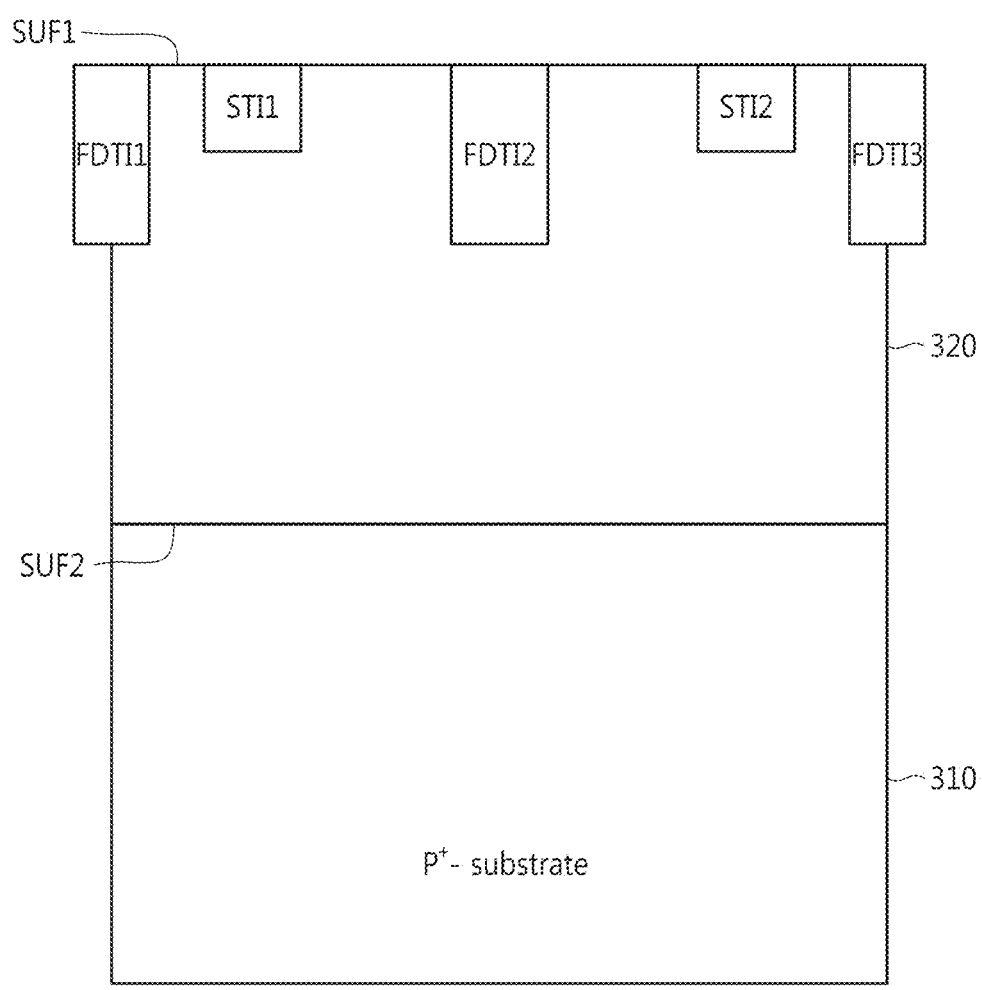

Referring to FIG. 3B, a plurality of the first isolation regions STI1 and STI2 may be formed to extend vertically from the first surface SUF1. The first isolation regions STI1 and STI2 may be formed by etching process. According to some embodiments, the DTI regions FDTI1, FDTI2, and FDTI3 and the STI regions STI1 and STI2 may be formed simultaneously. Alternatively, the STI regions STI1 and STI2 may be formed prior to the DTI regions FDTI1, FDTI2, and FDTI3.

Figure 3C:
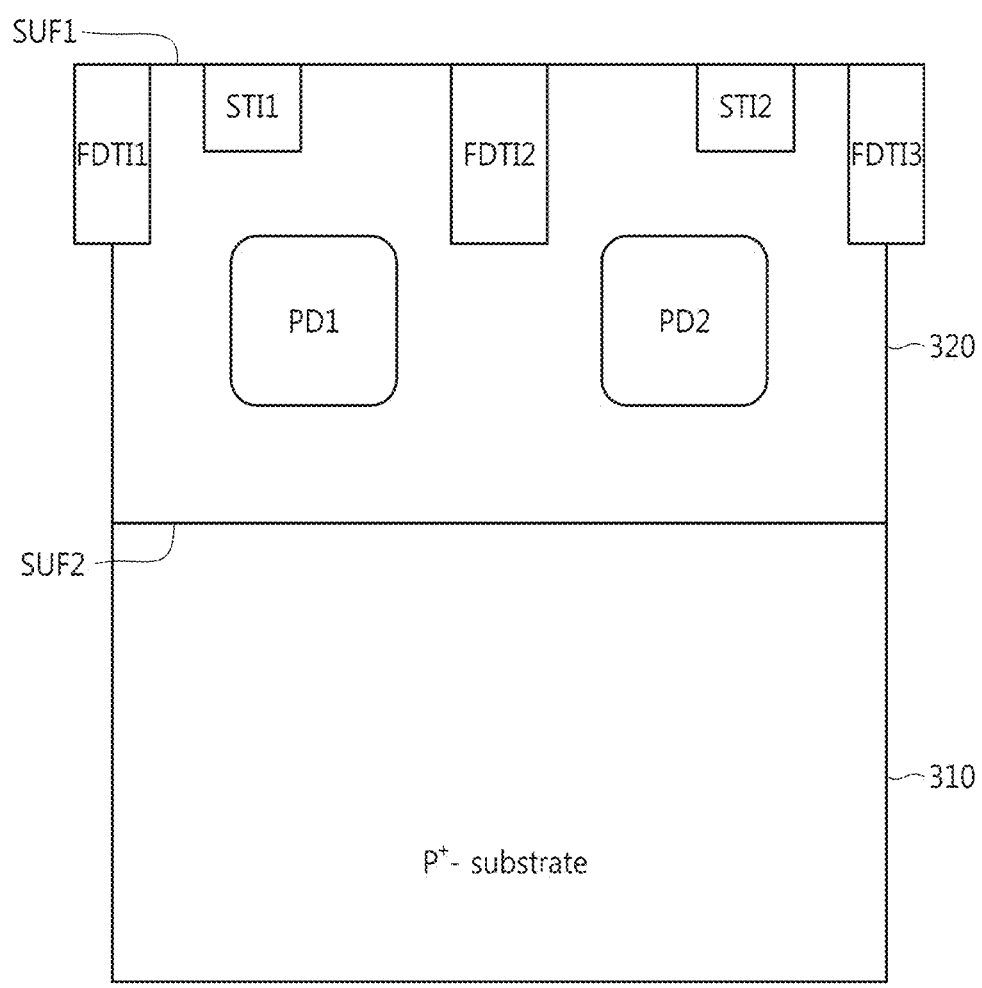

Referring to FIG. 3C, the photoelectric conversion regions PD1 and PD2 may be formed between the first surface SUF1 and the second surface SUF2 by ion implantation.

Figure 3D:
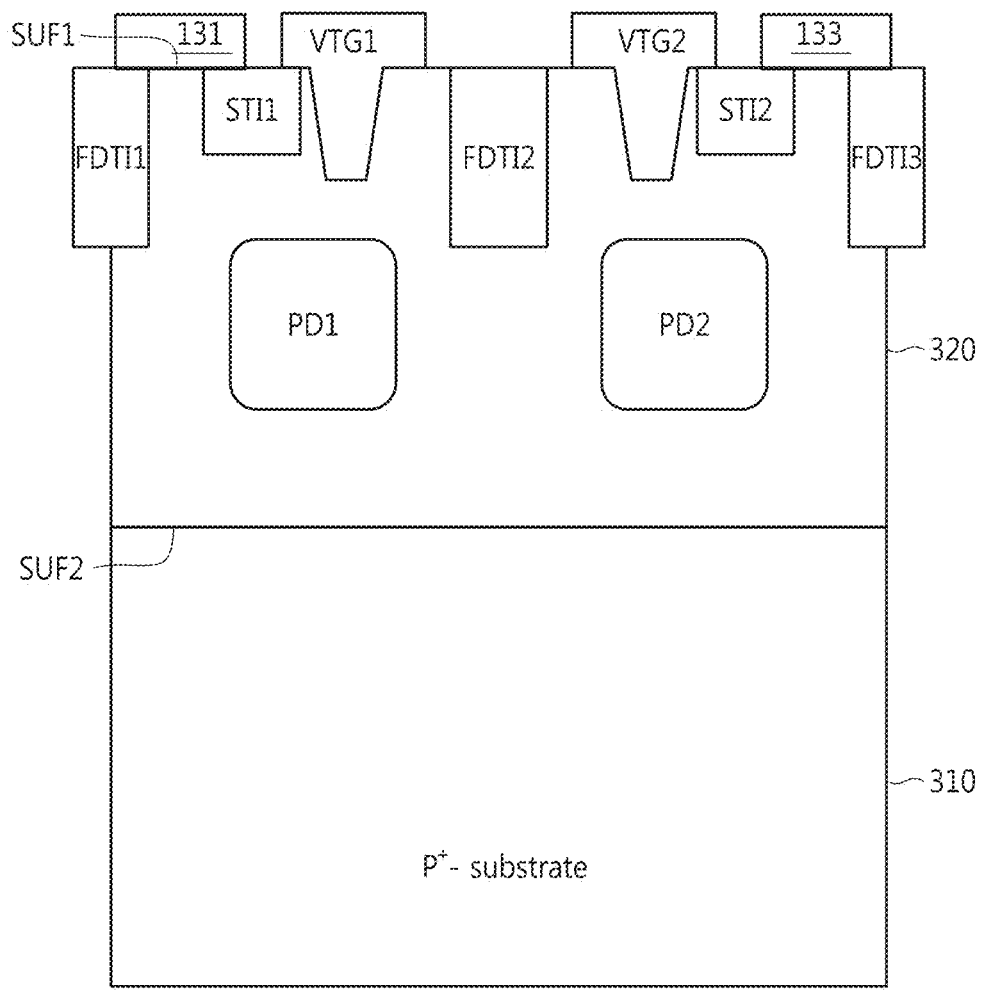

Referring to FIG. 3D, a plurality of openings may be formed to a predetermined depth from the first surface SUF1 of the p– epitaxial layer 320. The depth and/or shape of the openings may be designed for in consideration of the desired the depth and/or shape of subsequently formed transfer gates VTG1 and VTG2. After the openings are formed, an insulation layer may be formed on the first surface SUF1 to a predetermined thickness.

The transfer gates VTG1 and VTG2 may be formed in the openings, respectively. For example, the transfer gates VTG1 and VTG2 may vertically extend (or be formed to extend vertically) toward the photoelectric conversion regions PD1 and PD2, respectively, from the first surface SUF1. The transfer gates VTG1 and VTG2 may be formed simultaneously with other gates 131 and 133.

Figure 3E:
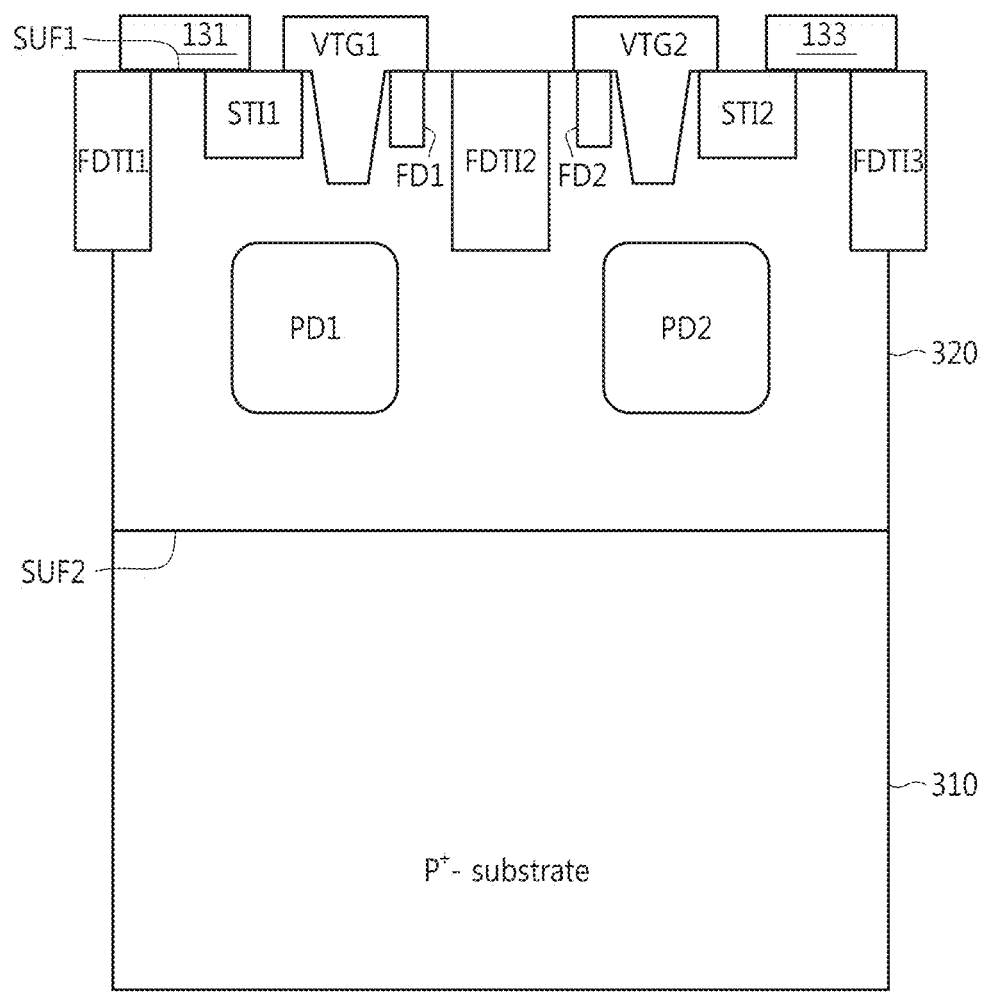

Referring to FIG. 3E, the floating diffusion regions FD1 and FD2 may be formed to a predetermined depth from the first surface SUF1 of the p– epitaxial layer 320.

Figure 3F:
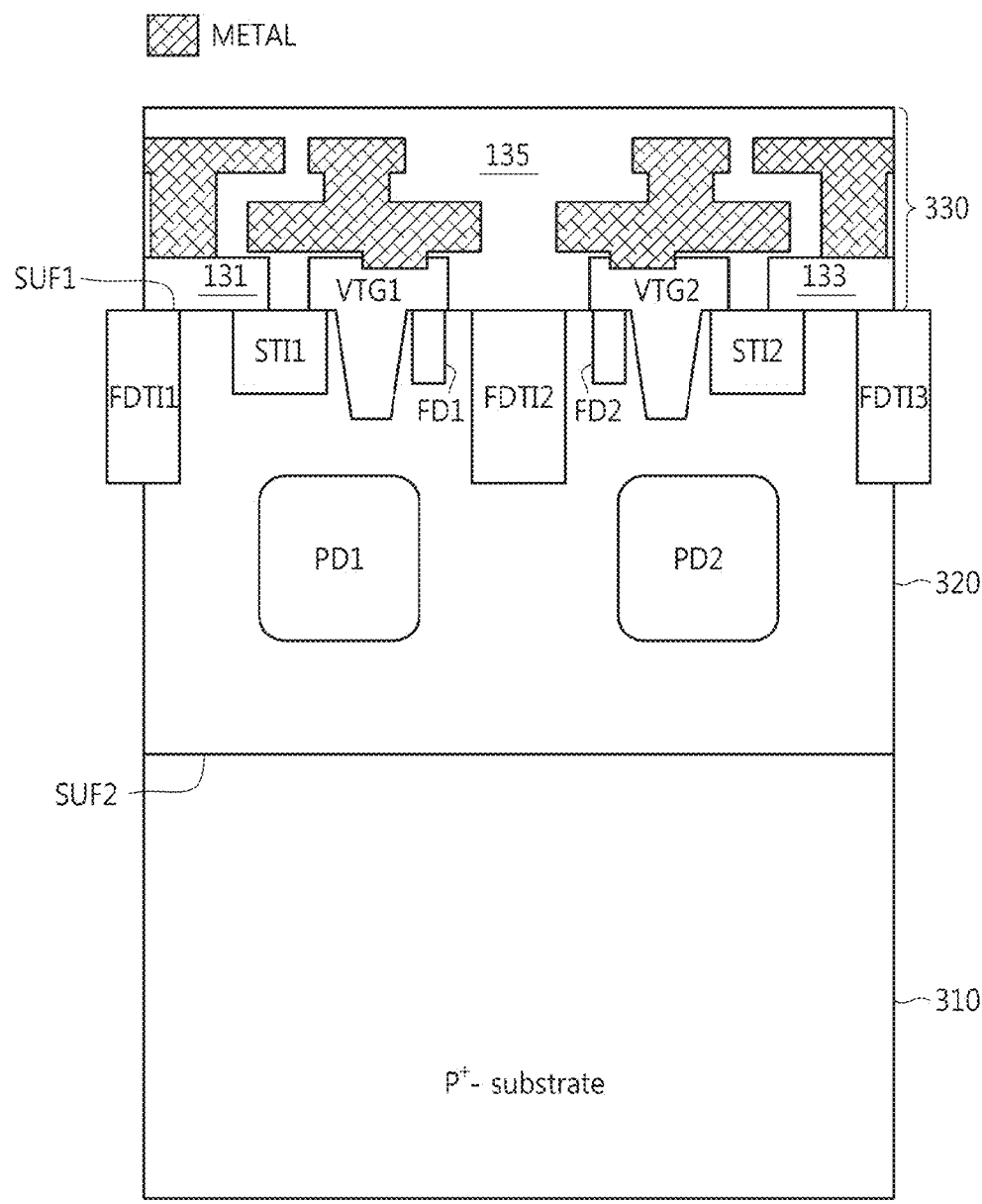

Referring to FIG. 3F, a metal wiring region 330 is formed on the p– epitaxial layer 320.

Figure 3G:
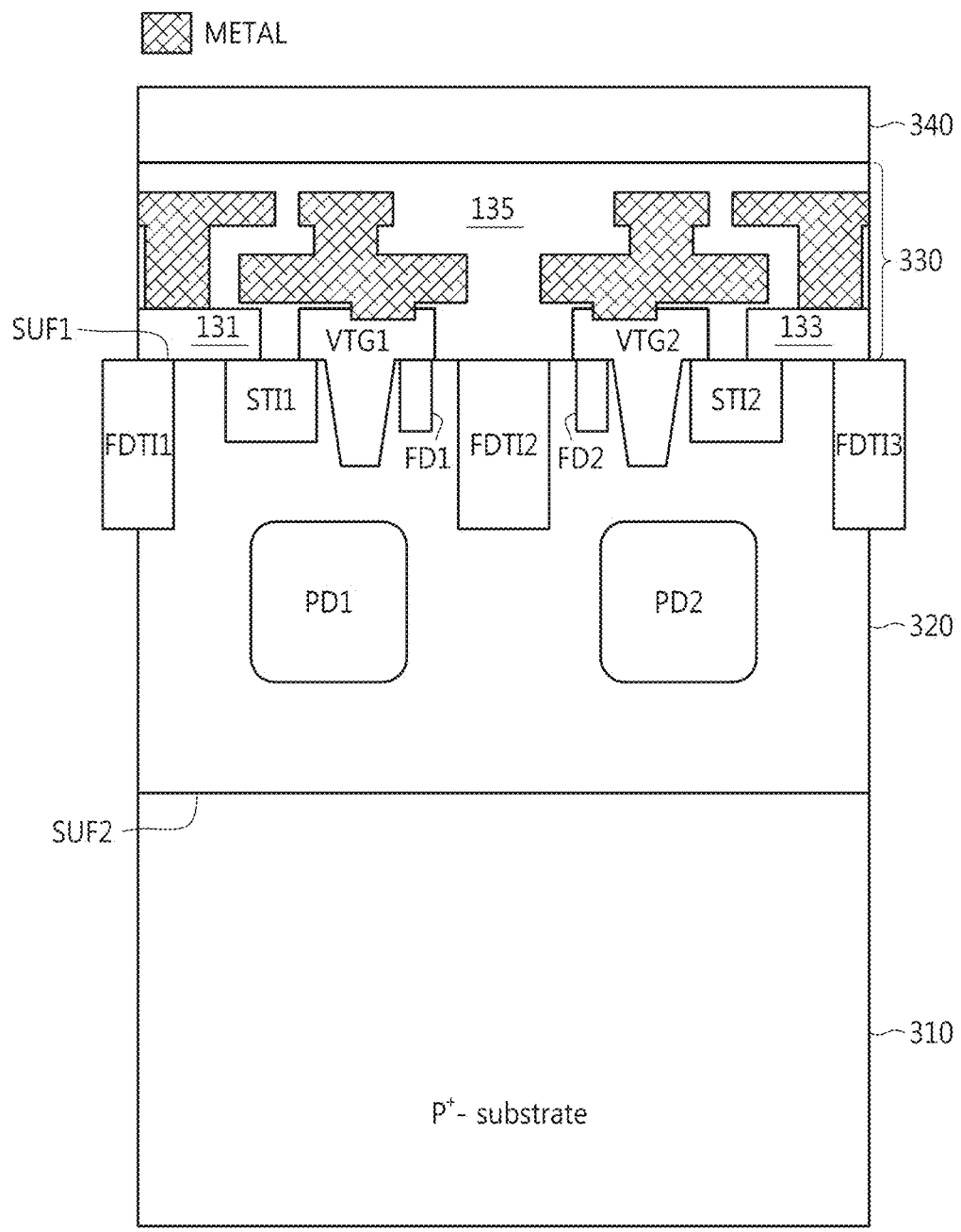
Figure 3H:
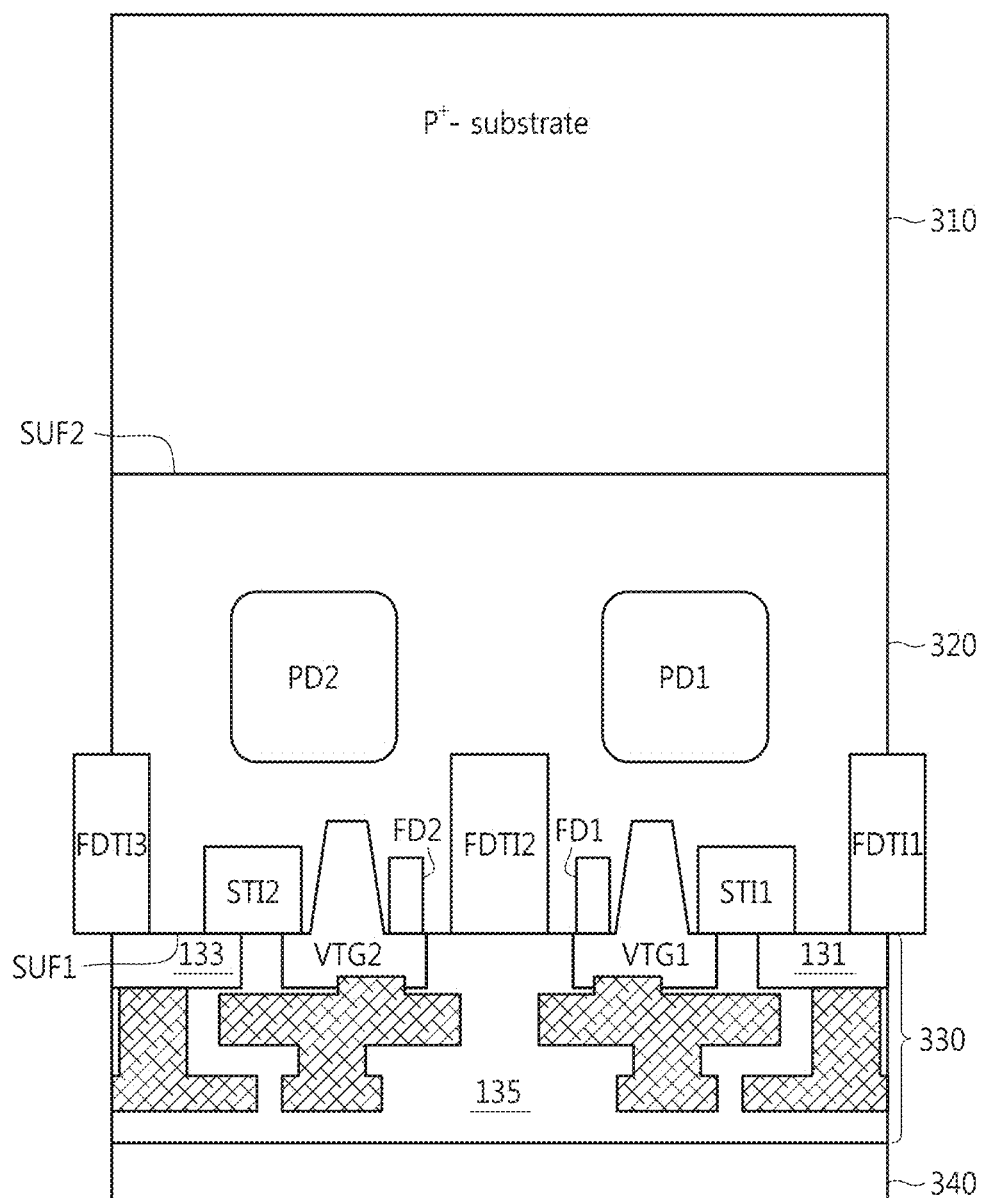

Referring to FIG. 3G, a sustaining wafer 340 is bonded to the metal wiring region 330. The sustaining wafer 340 may be used to sustain (or support) the p– epitaxial layer 320. The structure illustrated in FIG. 3G may be inverted in preparation for further processing, as illustrated in FIG. 3H.

Figure 3I:
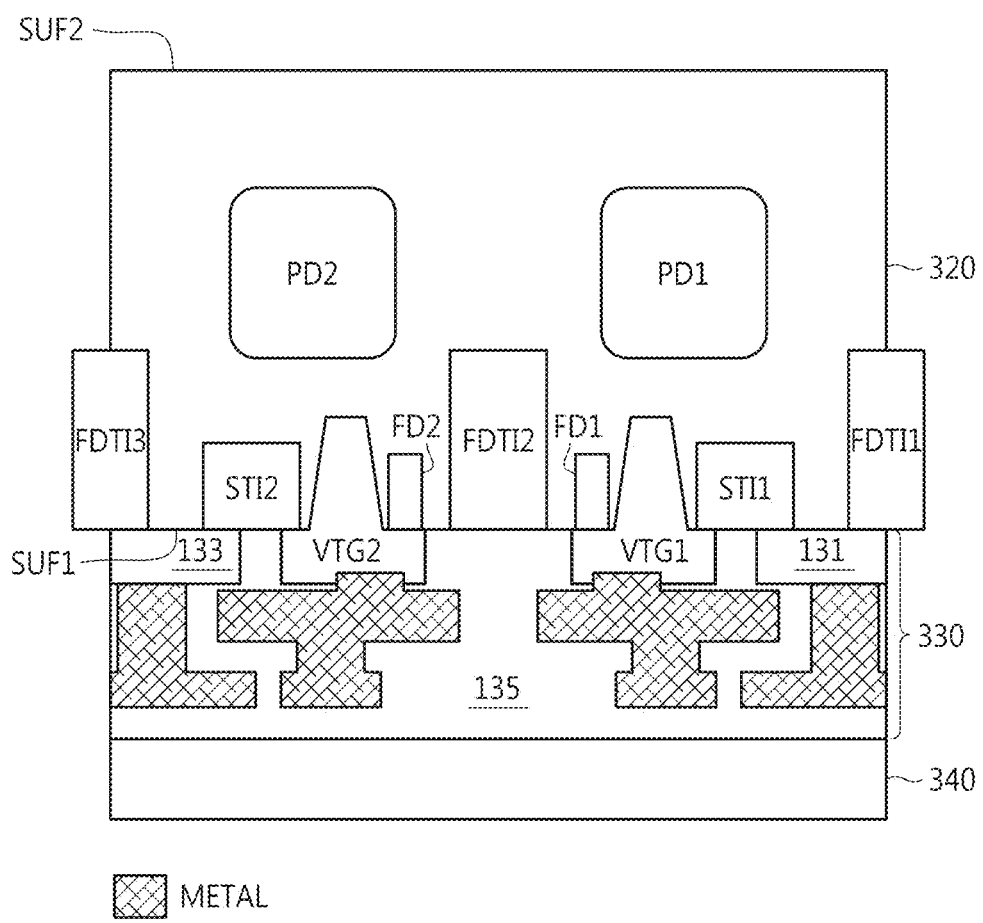

Referring to FIG. 3I, the p+ silicon substrate 310 is removed.

Figure 3J:
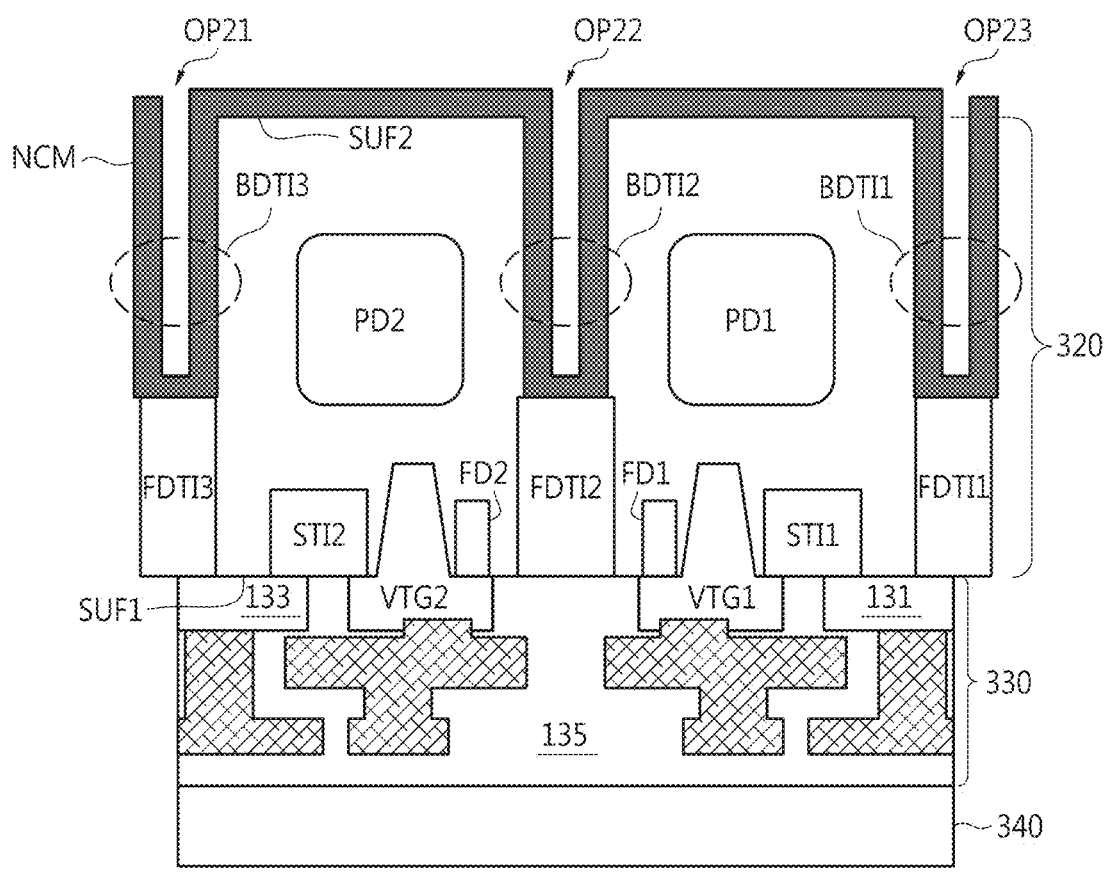
Figure 3K:
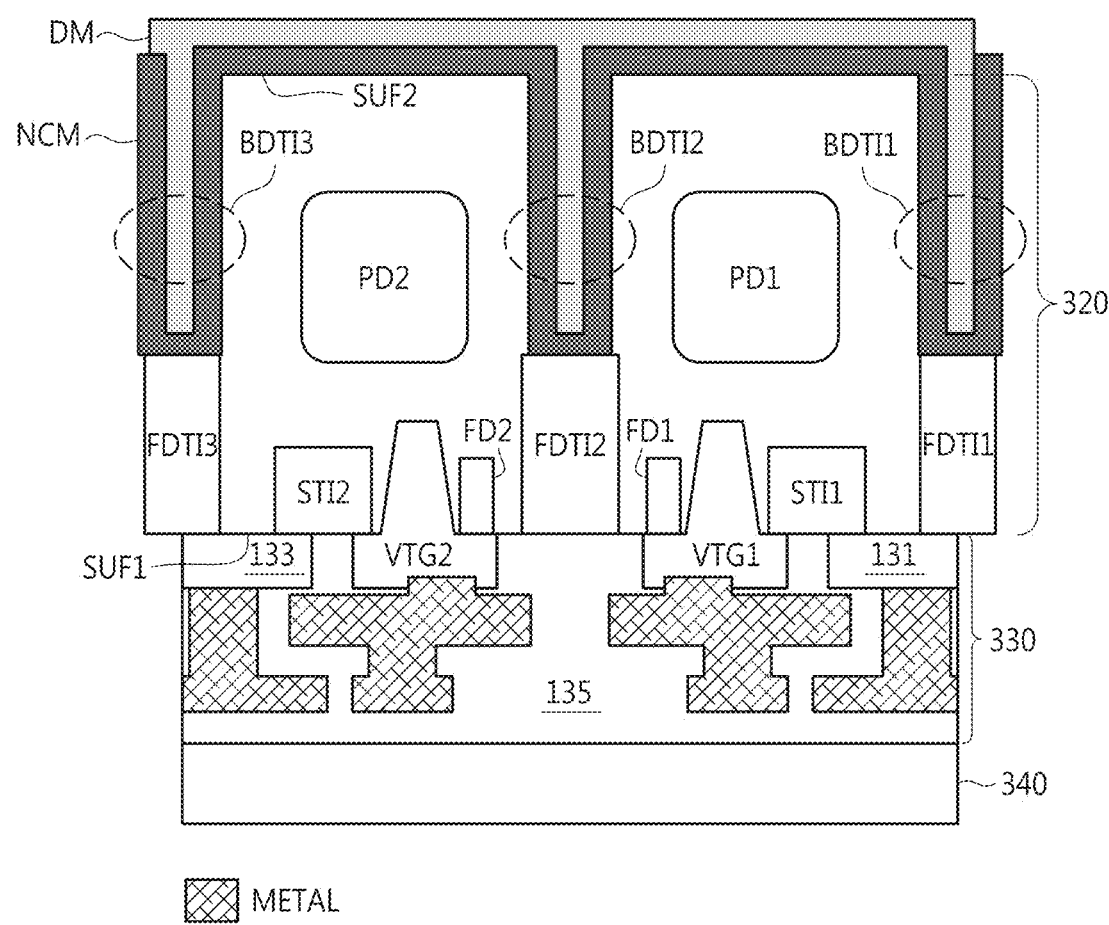

Referring to FIGS. 3J and 3K, second isolation regions, i.e., the trench-type isolation regions BDTI1, BDTI2, and BDTI3, are formed.

First, portions of the p– epitaxial layer 320 are vertically etched from the second surface SUF2 of the p– epitaxial layer 320 to form trenches OP1, OP2, and OP3 respectively corresponding to the trench-type isolation regions BDTI1, BDTI2, and BDTI3. At this time, the trenches OP1, OP2, and OP3 extend to (or are formed until they open at) the FDTIs FDTI1, FDTI2, and FDTI3, respectively.

The second surface SUF2 and trenches OP21, OP22, and OP23 are coated with negative charge material NCM. For example, the negative charge material NCM may be deposited on the second surface SUF2 and on the trenches OP21, OP22, and OP23 to coat the second surface SUF2 and the trenches OP21, OP22, and OP23. For example, the negative charge material NCM may be formed to a predetermined thickness on the second surface SUF2 and the trenches OP21, OP22, and OP23. In addition to, the dielectric material DM may be formed on the negative charge material NCM. The gaps or spaces of the trenches OP21, OP22, and OP23 coated with the negative charge material NCM are filled with the dielectric material DM. Alternatively, referring to FIGS. 3J and 3M, trenches OP21, OP22, and OP23 of a pixel unit 10C-1 are filled with a negative charge material NCM and second surface SUF2 is coated with negative charge material NCM. The trench-type isolation regions BDTI1, BDTI2, and BDTI3 may be parts of a contiguous layer of BDTI. Accordingly, the plurality of FDTIs FDTI1, STI2, and STI2 may extend vertically from the first surface SUF1 towards and have the same pattern as the plurality of trench-type isolation regions BDTI1, BDTI2, and BDTI3. Thus, the backside deep trench-type isolation and the front side deep trench isolation are vertically aligned. And, in this embodiment, the negative charge material NCM of the BDTI contacts the front side isolation (FDTIs regions FDTI1, FDTI2, and FDTI3).

Figure 3L:
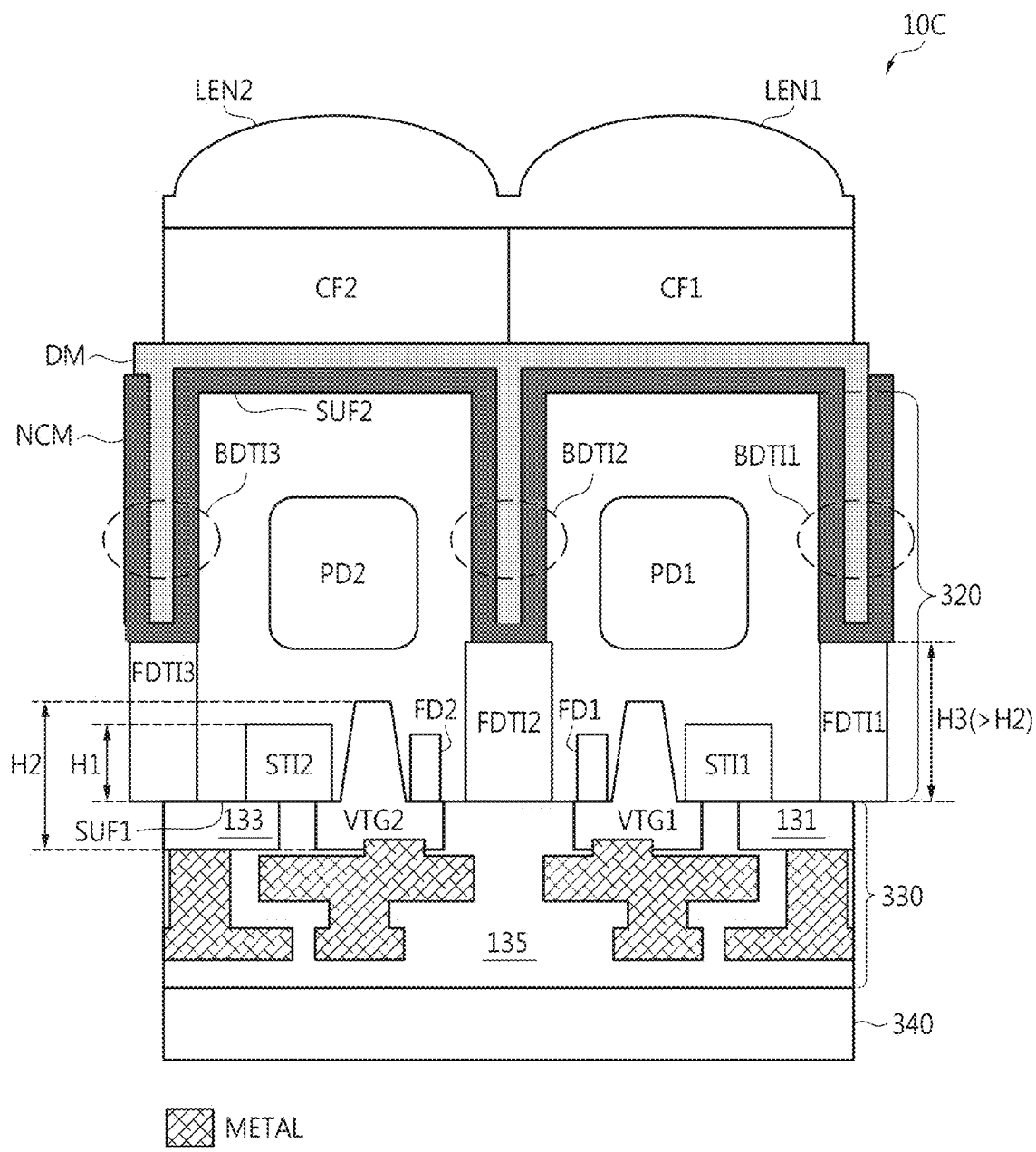
Figure 3M:
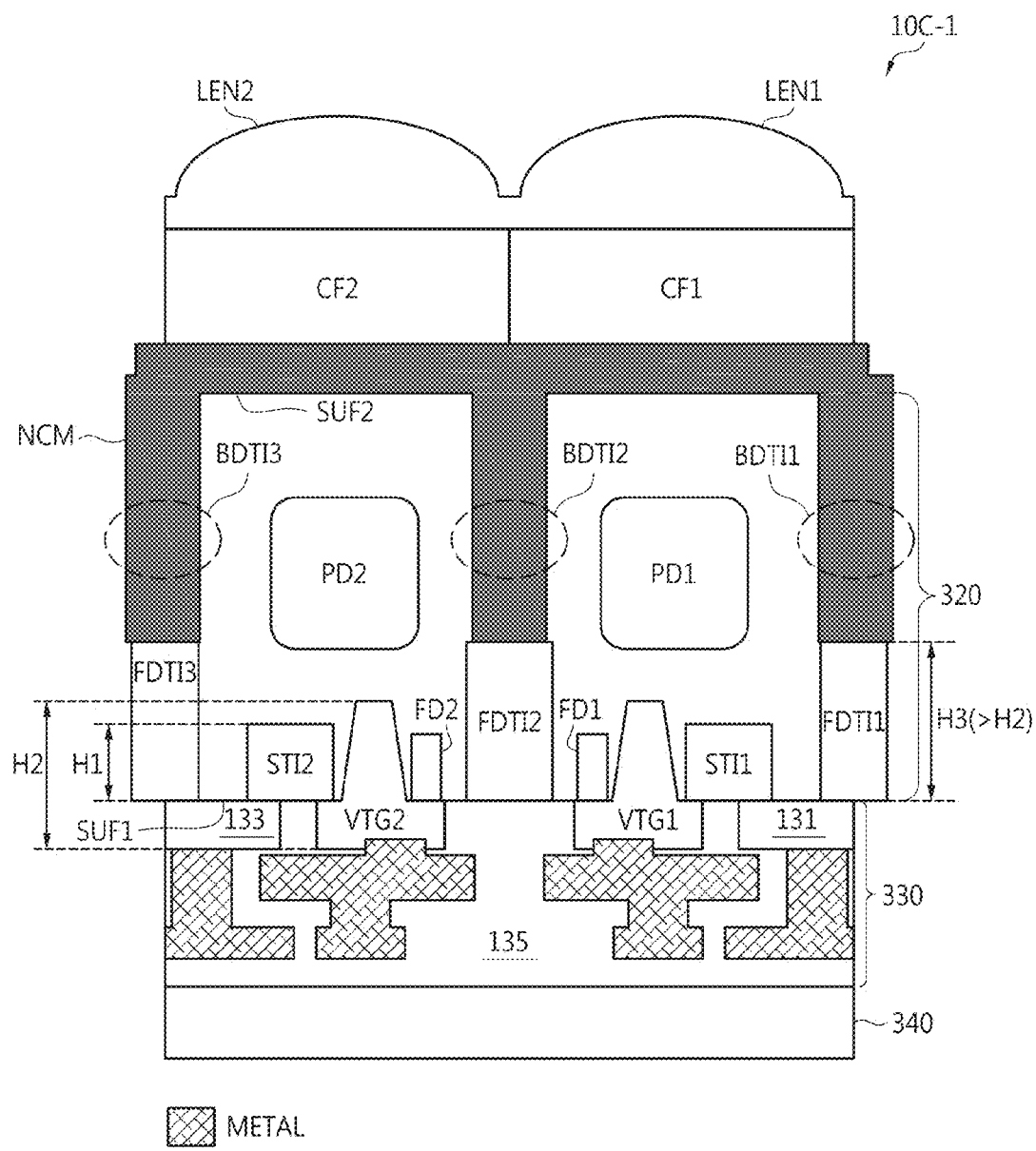
FIG. 3M is a cross-sectional view of pixels according to the inventive concept.

Referring to FIG. 3L, color filters CF1 and CF2 may be formed on the dielectric material DM. Referring to FIG. 3M, color filters CF1 and CF2 may be formed on the negative charge material NCM. Microlenses LEN1 and LEN2 may be formed on the color filters CF1 and CF2, respectively. In other embodiments a planarization layer, such as an overcoating layer may be formed on the color filters CF1 and CF2 so that the insulating layer is interposed between the microlenses LEN1 and LEN2 and the color filters CF1 and CF2 in the final device. For example, a height H1 of STI region STI1 or STI2 is less than a height H2 of a transfer gate VTG1 or VTG2, the height H2 of the transfer gate VTG1 or VTG2 is less than a height H3 of FDTI FDTI1, FDTI2 or FDTI3.

The pixel 10C or 10C-1 illustrated in FIG. 3L or 3M may be manufactured using processes known per se in the art of manufacturing BSI image sensors.

The photoelectric conversion regions PD1 and PD2 generate charges in response to light received through the second surface SUF2.

Two trench-type isolation regions BDTI1 and BDTI2 surround the first photoelectric conversion region PD1 and extend from the second surface SUF2 until they respectively contact the corresponding FDTIs FDTI1 and FDTI2. Two trench-type isolation regions BDTI2 and BDTI3 surround the second photoelectric conversion region PD2 and extend from the second surface SUF2 until they respectively contact the corresponding FDTIs FDTI2 and FDTI3. The floating diffusion regions FD1 and FD2 are positioned below the photoelectric conversion regions PD1 and PD2, respectively, when viewed from the second surface SUF2.

The first transfer gate VTG1 vertically extends toward the first photoelectric conversion region PD1 from the first surface SUF1. It transfers charges from the first photoelectric conversion region PD1 to the first floating diffusion region FD1 in response to a corresponding voltage. The second transfer gate VTG2 vertically extends toward the second photoelectric conversion region PD2 from the first surface SUF1. It transfers charges from the second photoelectric conversion region PD2 to the second floating diffusion region FD2 in response to a corresponding voltage.

Figure 4A:
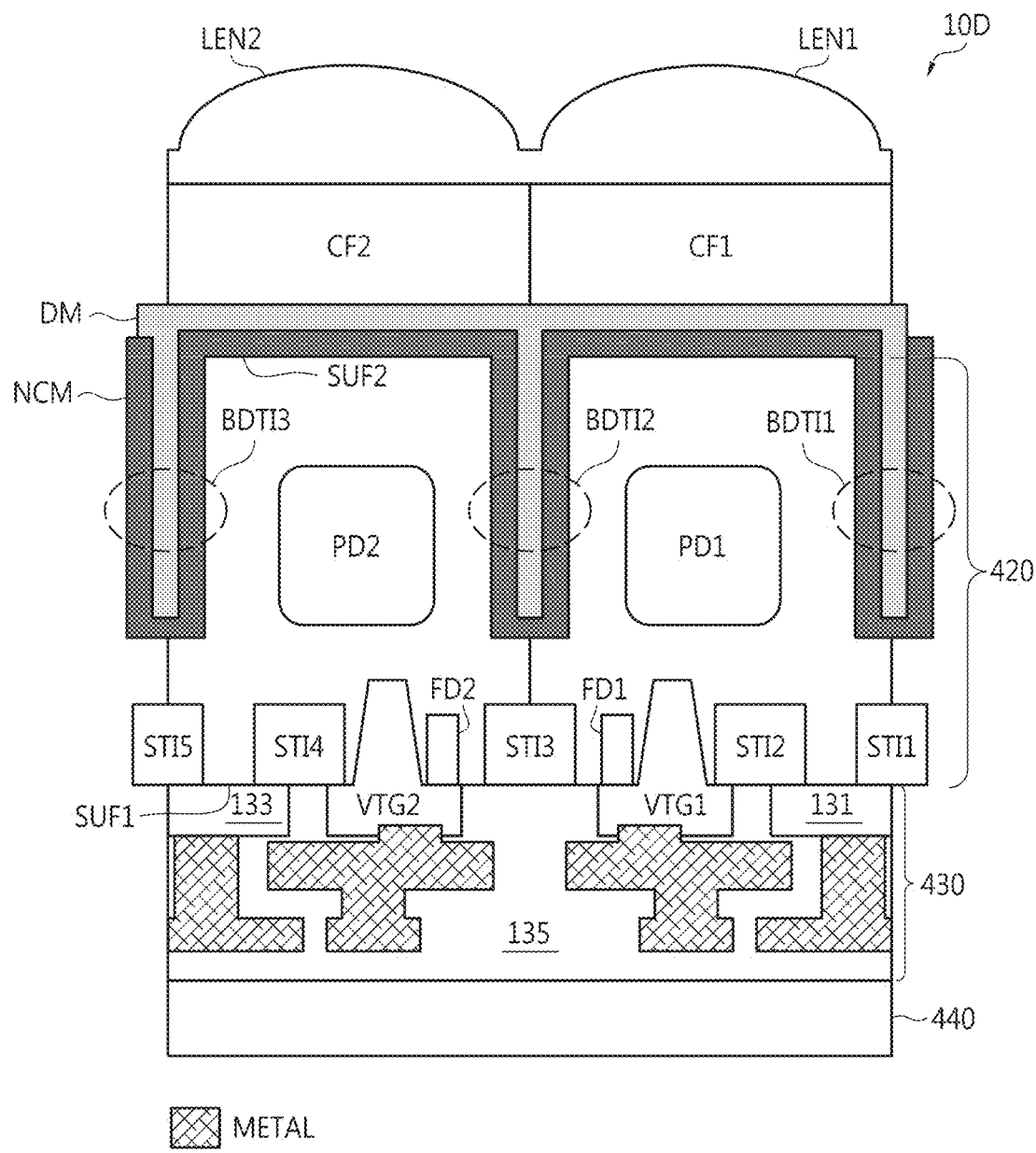
FIGS. 4A and 4B are cross-sectional views of a pixels according to the inventive concept.
Figure 4B:
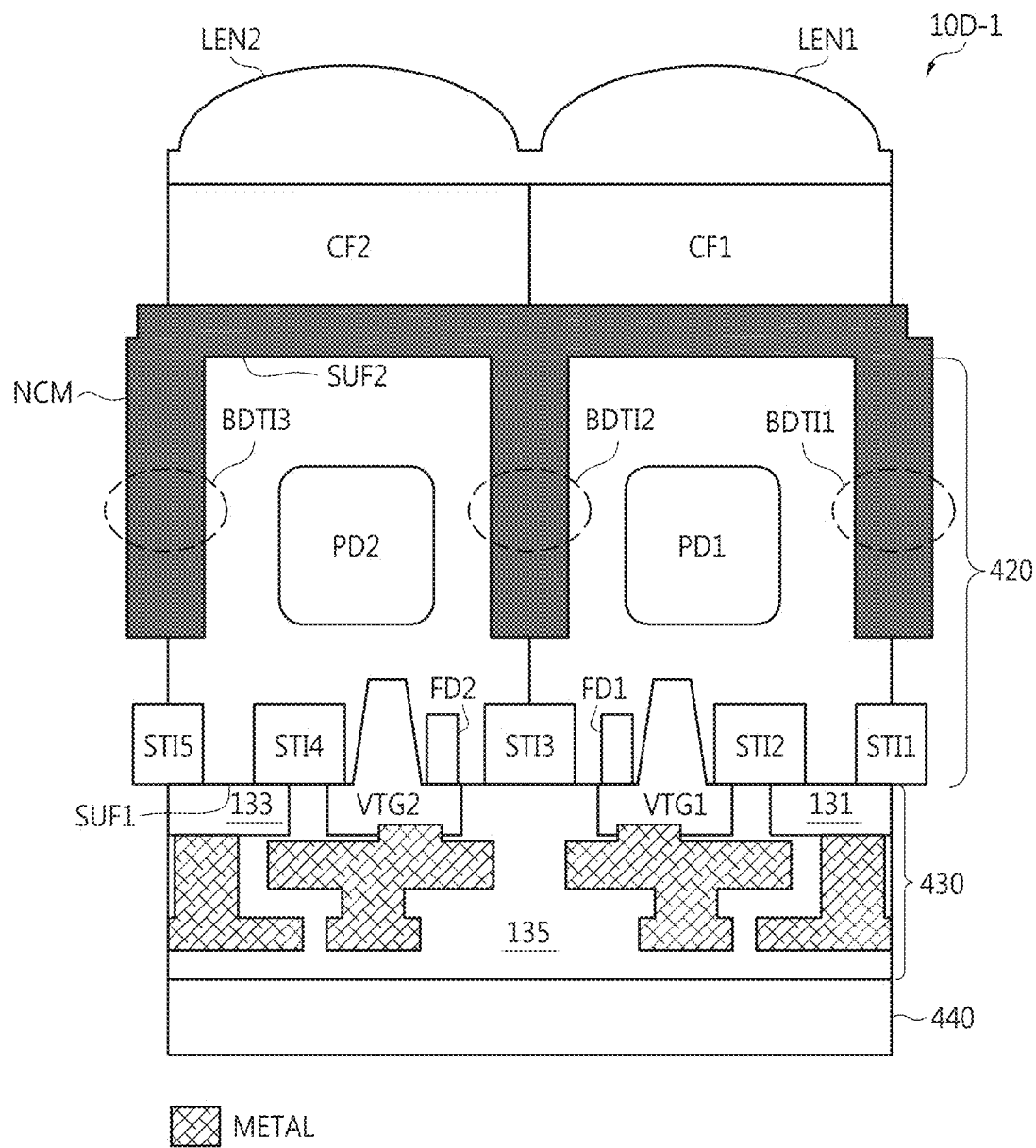

FIG. 4A illustrates a pixel 10D according to the inventive concept, similar to the pixel 10B of FIG. 2L. FIG. 4B illustrates a pixel 10D-1 according to the inventive concept, similar to the pixel 10B-1 of FIG. 2M. In this respect, elements 420, 430, and 440 in the pixel 10D of FIG. 4A are respectively similar to the elements 220, 230, and 240 of the pixel 10B of FIG. 2L. In this respect, elements 420, 430, and 440 in the pixel 10D-1 of FIG. 4B are respectively similar to the elements 220, 230, and 240 of the pixel 10B-1 of FIG. 2M. However, in the pixel 10D or 10D-1, the STI region STH vertically extending from the first surface SUF1 does not contact the BDTI region BDTI1 vertically extending from the second surface SUF2. The STI region STI3 vertically extending from the first surface SUF1 does not contact the BDTI region BDTI2 vertically extending from the second surface SUF2. The STI region STI5 vertically extending from the first surface SUF1 does not contact the BDTI region BDTI3 vertically extending from the second surface SUF2.

In other words, the plurality of STIs STI1, STI3, and STI5 may extend vertically from the first surface SUF1 towards and have the same pattern as the plurality of trench-type isolation regions BDTI1, BDTI2, and BDTI3. Thus, the backside deep trench-type isolation and the shallow trench isolation are vertically aligned. And, in this embodiment, the negative charge material NCM of the BDTI is vertically spaced from the shallow trench isolation (STIs regions STI1, STI3, and STI5).

Figure 5A:
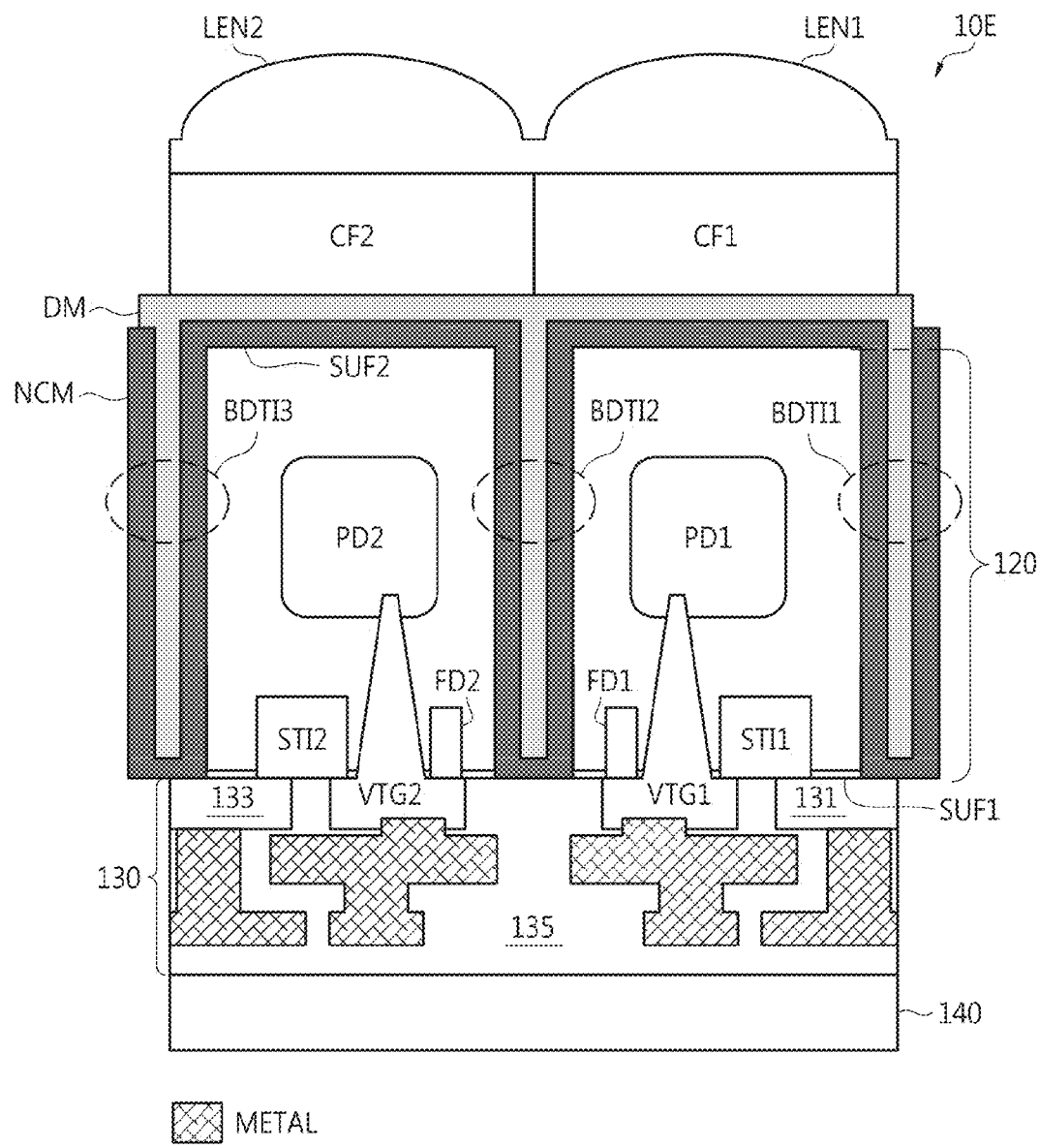
FIGS. 5A and 5B are cross-sectional views of another pixels according to the inventive concept.
Figure 5B:
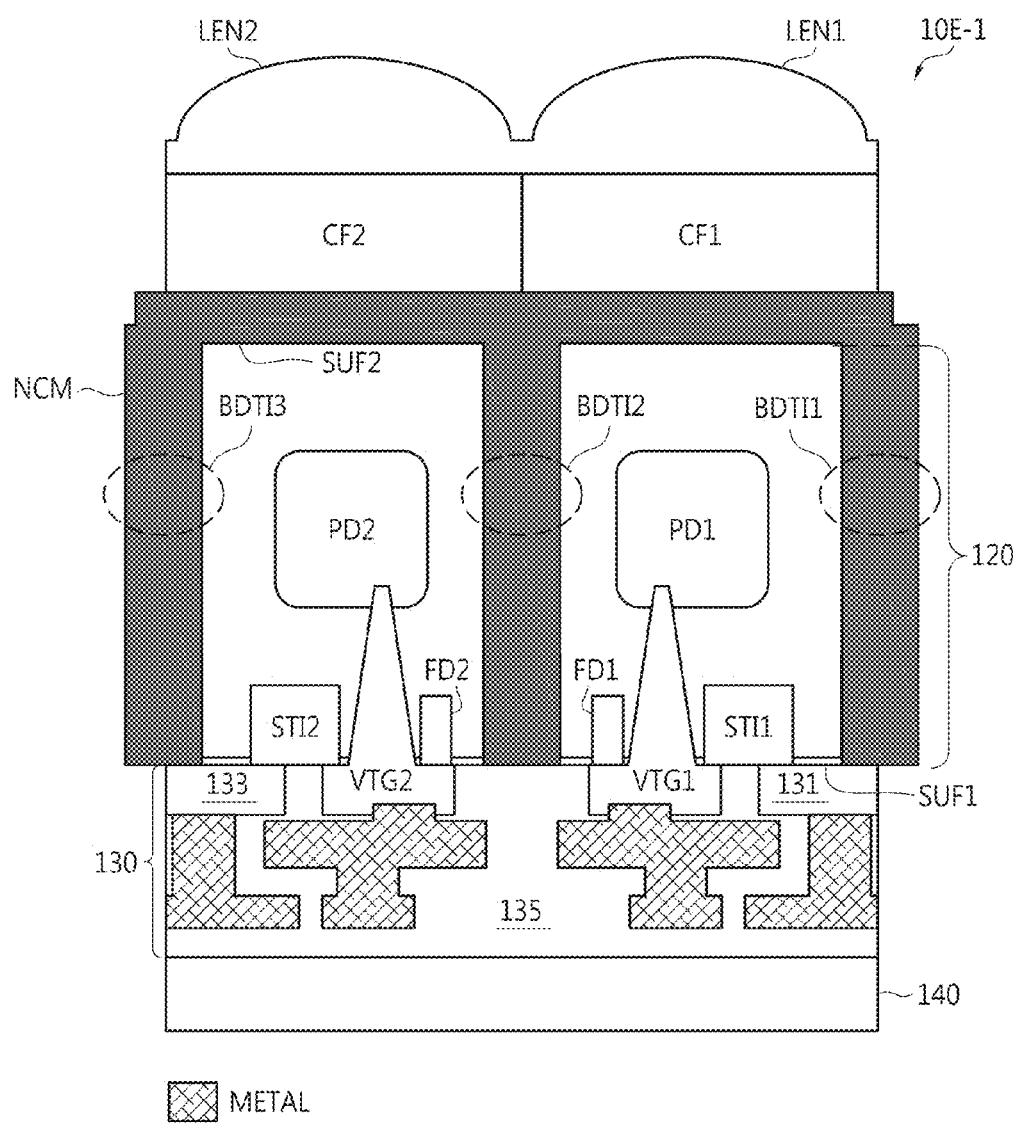

FIG. 5A or 5B illustrates a pixel 10E or 10E-1 according to the inventive concept. The pixel 10E (and its method of manufacture) is similar to the pixel 10A of FIG. 1N (and its method of manufacture), with the exception that the transfer gates VTG1 and VTG2 of pixel 10E extend (are formed to extend) vertically from the first surface SUF1 into the photoelectric conversion regions PD1 and PD2, respectively. The pixel 10E-1 (and its method of manufacture) is similar to the pixel 10A-1 of FIG. 1O (and its method of manufacture), with the exception that the transfer gates VTG1 and VTG2 of pixel 10E-1 extend (are formed to extend) vertically from the first surface SUF1 into the photoelectric conversion regions PD1 and PD2, respectively.

Figure 6A:
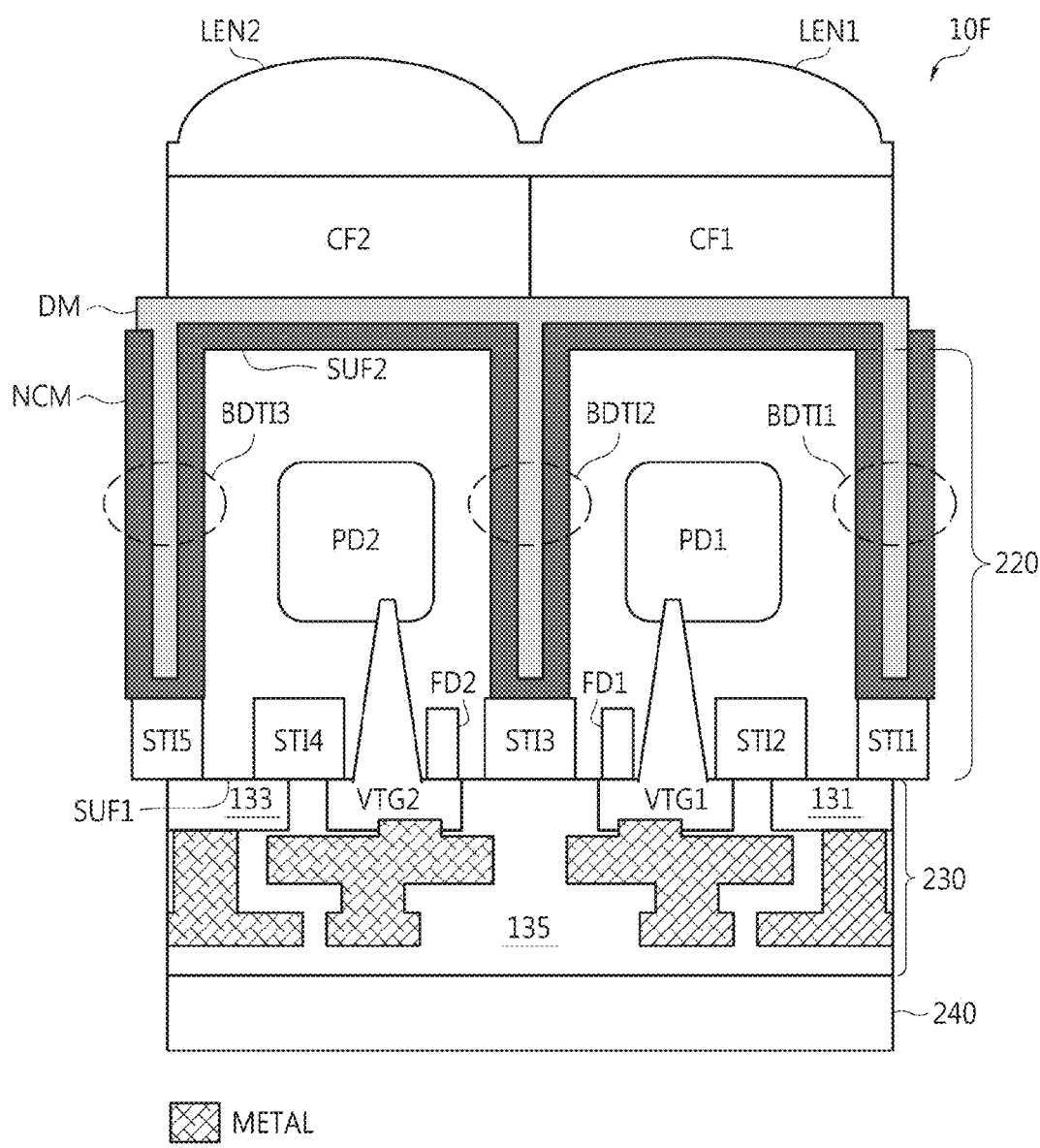
FIGS. 6A and 6B are cross-sectional views of another pixels according to the inventive concept.
Figure 6B:
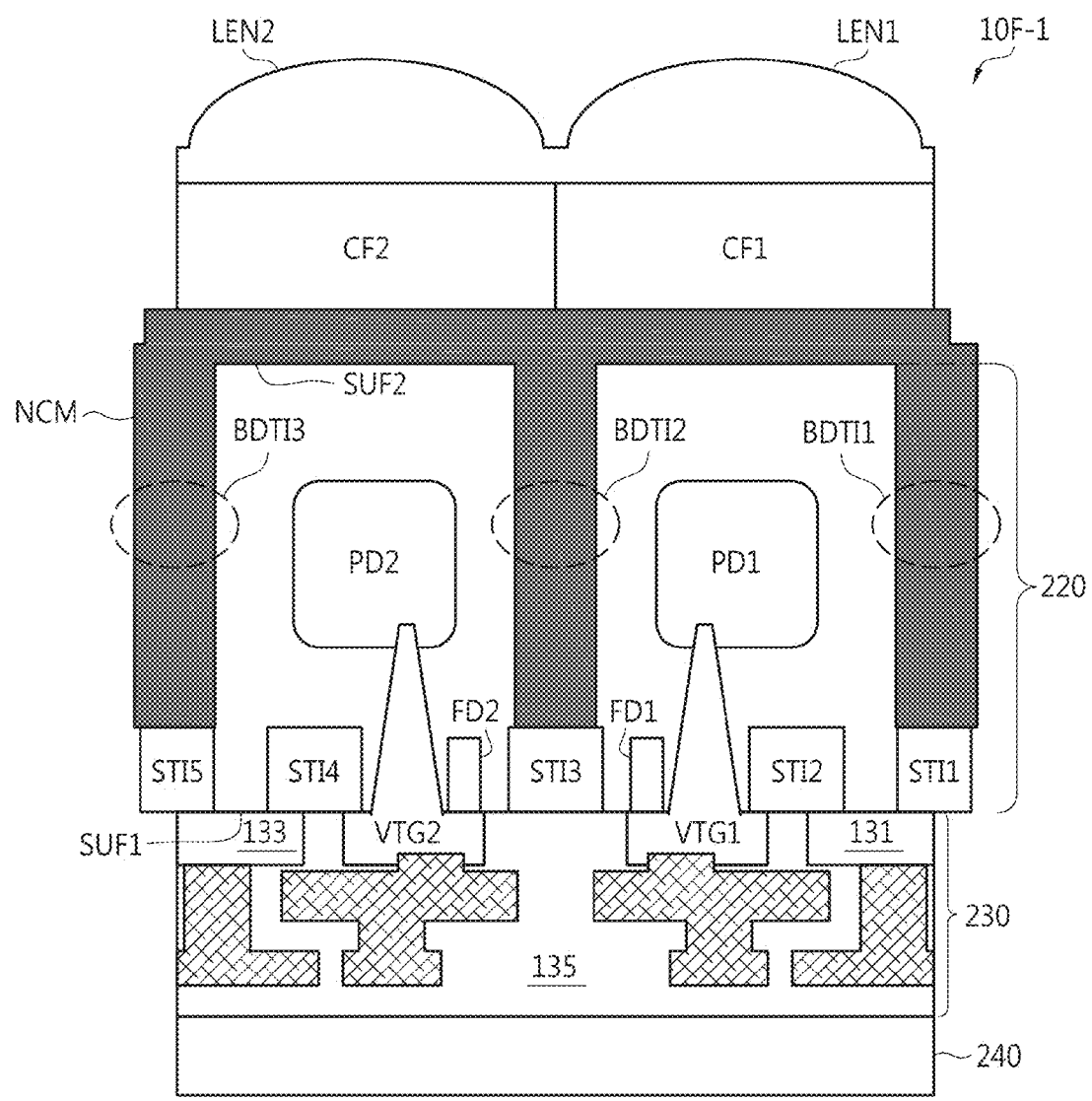
Figure 7A:
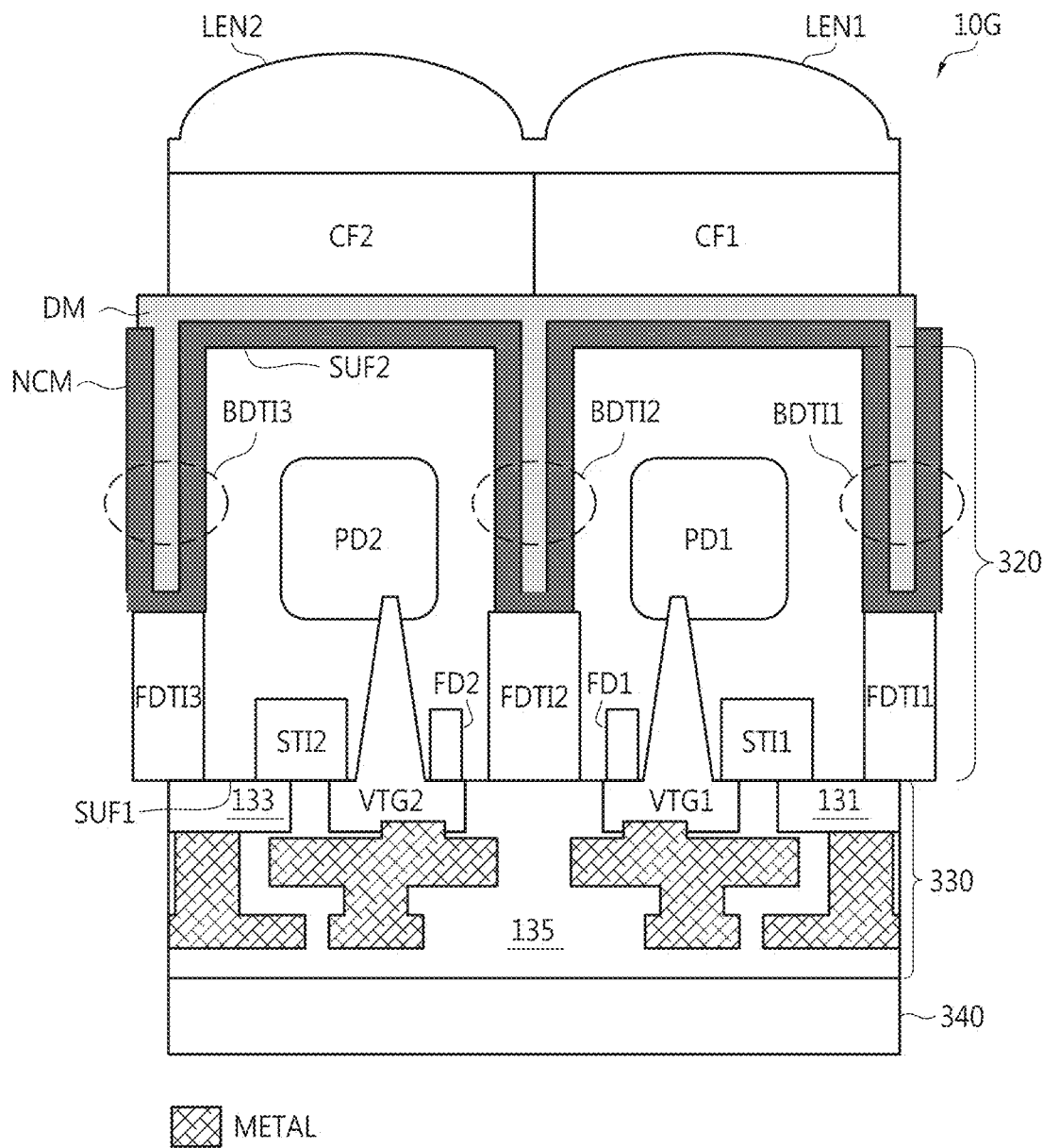
FIGS. 7A and 7B are cross-sectional views of yet another pixels according to the inventive concept.
Figure 7B:
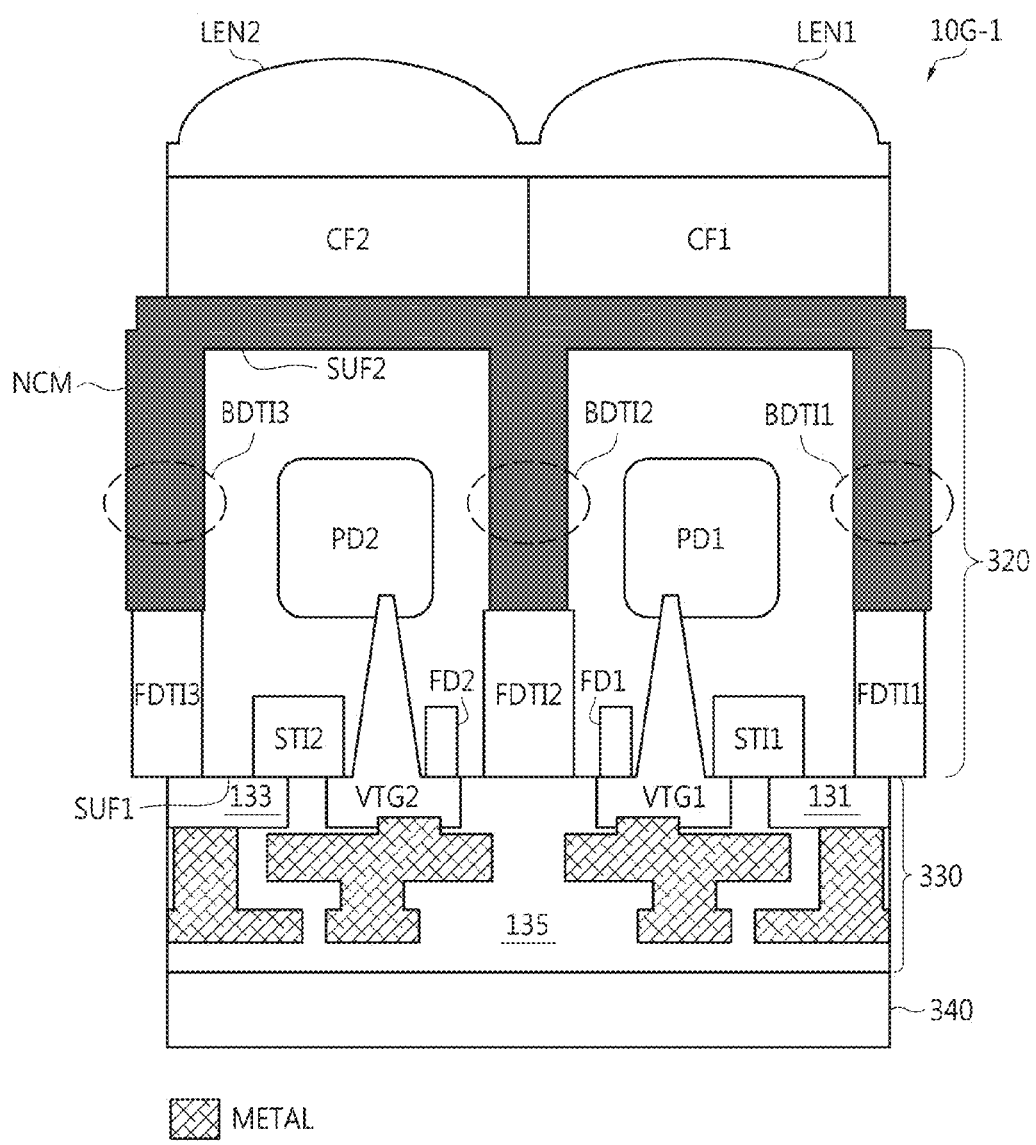

FIG. 6A or 6B illustrates a pixel 10F or 10E-1 according to the inventive concept. The pixel 10F (and its method of manufacture) is similar to the pixel 10B of FIG. 2L (and its method of manufacture), with the exception that the transfer gates VTG1 and VTG2 of pixel 10F extend (are formed to extend) vertically from the first surface SUF1 into the photoelectric conversion regions PD1 and PD2, respectively. The pixel 10E-1 (and its method of manufacture) is similar to the pixel 10B-1 of FIG. 2M (and its method of manufacture), with the exception that the transfer gates VTG1 and VTG2 of pixel 10E-1 extend (are formed to extend) vertically from the first surface SUF1 into the photoelectric conversion regions PD1 and PD2, respectively FIG. 7A or 7B illustrates a pixel 10G or 10G-1 according to the inventive concept. The pixel 10G (and its method of manufacture) is similar to the pixel 10C of FIG. 3L (and its method of manufacture), with the exception that the transfer gates VTG1 and VTG2 of pixel 10G extend (are formed to extend) vertically from the first surface SUF1 into the photoelectric conversion regions PD1 and PD2, respectively. The pixel 10G-1 (and its method of manufacture) is similar to the pixel 10C-1 of FIG. 3M (and its method of manufacture), with the exception that the transfer gates VTG1 and VTG2 of pixel 10G-1 extend (are formed to extend) vertically from the first surface SUF1 into the photoelectric conversion regions PD1 and PD2, respectively.

Figure 8A:
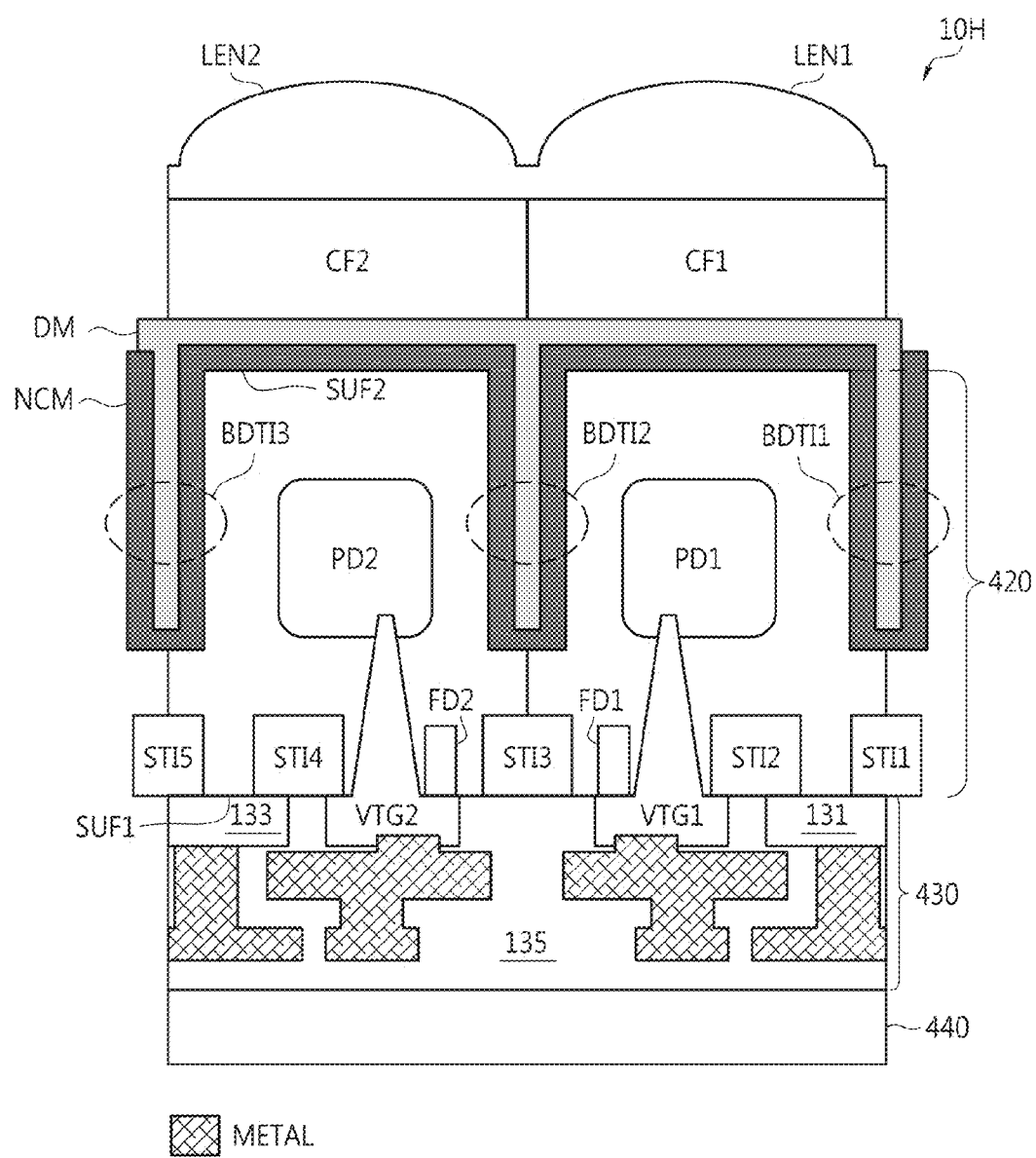
FIGS. 8A and 8B are cross-sectional views of yet another pixels according to the inventive concept.
Figure 8B:
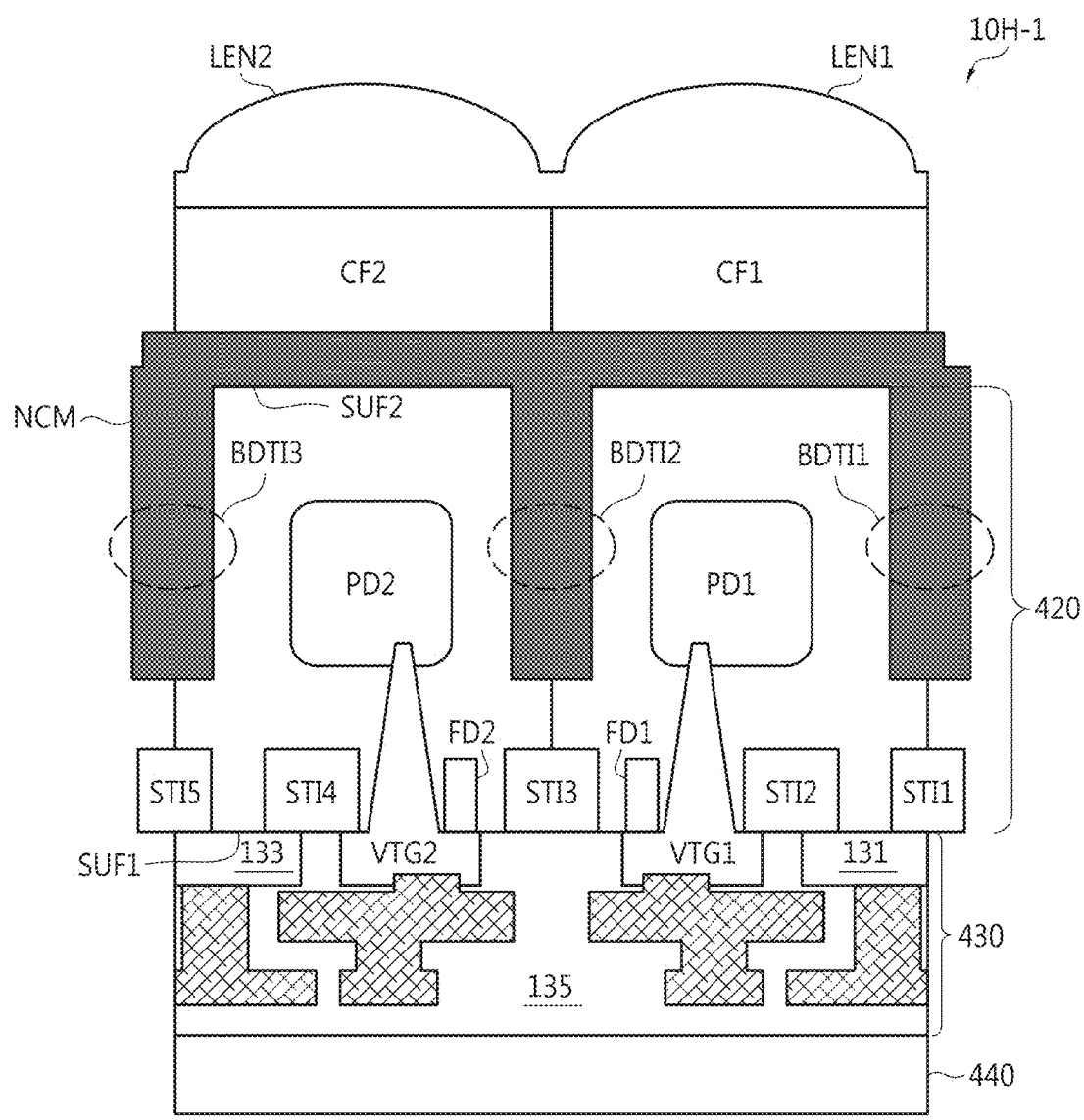

FIG. 8A or 8B illustrates a pixel 10H or 10H-1 according to the inventive concept. The pixel 10H (and its method of manufacture) is similar to the pixel 10D of FIG. 4A (and its method of manufacture), with the exception that the transfer gates VTG1 and VTG2 extend (are formed to extend) vertically from the first surface SUF1 into the photoelectric conversion regions PD1 and PD2, respectively. The pixel 10H-1 (and its method of manufacture) is similar to the pixel 10D-1 of FIG. 4B (and its method of manufacture), with the exception that the transfer gates VTG1 and VTG2 extend (are formed to extend) vertically from the first surface SUF1 into the photoelectric conversion regions PD1 and PD2, respectively.

Figure 9:
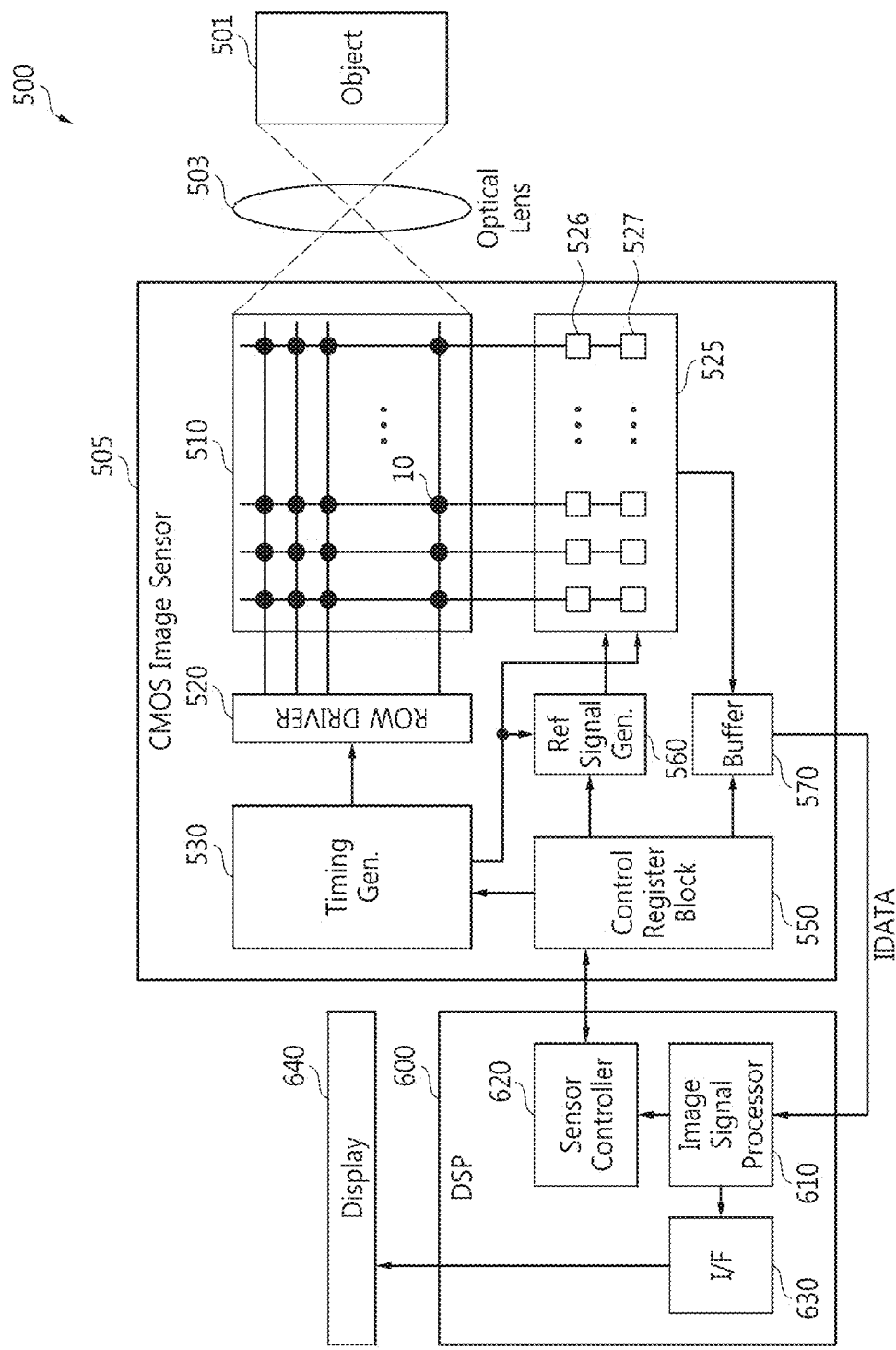
FIG. 9 is a block diagram of an image processing device including a pixel according to the inventive concept.
Figure 10:
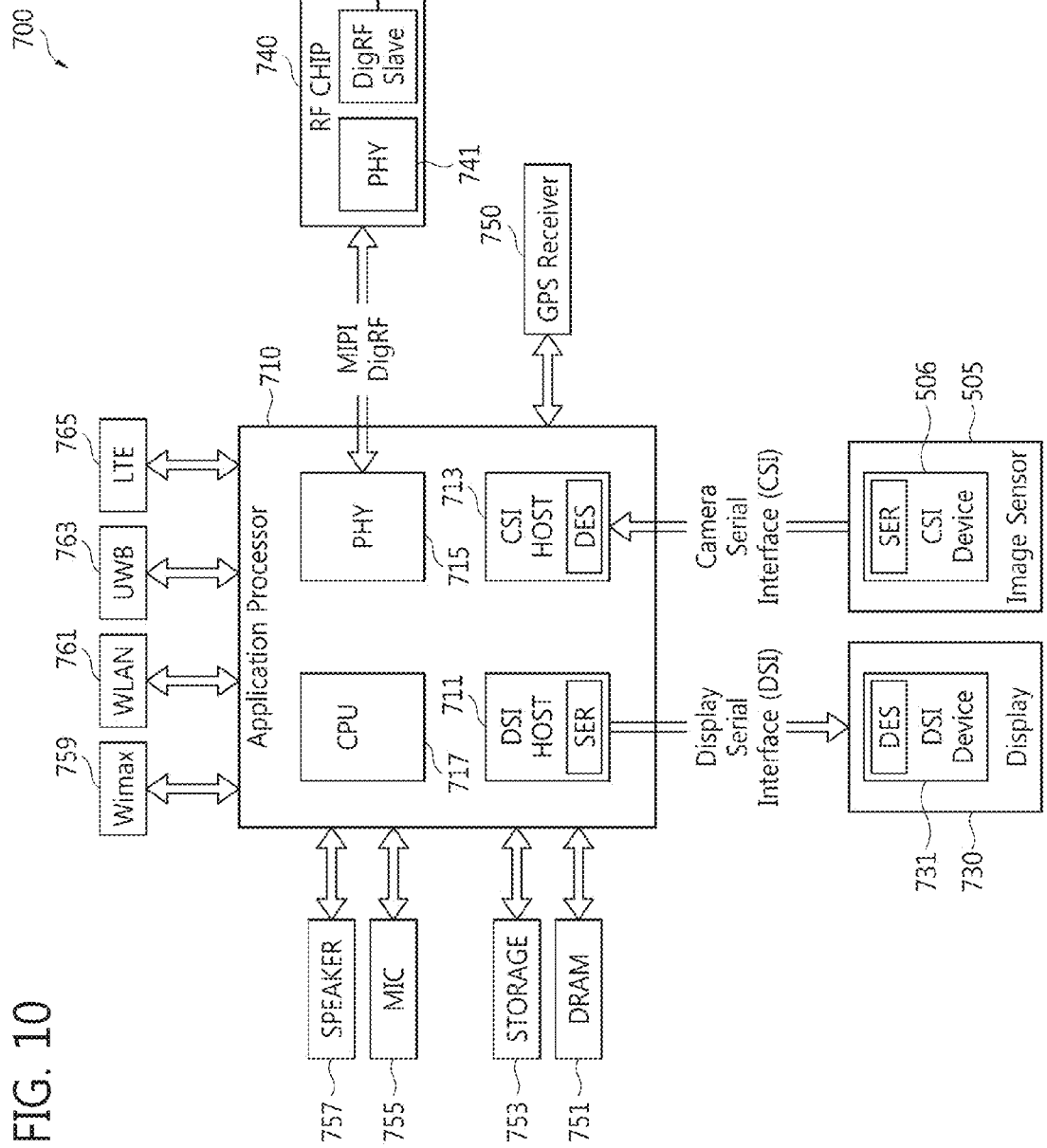

FIG. 9 is a block diagram of an image processing device 500 including a pixel according to the inventive concept. The image processing device 500 may be a digital camera, a camcorder, or a portable electronic device including a complementary metal-oxide-semiconductor (CMOS) image sensor 505. The portable electronic device may be a cellular phone, a smart phone, a tablet personal computer (PC), a mobile internet device (MID), a wearable computer, an internet of things (IoT) device, or an internet of everything (IoE) device. The image processing device 500 includes an optical lens 503, the CMOS image sensor 505, a digital signal processor (DSP) 600, and a display 640.

The CMOS image sensor 505 generates image data IDATA representative of the image of an object captured through the optical lens 503. The CMOS image sensor 505 includes a pixel array 510, a row driver 520, a readout circuit 525, a timing generator 530, a control register block 550, a reference signal generator 560, and a buffer 570. A signal processing circuit may include the readout circuit 525 and the buffer 570.

The pixel array 510 includes a plurality of pixels 10 generating pixel signals in response to incident light. Each of the pixels 10 may be any of the pixels 10A, 10A-1, 10B, 10B-1, 10C, 10C-1, 10D, 10D-1, 10E, 10E-1, 10F, 10E-1, 10G, 10G-1, 10H, and 10H-1. The pixels 10 are arranged in a matrix (rows and columns) Thus, the plurality of pixels 10 of the array may be a plurality of pixels 10A or 10A-1, a plurality of pixels 10B or 10B-1 . . . or a plurality of pixels 10H or 10H-1. In any case, the pixels 10 may transmit output signals to column lines.

The row driver 520 may drive a plurality of control signals for controlling the operation of the pixels 50 to the pixel array 510 according to the control of the timing generator 530. The row driver 520 may control the operation of the pixels 10 in units of rows. The row driver 520 may function as a control signal generator for generating control signals.

The timing generator 530 may control the operations of the row driver 520, the readout circuit 525, and the reference signal generator 560 according to the control of the control register block 550. The readout circuit 525 includes a column analog-to-digital converter 526 and a column memory 527. The analog-to-digital converter 526 may perform correlated double sampling (CDS). The readout circuit 525 outputs a digital image signal corresponding to a pixel signal output from each of the pixels 10 in the pixel array 510.

The control register block 550 controls the operations of the timing generator 530, the reference signal generator 560, and the buffer 570 according to the control of the DSP 600. The buffer 570 transmits image data IDATA, which corresponds to a plurality of digital image signals output from the readout circuit 525, to the DSP 600. The signal processing circuit may process (e.g., performs CDS and analog-to-digital conversion on) a plurality of pixel signals output from the pixel array 510 and may output the image data IDATA corresponding to a result of the processing.

The DSP 600 includes an image signal processor (ISP) 610, a sensor controller 620, and an interface 630. The ISP 610 controls the interface 630 and the sensor controller 6220 which controls the control register block 550.

The CMOS image sensor 505 and the DSP 600 as a whole may be provided in different chips, respectively, in a single package, e.g., a multi-chip package. Alternatively, the ISP 610 may be provided in its own chip apart from the other components of the DSP 600 such that the CMOS image sensor 505 and the ISP 610 are provided in different chips, respectively, in a single package, e.g., a multi-chip package.

The ISP 610 processes the image data IDATA received from the buffer 570 and transmits processed image data to the interface 640. The sensor controller 620 may generate various control signals for controlling the control register block 550 according to the control of the ISP 610. The interface 630 may transmit the processed image data from the ISP 610 to the display 640. The display 640 may display the image data output from the interface 630.

Figure 10:
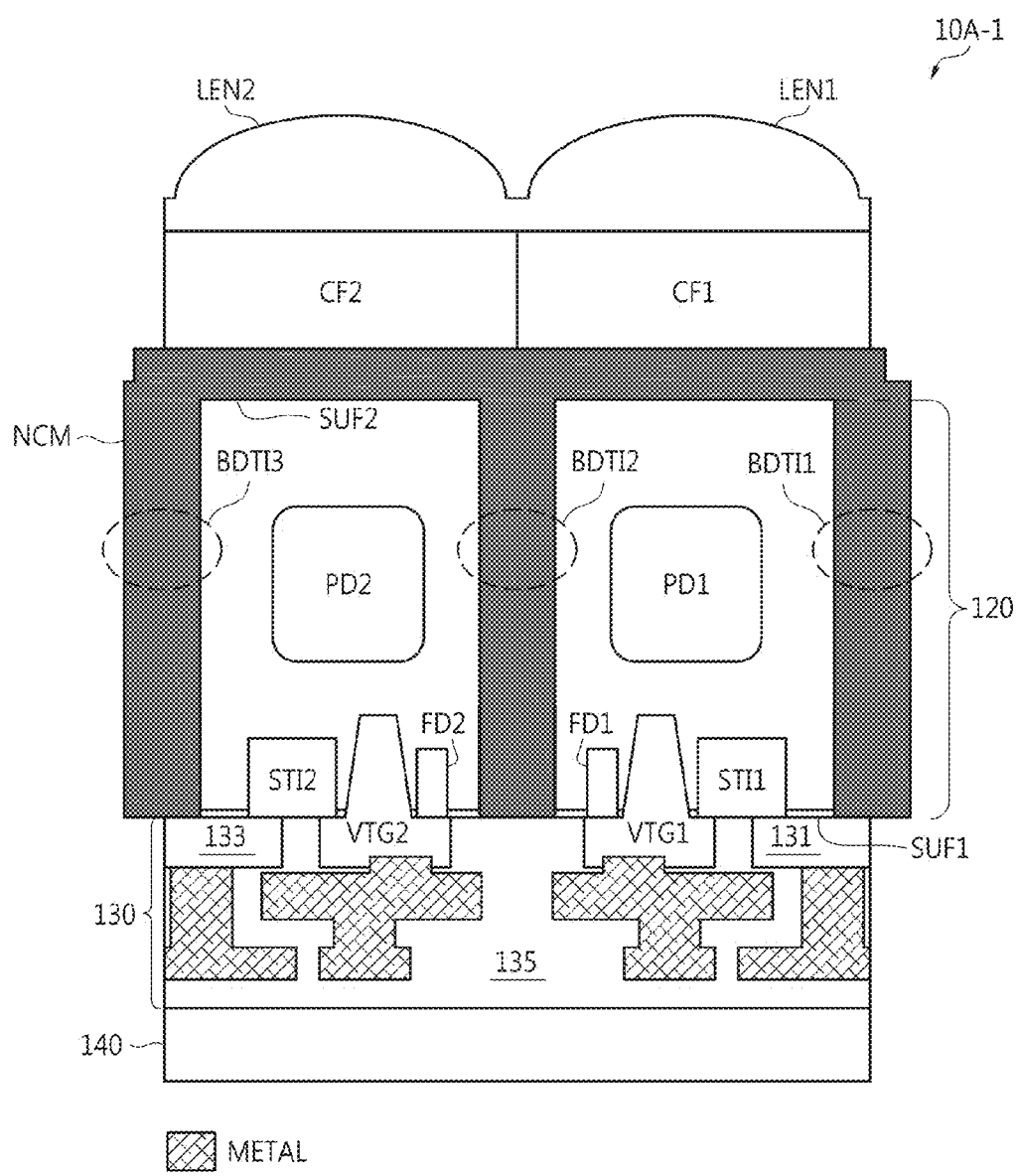
FIG. 10 is a block diagram of an image processing device including a pixel according to the inventive concept.

FIG. 10 is a block diagram of an image processing device 700 including a pixel according to the inventive concept. Referring to FIG. 10, the image processing device 700 may be a portable electronic device that can use or support mobile industry processor interface (MIPI®). The portable electronic device may include the CMOS image sensor 505 and a processing circuit for processing the image data IDATA output from the CMOS image sensor 505. The image processing device 700 includes an application processor (AP) 710, the image sensor 505, and the display 730.

A camera serial interface (CSI) host 713 in the AP 710 may perform serial communication with a CSI device 506 in the image sensor 505. The CSI host 713 and the CSI device 506 may include a deserializer DES and a serializer SER, respectively. The AP 710 may be provided in the form of an integrated circuit or a system on chip (SoC).

A display serial interface (DSI) host 711 in the AP 710 may perform serial communication with a DSI device 731 in the display 730. The DSI host 711 and the DSI device 731 may include a serializer SER and a deserializer DES, respectively. The deserializers DES and the serializers SER may process electrical signals or optical signals.

The image processing device 700 may also include a radio frequency (RF) chip 740 communicating with the AP 710. A physical layer (PHY) 715 in the AP 710 and a PHY 741 in the RF chip 740 may communicate with each other (transmit data to each other) according to MIPI DigRF. A central processing unit (CPU) 717 may control the operations of the DSI host 711, the CSI host 713, and the PHY 715.

The image processing device 700 may further include a global positioning system (GPS) receiver 750, a memory 751 such as dynamic random access memory (DRAM), a data storage 753 comprising a non-volatile memory such as a NAND flash-based memory, a microphone (MIC) 755, and/or a speaker 757. The image processing device 700 may communicate with external devices using at least one communication protocol or standard, e.g., worldwide interoperability for microwave access (Wimax) 759, wireless local area network (WLAN) 761, ultra-wideband (UWB) 763, or long term evolution (LTE) 765. The image processing device 700 may also communicate with external wireless communication devices using Bluetooth or Wi-Fi.

As described above, according to the inventive concept, a pixel includes BDTI (extending to at least the bottom of a photodetector of the pixel) and a vertical transfer gate, thereby reducing crosstalk that may occur between pixels. The pixel also includes a negative charge material in the BDTI, thereby reducing dark current.

While the inventive concept has been particularly shown and described with reference to exemplary embodiments thereof, it will be understood by those of ordinary skill in the art that various changes in forms and details may be made therein without departing from the spirit and scope of the inventive concept as defined by the following claims.

What is claimed is:

1. A pixel for a backside illuminated (BSI) image sensor, the pixel comprising:
   a photoelectric conversion region interposed between a first surface and a second surface of a semiconductor substrate to generate charges in response to light received through the second surface;
   first trench isolation surrounding the photoelectric conversion region and extending vertically from the second surface;
   a floating diffusion region in the semiconductor substrate and occupying a level in the device below that occupied by the photoelectric conversion region; and
   a transfer gate extending vertically from the first surface in a direction towards the photoelectric conversion region to transfer the charges from the photoelectric conversion region to the floating diffusion region;
   a metal wiring region comprising a dielectric layer disposed on the first surface of the semiconductor substrate and metal wiring running through the dielectric layer;
   a second gate disposed in the metal wiring region adjacent to the first surface of the semiconductor substrate as spaced from the transfer gate; and
   an isolation region of insulation material in the semiconductor substrate,
   wherein the first trench isolation comprises negative charge material,
   the isolation region has a bottom surface coplanar with the first surface of the semiconductor substrate, and the bottom surface of the isolation region faces and overlaps the transfer gate and the second gate along the first surface of the semiconductor substrate, and the metal wiring is electrically connected to each of the transfer gate and the second gate.

2. The pixel of claim 1, wherein the first trench isolation extends from the second surface to the first surface, and the first trench isolation surrounds the transfer gate, the isolation region, and the floating diffusion region.

3. The pixel of claim 1, further comprising a second trench isolation extending vertically from the first surface, wherein the first trench isolation contacts the second trench isolation, and the second trench isolation surrounds the isolation region.

4. The pixel of claim 3, wherein when the first trench isolation is a deep trench isolation (DTI) region, and the second trench isolation is a shallow trench isolation (STI) region.

5. The pixel of claim 1, further comprising second trench isolation extending vertically from the first surface toward the first trench isolation, wherein the first trench isolation is spaced from the second trench isolation, and the second trench isolation surrounds the isolation region.

6. The pixel of claim 1, wherein the transfer gate extends into the photoelectric conversion region.

7. The pixel of claim 1, wherein the negative charge material is hafnium oxide (HfO) or hafnium dioxide (HfO$_2$).

8. The pixel of claim 1, wherein the first trench isolation further comprises a dielectric material.

9. A backside illuminated (BSI) image sensor comprising:
a pixel array including a plurality of pixels operative to generate pixel signals in response to incident light; and
a signal processing circuit configured to output image data based on the pixel signals, and
wherein the pixel array comprises:
a semiconductor substrate having a first surface and a second surface,
photoelectric conversion regions each interposed between the first surface and the second surface to generate charges in response to light received through the second surface,
first trench isolation surrounding each of the photoelectric conversion regions and extending vertically from the second surface,
floating diffusion regions in the semiconductor substrate and occupying a level in the device below that occupied by the photoelectric conversion regions, and
transfer gates extending vertically from the first surface in a direction towards the photoelectric conversion regions, respectively, to transfer the charges from the photoelectric conversion regions to the floating diffusion regions;
a metal wiring region comprising a dielectric layer disposed on the first surface of the semiconductor substrate and metal wiring running through the dielectric layer;
other gates disposed in the metal wiring region adjacent to the first surface of the semiconductor substrate as spaced from each other and the transfer gates; and
isolation regions of insulation material in the semiconductor substrate, and
wherein the first trench isolation comprises a negative charge material,
each of the isolation regions has a bottom surface coplanar with the first surface of the semiconductor substrate, and the bottom surface of each of the isolation regions faces and overlaps respective ones of the transfer and other gates, of a respective one of the pixels, along the first surface of the semiconductor substrate, and the metal wiring is electrically connected to each of the transfer gates and each of the other gates.

10. The BSI image sensor of claim 9, wherein the first trench isolation of the pixel array extends from the second surface to the first surface of the semiconductor substrate, and the first trench isolation respectively surrounds groups of elements in the semiconductor substrate, each of the groups including one of the transfer gates, one of the isolation regions, and one of the floating diffusion regions.

11. The BSI image sensor of claim 9, wherein the pixel array further comprises second trench isolation extending vertically from the first surface of the semiconductor substrate, wherein the first trench isolation contacts the second trench isolation, and the second trench isolation respectively surrounds the isolation regions.

12. The BSI image sensor of claim 11, wherein the first trench isolation of the pixel array is a back deep trench isolation (DTI) region, and the second trench isolation is a front DTI region or a shallow trench isolation (STI) region.

13. The BSI image sensor of claim 11, wherein the depth to which the first trench isolation of the pixel array extends vertically into the semiconductor substrate from the second surface of the substrate is greater than the depth to which the second trench isolation extends vertically into the semiconductor substrate from the first surface of the substrate.

14. The BSI image sensor of claim 9, wherein the pixel array further comprises second trench isolation extending vertically from the first surface of the semiconductor substrate toward the first trench isolation, the first trench isolation is spaced from the second trench isolation, and the second trench isolation respectively surrounds the isolation regions.

15. A pixel array comprising:
a substrate of semiconductor material having opposite major first and second surfaces;
photodetectors each located within the substrate between the first and second surfaces of the substrate;
a first isolation region of negative charge material extending vertically in the substrate, from the second surface thereof, between adjacent ones of each respective pair of the photodetectors;
floating diffusion regions in the substrate and disposed below the level of the photodetectors in the substrate;
transfer gates extending vertically from the first surface in a direction towards the photoelectric conversion regions, respectively, to transfer the charges from the photoelectric conversion regions to the floating diffusion regions;
a metal wiring region comprising a dielectric layer disposed on the first surface of the semiconductor substrate and metal wiring running through the dielectric layer;
other gates disposed in the metal wiring region adjacent to the first surface of the semiconductor substrate as spaced from each other and the transfer gates; and
isolation regions of insulation material in the semiconductor substrate,
each of the isolation regions having a bottom surface coplanar with the first surface of the semiconductor substrate, and the bottom surface of each of the isolation regions facing and overlapping respective ones of the transfer and other gates, of a respective pixel of the array, along the first surface of the semiconductor substrate, and the metal wiring being electrically connected to each of the transfer gates and each of the other gates.

16. The pixel array of claim 15, wherein the negative charge material is an oxide of an element selected from the group consisting of hafnium (Hf), zirconium (Zr), aluminum (Al), tantalum (Ta), yttrium (Y), and lanthanoids.

17. The pixel array of claim 15, wherein the negative charge material extends from the second surface to the first surface, and respectively surrounds groups of elements in the semiconductor substrate, each of the groups including one of the transfer gates, one of the isolation regions, and one of the floating diffusion regions.

18. The pixel array of claim 15, further comprising second trench isolation, of material of a type different from the negative charge material, extending vertically from the first surface towards the second surface and having the same pattern as the first trench isolation, whereby the first trench isolation and the second trench isolation are vertically aligned, and wherein the second trench isolation respectively surrounds the isolation regions.

19. The pixel array of claim 18, wherein the negative charge material contacts the second trench isolation.

20. The pixel array of claim 18, wherein the negative charge material and the second trench isolation are vertically spaced apart from one another.

* * * * *